United States Patent
Takahashi et al.

(10) Patent No.: US 10,281,102 B2
(45) Date of Patent: May 7, 2019

(54) LIGHT EMITTING DEVICE, VEHICLE HEADLAMP, ILLUMINATION DEVICE, AND LASER ELEMENT

(71) Applicant: Sharp Kabushiki Kaisha, Sakai (JP)

(72) Inventors: Koji Takahashi, Sakai (JP); Yoshiyuki Takahira, Sakai (JP)

(73) Assignee: Sharp Kabushiki Kaisha, Sakai (JP)

( * ) Notice: Subject to any disclaimer, the term of this patent is extended or adjusted under 35 U.S.C. 154(b) by 0 days.

(21) Appl. No.: 15/709,831

(22) Filed: Sep. 20, 2017

(65) Prior Publication Data

US 2018/0023775 A1 Jan. 25, 2018

Related U.S. Application Data

(63) Continuation of application No. 13/238,995, filed on Sep. 21, 2011.

(30) Foreign Application Priority Data

Oct. 29, 2010 (JP) ................................ 2010-244573
Oct. 29, 2010 (JP) ................................ 2010-244576
Jun. 2, 2011 (JP) ................................ 2011-124513

(51) Int. Cl.
*F21V 9/16* (2006.01)
*F21S 41/176* (2018.01)
*F21S 43/16* (2018.01)
*F21K 9/64* (2016.01)
*B60Q 1/00* (2006.01)
(Continued)

(52) U.S. Cl.
CPC .......... *F21S 41/176* (2018.01); *B60Q 1/0035* (2013.01); *F21K 9/64* (2016.08); *F21S 41/14* (2018.01); *F21S 41/16* (2018.01); *F21S 43/16* (2018.01); *F21V 9/30* (2018.02); *F21Y 2115/10* (2016.08); *F21Y 2115/30* (2016.08);
(Continued)

(58) Field of Classification Search
CPC ...... F21S 48/1159; F21S 41/176; F21S 43/16; F21K 9/64
USPC ........................ 362/257, 259, 311.07–311.09
See application file for complete search history.

(56) References Cited

U.S. PATENT DOCUMENTS 3,701,895 A 10/1972 Sweetser
4,688,884 A 8/1987 Scifres et al.
(Continued)

FOREIGN PATENT DOCUMENTS

CN 2534063 2/2003
CN 1499125 5/2004
(Continued)

OTHER PUBLICATIONS

Public Notice Specifying Details of Safety Standards for Road Vehicle, Appendix 51 (Specified Standards for Style of Headlamp), Sep. 26, 2003; pp. 1-17 with Partial English translation of relevant portions (5 pages).
(Continued)

*Primary Examiner* — Sean P Gramling
(74) *Attorney, Agent, or Firm* — Morrison & Foerster LLP

(57) ABSTRACT

A light emitting device of the present invention includes a light-emitting section for generating fluorescence by receiving a laser beam, and a light irradiation unit for irradiating a light irradiated surface of the light emitting section with a laser beam that increases regularly in beam diameter in a direction in which the laser beam travels.

10 Claims, 28 Drawing Sheets

(51) Int. Cl.
*F21S 41/14* (2018.01)
*F21S 41/16* (2018.01)
*F21V 9/30* (2018.01)
*F21Y 115/30* (2016.01)
*F21Y 115/10* (2016.01)

(52) U.S. Cl.
CPC ............... *H01L 2224/45144* (2013.01); *H01L 2224/48091* (2013.01)

(56) References Cited

U.S. PATENT DOCUMENTS

| | | |
|---|---|---|
| 4,723,198 A | 2/1988 | Levin et al. |
| 5,278,731 A | 1/1994 | Davenport et al. |
| 5,535,230 A | 7/1996 | Abe |
| 5,647,662 A | 7/1997 | Ziegler et al. |
| 5,857,768 A | 1/1999 | Ziegler et al. |
| 5,947,592 A | 9/1999 | Barlow |
| 6,055,154 A | 4/2000 | Azar |
| 6,114,715 A | 9/2000 | Hamada |
| 6,272,269 B1 | 8/2001 | Naum |
| 6,398,366 B1 | 6/2002 | Hara et al. |
| 6,439,751 B1 | 8/2002 | Jones et al. |
| 6,509,674 B1 | 1/2003 | Nakagawa |
| 6,771,236 B1 | 8/2004 | Konishi et al. |
| 6,981,782 B2 | 1/2006 | Kai et al. |
| 7,108,400 B2 | 9/2006 | Yamada et al. |
| 7,147,918 B2 | 12/2006 | Nishibayashi et al. |
| 7,275,848 B2 | 10/2007 | Chinniah et al. |
| 7,309,145 B2 | 12/2007 | Nagata et al. |
| 7,367,679 B2 | 5/2008 | Emery |
| 7,422,356 B2 | 9/2008 | Hama et al. |
| 7,478,932 B2 | 1/2009 | Chinniah et al. |
| 7,510,284 B2 | 3/2009 | Plut |
| 7,628,492 B2 | 12/2009 | Yoshii et al. |
| 2002/0044455 A1 | 4/2002 | Ozawa et al. |
| 2002/0053868 A1 | 5/2002 | Shimizu et al. |
| 2002/0187571 A1 | 12/2002 | Collins et al. |
| 2003/0052595 A1 | 3/2003 | Ellens et al. |
| 2003/0174509 A1 | 9/2003 | Futami |
| 2003/0186475 A1 | 10/2003 | Ueda et al. |
| 2004/0042212 A1 | 3/2004 | Du et al. |
| 2004/0062699 A1 | 4/2004 | Oshio |
| 2004/0085768 A1 | 5/2004 | Kai et al. |
| 2004/0090790 A1 | 5/2004 | Ishida et al. |
| 2004/0145895 A1* | 7/2004 | Ouderkirk ............... H01L 33/46 362/260 |
| 2004/0207306 A1 | 10/2004 | Horiuchi et al. |
| 2004/0228130 A1 | 11/2004 | Kato et al. |
| 2005/0051790 A1 | 3/2005 | Ueda |
| 2005/0063169 A1 | 3/2005 | Erber |
| 2005/0094397 A1 | 5/2005 | Yamada et al. |
| 2005/0105301 A1 | 5/2005 | Takeda et al. |
| 2005/0116176 A1 | 6/2005 | Aguirre et al. |
| 2005/0116177 A1 | 6/2005 | Aguirre et al. |
| 2005/0116178 A1 | 6/2005 | Aguirre et al. |
| 2005/0116179 A1 | 6/2005 | Aguirre et al. |
| 2005/0127383 A1 | 6/2005 | Kikawa et al. |
| 2005/0243570 A1 | 11/2005 | Chaves et al. |
| 2005/0253153 A1 | 11/2005 | Harada |
| 2006/0050512 A1 | 3/2006 | Nakagawa et al. |
| 2006/0054656 A1 | 3/2006 | Narita et al. |
| 2006/0118775 A1 | 6/2006 | Nagai et al. |
| 2006/0121695 A1 | 6/2006 | Ueda et al. |
| 2006/0170332 A1 | 8/2006 | Tamaki et al. |
| 2006/0181894 A1 | 8/2006 | Chinniah et al. |
| 2006/0186377 A1 | 8/2006 | Takahashi et al. |
| 2006/0203349 A1 | 9/2006 | Kamijima |
| 2006/0232973 A1 | 10/2006 | Haga et al. |
| 2006/0238103 A1 | 10/2006 | Choi et al. |
| 2006/0239006 A1 | 10/2006 | Chaves et al. |
| 2006/0255711 A1 | 11/2006 | Dejima et al. |
| 2006/0279950 A1 | 12/2006 | Hama et al. |
| 2006/0285341 A1 | 12/2006 | Yatsuda et al. |
| 2007/0007494 A1 | 1/2007 | Hirosaki et al. |
| 2007/0008734 A1 | 1/2007 | Bogner et al. |
| 2007/0041197 A1 | 2/2007 | Saito et al. |
| 2007/0057269 A1 | 3/2007 | Ueda |
| 2007/0127240 A1 | 6/2007 | Inamoto |
| 2007/0131954 A1 | 6/2007 | Murayama et al. |
| 2007/0185261 A1 | 8/2007 | Lee et al. |
| 2007/0189352 A1 | 8/2007 | Nagahama et al. |
| 2008/0013316 A1 | 1/2008 | Chiang |
| 2008/0037268 A1 | 2/2008 | Tendo et al. |
| 2008/0051632 A1 | 2/2008 | Ito et al. |
| 2008/0074752 A1 | 3/2008 | Chaves et al. |
| 2008/0089089 A1 | 4/2008 | Hama et al. |
| 2008/0117620 A1 | 5/2008 | Hama et al. |
| 2008/0169752 A1 | 7/2008 | Hattori et al. |
| 2008/0170296 A1 | 7/2008 | Chaves et al. |
| 2008/0173884 A1 | 7/2008 | Chitnis et al. |
| 2008/0175008 A1 | 7/2008 | Hu et al. |
| 2008/0179611 A1 | 7/2008 | Chitnis et al. |
| 2008/0198603 A1 | 8/2008 | Sormani et al. |
| 2008/0205062 A1 | 8/2008 | Dahmn et al. |
| 2008/0225550 A1 | 9/2008 | Sakurada |
| 2008/0237569 A1 | 10/2008 | Nago et al. |
| 2008/0239725 A1 | 10/2008 | Ishikura et al. |
| 2008/0262316 A1 | 10/2008 | Ajima et al. |
| 2008/0278460 A1 | 11/2008 | Arnett et al. |
| 2009/0008655 A1 | 1/2009 | Peeters et al. |
| 2009/0052189 A1 | 2/2009 | Kon |
| 2009/0057690 A1 | 3/2009 | Chakraborty |
| 2009/0059594 A1 | 3/2009 | Lin |
| 2009/0065790 A1 | 3/2009 | Chitnis et al. |
| 2009/0067179 A1 | 3/2009 | Chaves et al. |
| 2009/0073710 A1 | 3/2009 | Sormani et al. |
| 2009/0091237 A1 | 4/2009 | Hirosaki et al. |
| 2009/0095960 A1 | 4/2009 | Murayama |
| 2009/0128781 A1 | 5/2009 | Li |
| 2009/0201577 A1 | 8/2009 | LaPlante et al. |
| 2009/0218592 A1 | 9/2009 | Hawker et al. |
| 2009/0231874 A1 | 9/2009 | Kishimoto et al. |
| 2009/0257463 A1 | 10/2009 | Kusukame et al. |
| 2009/0273921 A1 | 11/2009 | Chiang |
| 2009/0273924 A1 | 11/2009 | Chiang |
| 2009/0296018 A1 | 12/2009 | Harle et al. |
| 2009/0296367 A1 | 12/2009 | Sekine et al. |
| 2009/0322208 A1 | 12/2009 | Shaikevitch et al. |
| 2010/0046234 A1 | 2/2010 | Abu-Ageel |
| 2010/0046245 A1 | 2/2010 | Ansari et al. |
| 2010/0073600 A1 | 3/2010 | Itoh et al. |
| 2010/0091516 A1 | 4/2010 | Haerle et al. |
| 2010/0096967 A1 | 4/2010 | Marinus et al. |
| 2010/0102250 A1 | 4/2010 | Li et al. |
| 2010/0103966 A1 | 4/2010 | Mizushima et al. |
| 2010/0164365 A1 | 7/2010 | Yoshino et al. |
| 2010/0171440 A1 | 7/2010 | Satou et al. |
| 2010/0177497 A1* | 7/2010 | Leung ................... F21V 7/0008 362/84 |
| 2010/0202129 A1 | 8/2010 | Abu-Ageel |
| 2010/0202152 A1 | 8/2010 | Nakada |
| 2010/0254153 A1 | 10/2010 | Hama et al. |
| 2011/0044070 A1 | 2/2011 | Takahashi |
| 2011/0063874 A1 | 3/2011 | Yatsuda et al. |
| 2011/0068360 A1 | 3/2011 | Nago et al. |
| 2011/0068679 A1 | 3/2011 | Sawamura et al. |
| 2011/0148280 A1 | 6/2011 | Kishimoto et al. |
| 2011/0176305 A1 | 7/2011 | Schallmoser |
| 2011/0182072 A1 | 7/2011 | Shimizu et al. |
| 2011/0194302 A1 | 8/2011 | Kishimoto et al. |
| 2011/0248624 A1 | 10/2011 | Kishimoto et al. |
| 2011/0279007 A1 | 11/2011 | Kishimoto |
| 2011/0279039 A1 | 11/2011 | Kishimoto |
| 2011/0280032 A1 | 11/2011 | Kishimoto |
| 2011/0280033 A1 | 11/2011 | Kishimoto et al. |
| 2011/0280039 A1 | 11/2011 | Kishimoto |
| 2012/0026503 A1 | 2/2012 | Lewandowski et al. |
| 2012/0026721 A1 | 2/2012 | Kurt et al. |
| 2012/0106178 A1 | 5/2012 | Takahashi et al. |

(56) References Cited

U.S. PATENT DOCUMENTS

| | | | |
|---|---|---|---|
| 2013/0155624 | A1 | 6/2013 | Morgenbrod et al. |
| 2013/0155648 | A1 | 6/2013 | Morgenbrod et al. |

FOREIGN PATENT DOCUMENTS

| | | |
|---|---|---|
| CN | 1701446 | 11/2005 |
| CN | 1824728 | 8/2006 |
| CN | 101226978 | 7/2008 |
| CN | 101627481 | 1/2010 |
| EP | 2 280 214 | 2/2011 |
| JP | 60-186076 | 9/1985 |
| JP | 62-254355 | 11/1987 |
| JP | 4-43529 | 2/1992 |
| JP | 4-73801 | 3/1992 |
| JP | 6-203606 | 7/1994 |
| JP | 7-282609 | 10/1995 |
| JP | 7-318998 | 12/1995 |
| JP | 7-335016 | 12/1995 |
| JP | 8-185703 | 7/1996 |
| JP | 8-264885 | 10/1996 |
| JP | 9-10238 | 1/1997 |
| JP | 10-326520 | 12/1998 |
| JP | 11-195303 | 7/1999 |
| JP | 2000-81516 | 3/2000 |
| JP | 2000-231905 | 8/2000 |
| JP | 2001-15839 | 1/2001 |
| JP | 2001-127002 | 5/2001 |
| JP | 2001-264832 | 9/2001 |
| JP | 2002-100214 | 4/2002 |
| JP | 2002-323726 | 11/2002 |
| JP | 2003-69086 | 3/2003 |
| JP | 2003-509821 | 3/2003 |
| JP | 2003-295319 | 10/2003 |
| JP | 2003-332237 | 11/2003 |
| JP | 2004-87435 | 3/2004 |
| JP | 2004-87925 | 3/2004 |
| JP | 2004-115304 | 4/2004 |
| JP | 2004-200531 | 7/2004 |
| JP | 2004-241142 | 8/2004 |
| JP | 2004-301977 | 10/2004 |
| JP | 2004-327361 | 11/2004 |
| JP | 2005-19981 | 1/2005 |
| JP | 2005-55199 | 3/2005 |
| JP | 2005-56852 | 3/2005 |
| JP | 2005-56952 | 3/2005 |
| JP | 2005-109402 | 4/2005 |
| JP | 2005-150041 | 6/2005 |
| JP | 2005-157251 | 6/2005 |
| JP | 2005-175111 | 6/2005 |
| JP | 2005-294185 | 10/2005 |
| JP | 2005-311170 | 11/2005 |
| JP | 2005-347223 | 12/2005 |
| JP | 2006-40843 | 2/2006 |
| JP | 2006-61685 | 3/2006 |
| JP | 2006-100287 | 4/2006 |
| JP | 2006-154408 | 6/2006 |
| JP | 2006-164796 | 6/2006 |
| JP | 2006-521667 | 9/2006 |
| JP | 2006-296498 | 11/2006 |
| JP | 2006-351369 | 12/2006 |
| JP | 2007-65600 | 3/2007 |
| JP | 2007-66911 | 3/2007 |
| JP | 2007-88078 | 4/2007 |
| JP | 2007-95931 | 4/2007 |
| JP | 2007-142452 | 6/2007 |
| JP | 2007-157548 | 6/2007 |
| JP | 2007-515270 | 6/2007 |
| JP | 2007-173177 | 7/2007 |
| JP | 2007-173595 | 7/2007 |
| JP | 2007-196224 | 8/2007 |
| JP | 2007-258019 | 10/2007 |
| JP | 2007-294754 | 11/2007 |
| JP | 2007-323858 | 12/2007 |
| JP | 2008-10518 | 1/2008 |
| JP | 2008-27910 | 2/2008 |
| JP | 2008-66297 | 3/2008 |
| JP | 2008-124504 | 5/2008 |
| JP | 2008-129683 | 6/2008 |
| JP | 2008-135261 | 6/2008 |
| JP | 2008-135411 | 6/2008 |
| JP | 2008-145838 | 6/2008 |
| JP | 2008-150518 | 7/2008 |
| JP | 2008-234908 | 10/2008 |
| JP | 2008-243714 | 10/2008 |
| JP | 2008-243904 | 10/2008 |
| JP | 2008-262910 | 10/2008 |
| JP | 2008-270229 | 11/2008 |
| JP | 2008/277447 | 11/2008 |
| JP | 2009-19573 | 1/2009 |
| JP | 2009-21506 | 1/2009 |
| JP | 2009-70766 | 4/2009 |
| JP | 2009-104913 | 5/2009 |
| JP | 2009-104933 | 5/2009 |
| JP | 2009-108327 | 5/2009 |
| JP | 2009-129590 | 6/2009 |
| JP | 2009-129683 | 6/2009 |
| JP | 2009-134034 | 6/2009 |
| JP | 2009-140874 | 6/2009 |
| JP | 2009-523308 | 6/2009 |
| JP | 2009-176443 | 8/2009 |
| JP | 2009-180935 | 8/2009 |
| JP | 2009-224053 | 10/2009 |
| JP | 2009-266437 | 11/2009 |
| JP | 2009-541950 | 11/2009 |
| JP | 2009-289537 | 12/2009 |
| JP | 2009-289976 | 12/2009 |
| JP | 2010-15902 | 1/2010 |
| JP | 2010-62108 | 3/2010 |
| JP | 2010-80306 | 4/2010 |
| JP | 2010-102913 | 5/2010 |
| JP | 2010-182574 | 8/2010 |
| JP | 2010-186886 | 8/2010 |
| JP | 2011-65979 | 3/2011 |
| JP | 2011-108961 | 6/2011 |
| KR | 10-665221 | 12/2006 |
| WO | WO-2004/081140 | 9/2004 |
| WO | WO-2006/038502 | 4/2006 |
| WO | WO-2006/098267 | 9/2006 |
| WO | WO-2008/117211 | 10/2008 |
| WO | WO-2009/031289 | 3/2009 |
| WO | WO-2009/034511 | 3/2009 |
| WO | WO-2009/145141 | 12/2009 |
| WO | WO-2010/003763 | 1/2010 |
| WO | WO-2010/047882 | 4/2010 |
| WO | WO-2010/116305 | 10/2010 |

OTHER PUBLICATIONS

Sasaki, M. (2005). "Applications of White LED Lighting to Automobile Onboard Devices". *Oyo Buturi.* 74(11):1463-1466 (with English translation).

Xie, R. et al. (2007). "Silicon-based Oxynitride and Nitride Phosphors for White LEDs—A Review," *Science and Technology of Advanced Materials* 8: 588-600.

Kishimoto et al., Office Action dated Apr. 17, 2012, directed to U.S. Appl. No. 12/957,998; 7 pages.

Kishimoto et al., U.S. Office Action dated Sep. 21, 2012, directed to U.S. Appl. No. 12/957,998; 8 pages.

Kishimoto et al., U.S. Advisory Action dated Nov. 30, 2012, directed to U.S. Appl. No. 12/957,998; 3 pages.

Kishimoto et al., U.S. Office Action dated Sep. 6, 2013, directed to U.S. Appl. No. 13/945,673; 9 pages.

Kishimoto et al., U.S. Office Action dated Feb. 10, 2014, directed to U.S. Appl. No. 13/945,673; 7 pages.

Kishimoto et al., U.S. Advisory Action dated May 29, 2014, directed to U.S. Appl. No. 13/945,673; 3 pages.

Kishimoto et al., U.S. Office Action dated Sep. 25, 2012, directed to U.S. Appl. No. 13/023,300; 9 pages.

Kishimoto et al., U.S. Office Action dated Jan. 17, 2013, directed to U.S. Appl. No. 13/023,300; 8 pages.

Kishimoto et al., U.S. Office Action dated May 17, 2013, directed to U.S. Appl. No. 13/023,300; 10 pages.

(56) References Cited

OTHER PUBLICATIONS

Kishimoto et al., U.S. Notice of Allowance dated Nov. 19, 2013, directed to U.S. Appl. No. 13/023,300; 8 pages.
Kishimoto et al., U.S. Office Action dated Jun. 18, 2012, directed to U.S. Appl. No. 13/081,295; 9 pages.
Kishimoto et al., U.S. Office Action dated Dec. 4, 2012, directed to U.S. Appl. No. 13/081,295; 11 pages.
Kishimoto et al., U.S. Advisory Action dated Feb. 25, 2013, directed to U.S. Appl. No. 13/081,295; 4 pages.
Kishimoto et al., U.S. Office Action dated Jun. 19, 2014, directed to U.S. Appl. No. 13/081,295; 8 pages.
Kishimoto et al., U.S. Office Action dated Sep. 25, 2014, directed to U.S. Appl. No. 13/081,295; 7 pages.
Kishimoto, U.S. Office Action dated Jul. 22, 2013, directed to U.S. Appl. No. 13/104,517; 11 pages.
Kishimoto et al., U.S. Office Action dated Mar. 19, 2013, directed to U.S. Appl. No. 13/107,449; 10 pages.
Kishimoto et al., U.S. Office Action dated Aug. 14, 2013, directed to U.S. Appl. No. 13/107,449; 12 pages.
Kishimoto et al., U.S. Advisory Action dated Nov. 5, 2013, directed to U.S. Appl. No. 13/107,449; 4 pages.
Kishimoto, U.S. Office Action dated Feb. 20, 2013, directed to U.S. Appl. No. 13/107,440; 11 pages.
Kishimoto, U.S. Office Action dated Jul. 3, 2013, directed to U.S. Appl. No. 13/107,440; 13 pages.
Kishimoto, U.S. Office Action dated Jan. 3, 2014, directed to U.S. Appl. No. 13/107,440; 11 pages.
Kishimoto, U.S. Office Action dated Jul. 14, 2014, directed to U.S. Appl. No. 13/107,440; 15 pages.
Kishimoto, U.S. Advisory Action dated Oct. 6, 2014, directed to U.S. Appl. No. 13/107,440; 3 pages.
Kishimoto, U.S. Office Action dated May 9, 2013, directed to U.S. Appl. No. 13/108,770; 14 pages.
Kishimoto, U.S. Notice of Allowance dated Jan. 17, 2014, directed to U.S. Appl.No. 13/108,770; 7 pages.
Kishimoto, U.S. Office Action dated Dec. 21, 2012, directed to U.S. Appl. No. 13/108,764; 13 Pages.
Kishimoto, U.S. Office Action dated Jun. 7, 2013, directed to U.S. Appl. No. 13/108,764; 13 Pages.
Kishimoto, U.S. Office Action dated Aug. 30, 2013, directed to U.S. Appl. No. 13/108,764; 16 pages.
Kishimoto, U.S. Office Action dated Feb. 20, 2014, directed to U.S. Appl. No. 14/091,980; 6 pages.
Kishimoto, U.S. Office Action dated Jun. 6, 2014, directed to U.S. Appl. No. 14/091,980; 8 pages.
Kishimoto, U.S. Office Action dated Sep. 30, 2014, directed to U.S. Appl. No. 14/091,980; 7 pages.
Kishimoto, U.S. Office Action dated Dec. 29, 2014, directed to U.S. Appl. No. 14/091,980; 5 pages.
Kishimoto, U.S. Office Action dated Jun. 2, 2015, directed to U.S. Appl. No. 14/091,980; 9 pages.
Kishimoto, U.S. Advisory Action dated Aug. 7, 2015, directed to U.S. Appl. No. 14/091,980; 6 pages.
Kishimoto, U.S. Office Action dated Sep. 11, 2015, directed to U.S. Appl. No. 14/091,980; 6 pages.
Kishimoto, U.S. Office Action dated Jan. 25, 2016, directed to U.S. Appl. No. 14/091,980; 6 pages.
Takahashi et al., U.S. Restriction Requirement dated Mar. 20, 2014, directed to U.S. Appl. No. 13/238,995; 6 pages.
Takahashi et al., U.S. Office Action dated May 22, 2014, directed to U.S. Appl. No. 13/238,995; 8 pages.
Takahashi et al., U.S. Office Action dated Jan. 29, 2015, directed to U.S. Appl. No. 13/238,995; 8 pages.
Takahashi et al., U.S. Advisory Action dated Apr. 9, 2015, directed to U.S. Appl. No. 13/238,995; 3 pages.
Takahashi et al., U.S. Office Action dated May 1, 2015, directed to U.S. Appl. No. 13/238,995; 8 pages.
Takahashi et al., U.S. Office Action dated Oct. 29, 2015, directed to U.S. Appl. No. 13/238,995; 9 pages.
Takahashi et al., U.S. Office Action dated Feb. 11, 2016, directed to U.S. Appl. No. 13/238,995; 15 pages.
Takahashi et al., U.S. Office Action dated Jul. 20, 2016, directed to U.S. Appl. No. 13/238,995; 9 pages.
Takahashi et al., U.S. Office Action dated Oct. 28, 2016, directed to U.S. Appl. No. 13/238,995; 11 pages.
Takahashi et al., U.S. Advisory Action dated Sep. 8, 2016, directed to U.S. Appl. No. 13/238,995; 3 pages.
Takahashi et al., U.S. Office Action dated May 16, 2017, directed to U.S. Appl. No. 13/238,995; 10 pages.
Takahashi et al., U.S. Notice of Allowance dated Aug. 7, 2017, directed to U.S. Appl. No. 13/238,995; 14 pages.
Takahashi et al., U.S. Advisory Action dated Jan. 21, 2016, directed to U.S. Appl. No. 13/238,995; 3 pages.

* cited by examiner

LIGHT EMITTING DEVICE, VEHICLE HEADLAMP, ILLUMINATION DEVICE, AND LASER ELEMENT

This application is a continuation of U.S. patent application Ser. No. 13/238,995 filed Sep. 21, 2011 which is based on and claims priority of Patent Application No. 2010-244573 filed in Japan on Oct. 29, 2010, No. 2010-244576 filed in Japan on Oct. 29, 2010, and Patent Application No. 2011-124513 filed in Japan on Jun. 2, 2011, the entire contents of which are hereby incorporated by reference.

FIELD OF THE INVENTION

The present invention relates to (i) a light emitting device which (a) generates fluorescence by irradiating a fluorescent material (light emitting section) with excitation light (e.g., a laser beam or luminescence) and (b) emits the fluorescence as illumination light, (ii) a vehicle headlamp (headlight) including the light emitting device, (iii) an illumination device including the light emitting device, and (iv) a laser element which is suitably used as a component of the light emitting device.

BACKGROUND OF THE INVENTION

In recent years, a lot of research has been done for a light emitting device which (i) generates fluorescence by irradiating a fluorescent material with excitation light by use of an excitation light source and (ii) emits the fluorescence as illumination light. A semiconductor light emitting element, such as a light emitting diode (LED) or a semiconductor laser (LD: Laser Diode), can be used as the excitation light source.

Examples of such a light emitting device encompass a vehicle headlamp disclosed in Patent Literature 1. According to the vehicle headlamp, a semiconductor light emitting element and a fluorescent material are arranged away from each other. A condenser lens is provided between the semiconductor light emitting element and the fluorescent material so as to converge, on the fluorescent material, light received from the semiconductor light emitting element.

Further, a lamp disclosed in Patent Literature 2 has an arrangement in which (i) a fluorescent material is shielded with a reflection mirror having a light transmission section, and (ii) excitation light is emitted from a semiconductor light emitting element provided outside the reflection mirror so as to be incident on the fluorescent material via the light transmission section. According to the arrangement, a lens for converging the excitation light on the fluorescent material is provided (i) between the semiconductor light emitting element and the fluorescent material and (ii) outside the reflection mirror.

That is, according to either the lamp disclosed in Patent Literature 1 or the lamp disclosed in Patent Literature 2, a lens is used to converge, on a single small fluorescent material, the excitation light generated by one or more excitation light sources.

CITATION LIST

Patent Literature 1

Japanese Patent Application Publication, Tokukai, No. 2004-241142 A (Publication Date: Aug. 26, 2004)

Patent Literature 2

Japanese Patent Application Publication, Tokukai, No. 2005-150041 A (Jun. 9, 2005)

SUMMARY OF THE INVENTION

However, either the lamp disclosed in Patent Literature 1 or the lamp disclosed in Patent Literature 2 has first and second problems described below. The following description deals with the first problem. In a case where a semiconductor laser is used as an excitation light source, a lens is used to converge a laser beam on a light emitting section. For this reason, in a case where a focal point F of a condenser lens L is on a light emitting section (see FIG. 9 (*a*)), for example, light intensity at the focal point F would become excessively high.

In order to solve the first problem, a position of the light emitting section can be shifted by a distance g with respect to the focal point F so that the light intensity of the laser beam becomes low on the light emitting section (see FIG. 9(*b*)). In this case, however, the light intensity of the laser beam on the light emitting section is likely to be changed significantly when a relative optical arrangement of the semiconductor laser and the light emitting section is changed due to vibration, aging deterioration, or the like. Further, for example, in a case where the optical arrangement is changed and, as a result, the focal point F becomes closer to the light emitting section, the light intensity of the laser beam on the light emitting section would become excessively high after all.

Meanwhile, if the light intensity of the laser beam on the light emitting section becomes excessively high, particles of the fluorescent material included in the light emitting section, or a sealing material sealing the particles would be permanently-damaged (deteriorated) due to heat or light.

Further, even if there is no unrecoverable damage due to the heat of the light, a temperature of the light emitting section is increased due to heat generated by the particles of the fluorescent material. The increase in the temperature causes a reduction in light emitting efficiency (temperature quenching). As a result, the light emitting section is reduced in light emitting efficiency.

Next, the following description deals with the second problem. According to the technique disclosed in Patent Literature 1 or 2, the excitation light source, the condenser lens, and the light emitting section are linearly arranged. With such an arrangement, it is difficult to adjust an optical path. This reduces design flexibility of the light emitting device. Such a reduction in design flexibility makes it difficult to provide a compact light emitting device or a light emitting device having a specific shape, for example.

The present invention is, first, made in view of the first problem described above. A first object of the present invention is to provide a light emitting device or the like which can prevent a reduction in light emitting efficiency due to deterioration of a light emitting section and an increase in the temperature of the light emitting section.

Secondly, the present invention is made in view of the second problem. A second object of the present invention is to provide a light emitting device or the like which can have an increase in design flexibility. Further, a third object of the present invention is to simplify an arrangement of a light emitting device including a laser element.

Solution to Problem

In order to attain the objects, a light emitting device of the present invention includes: a light emitting section for generating fluorescence by receiving a laser beam; and a light irradiation section for irradiating a light irradiated surface of the light emitting section with the laser beam which increases regularly in beam diameter in a direction in which the laser beam travels.

According to the arrangement, the light irradiated surface of the light emitting section is irradiated with the laser beam which increases regularly in beam diameter in the direction in which the laser beam travels. Accordingly, light density of the laser beam would not become excessively high on any regions of the light irradiated surface of the light emitting section. It is thus possible to prevent a reduction in light emitting efficiency due to deterioration of the light emitting section, and/or an increase in a temperature of the light emitting section.

Note that the "light irradiated surface" may be a single surface out of a plurality of surfaces constituting the light emitting section, or a plurality of surfaces out of the plurality of surfaces constituting the light emitting section. The "beam diameter" is a maximum diameter which defines an area of light having light intensity in a range of 1/e2 of maximum light intensity of the laser beam to the maximum light intensity of the laser beam. The description that "the laser beam which increases regularly in beam diameter in the direction in which the laser beam travels" does not mean that a value of an increasing rate of the beam diameter with respect to a traveling distance of the laser beam must be a constant value at any points on the optical path, but that the value of such an increasing rate is a positive value or zero (0) at an arbitral point on the optical path (except for a case where the increasing rate is zero (0) at any points on the optical path).

In order to attain the objects, a light emitting device of the present invention includes: at least one excitation light source for emitting excitation light; at least one concave mirror for converging the excitation light emitted from the at least one excitation light source; and a light-emitting section for emitting fluorescence by receiving the excitation light converged by the at least one concave mirror.

According to the arrangement, the light emitting section emits the fluorescence by receiving the excitation light from the excitation light source, so that the fluorescence is emitted as illumination light. With the arrangement, it is possible to change an optical path of the excitation light by (i) providing the concave mirror on the optical path of the excitation light, which optical path extends from the excitation light source to the light emitting section and (ii) converging the excitation light by use of the concave mirror.

For this reason, it becomes possible to increase flexibility in designing the light emitting device, as compared with the arrangement in which only a condenser lens is used to converge the excitation light. Consequently, it becomes possible to provide a compact light emitting device, for example.

In order to attain the objects, a laser element of the present invention includes: a laser chip for emitting a laser beam; and a concave mirror for controlling a radiation angle of the laser beam emitted from the laser chip.

According to the arrangement, both the laser chip for emitting the laser beam and the concave mirror are provided inside the laser element. The concave mirror controls the radiation angle of the laser beam emitted from the laser chip. It is thus possible to cause the laser beam emitted from the laser element to have a desired radiation angle (light distribution or directivity).

As a result, it becomes unnecessary to provide an additional optical member for controlling the radiation angle of the laser beam. Thus, the arrangement of the light emitting device including the laser element can be simplified.

As described above, a light emitting device of the present invention includes: a light emitting section for generating fluorescence by receiving a laser beam; and a light irradiation section for irradiating a light irradiated surface of the light emitting section with the laser beam which increases regularly in beam diameter in a direction in which the laser beam travels.

Accordingly, it is possible to prevent a reduction in light emitting efficiency due to deterioration of the light emitting section and/or an increase in the temperature of the light emitting section.

As described above, a light emitting device of the present invention includes: at least one excitation light source for emitting excitation light; at least one concave mirror for converging the excitation light emitted from the at least one excitation light source; and a light-emitting section for emitting fluorescence by receiving the excitation light converged by the at least one concave mirror.

Accordingly, it is possible to increase flexibility in designing the light emitting device.

Further, a laser element of the present invention includes: a laser chip for emitting a laser beam; and a concave mirror for controlling a radiation angle of the laser beam emitted from the laser chip.

Accordingly, it is possible to simplify an arrangement of the light emitting device including the laser element.

Additional objects, features, and strengths of the present invention will be made clear by the description below. Further, the advantages of the present invention will be evident from the following explanation in reference to the drawings.

BRIEF DESCRIPTION OF THE DRAWINGS

FIG. 2 is an explanatory view schematically illustrating a function of a light irradiation section of the headlamp: (a) of FIG. 2 illustrates a normal operation state (normal state), and (b) of FIG. 2 illustrates a state (abnormal state) where a relative positional relationship between a light emitting section and the light irradiation section is changed due to vibration or the like.

FIG. 9 is an explanatory view schematically illustrating a problem caused by irradiation a laser beam which is converged on a light emitting section by use of a lens: (a) of FIG. 9 illustrates a normal operation state (normal state), and (b) of FIG. 9 illustrates a state (abnormal state) where a relative positional relationship between the light emitting section and a light irradiation section is changed due to vibration or the like.

DETAILED DESCRIPTION OF THE INVENTION

One embodiment of the present invention is described below with reference to FIGS. 1 through 33. Arrangements other than the arrangements described under the following specific items are omitted in some cases for the sake of simple explanation, as appropriate. In a case where such an omitted arrangement is described under one of the specific items, the omitted arrangement is the same as the arrangement described under the one of the specific item. Further, for the sake of simple explanation, members having the same functions as those of members described under any one of the following specific items have the same signs as those thus described, and explanations of such members are omitted as appropriate.

[1. Arrangement of Headlamp 10]

Figure 1:
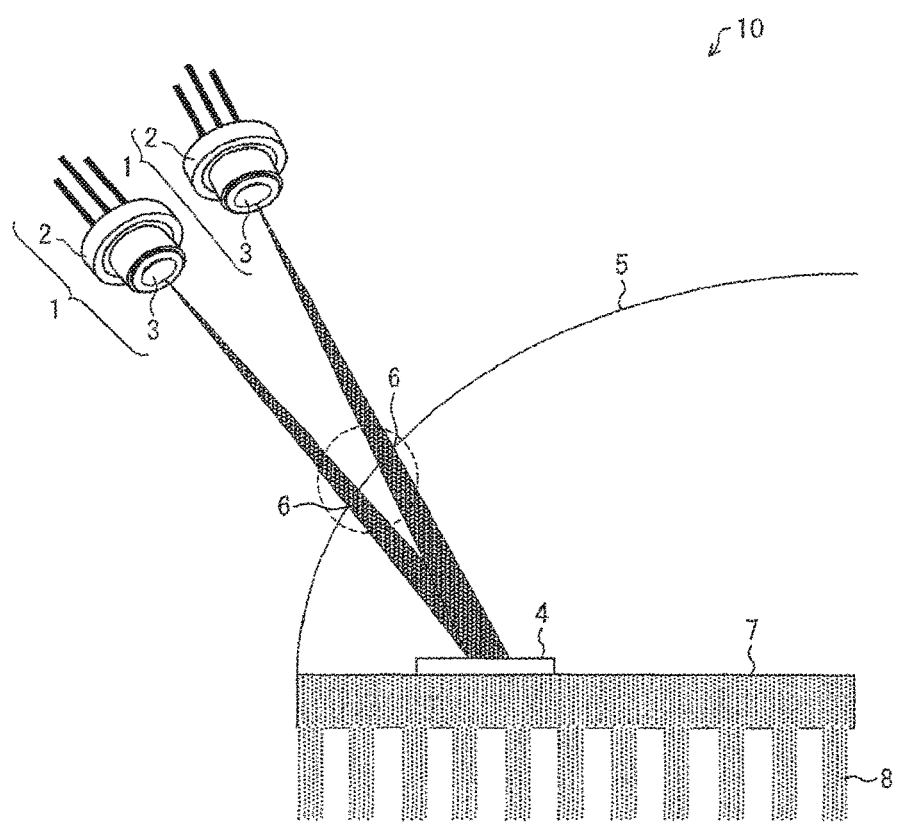
FIG. 1 is a cross-sectional view schematically illustrating an arrangement of a headlamp in accordance with one embodiment of the present invention.

First, the following description deals with a schematic arrangement of a headlamp (light emitting device, vehicle headlamp) 10 in accordance with one embodiment of the present invention, with reference to FIG. 1. FIG. 1 is a cross-sectional view schematically illustrating the arrangement of the headlamp 10. The headlamp 10 includes two light irradiation units (light irradiation section, laser element) 1, a light emitting section 4, a half parabolic mirror (reflecting mirror) 5, a window section 6, a metallic base (heat conductive member) 7, and a plurality of fins 8 (see FIG. 1).

(Light Irradiation Unit 1)

The light irradiation unit 1 emits a laser beam toward a light irradiated surface (not illustrated) of the light emitting section 4, which laser beam increases regularly in beam diameter in a direction in which the laser beam travels. Because of this, light density of the laser beam would not become excessively high on any regions of the light irradiated surface of the light emitting section 4. Accordingly, it is possible to prevent a reduction in light emitting efficiency due to deterioration of the light emitting section 4 and/or an increase in a temperature of the light emitting section 4. Note that the "light irradiated surface" can be either a single surface out of a plurality of surfaces constituting the light emitting section 4, or a plurality of surfaces out of the plurality of surfaces constituting the light emitting section 4.

The headlamp 10 of the present embodiment has two light irradiation units 1 (see FIG. 1). Note, however, that the number of light irradiation units 1 is not limited to two. A single light irradiation unit 1 or three or more light irradiation units 1 can be provided instead of providing two light irradiation units 1. In the case where the plurality of light irradiation units 1 are provided, a plurality of laser beams are emitted from the plurality of light irradiation units 1, respectively. In this case, it is easy to obtain a high-power laser beam. It is thus preferable to provide a plurality of light irradiation units 1.

Here, the "beam diameter" is a maximum diameter which defines an area of light having light intensity in a range of 1/e2 of maximum light intensity of the laser beam to the maximum light intensity of the laser beam. Further, the description that the "laser beam which increases regularly in beam diameter in a direction in which the laser beam travels" does not mean that a value of an increasing rate of the beam diameter with respect to a traveling distance of the laser beam must be a constant value at any points on the optical path, but that the value of such an increasing rate is a positive value or zero (0) at an arbitral point on the optical path (except for a case where the increasing rate is zero (0) at any points on the optical path).

Further, each of the two light irradiation units 1 of the present embodiment includes a laser element (housing, laser package) 2, and a magnifying lens (increasing rate changing element, lens) 3.

(Laser Element 2)

The laser element 2 stores a laser chip LC (laser beam source) (described later) inside the laser element 2, so as to protect the laser chip LC. Details of the laser element 2 will be described later.

The magnifying lens 3 is attached to an end of a cap section of the laser element 2 so that the magnifying lens 3 and the laser element 2 are formed integral with each other. The laser element 2 and the magnifying lens 3 are not necessarily formed integral with each other. However, such an arrangement is preferable because the integration can prevent a change in a relative positional relationship between the laser chip LC and the magnifying lens 3 due to vibration of the light irradiation unit 1, aging deterioration of the light irradiation unit 1, and/or the like. Moreover, the integration allows (i) a reduction in the number of components of the light irradiation unit 1 and (ii) a reduction in size of the entire light irradiation unit 1.

(Magnifying Lens 3)

Figure 10:
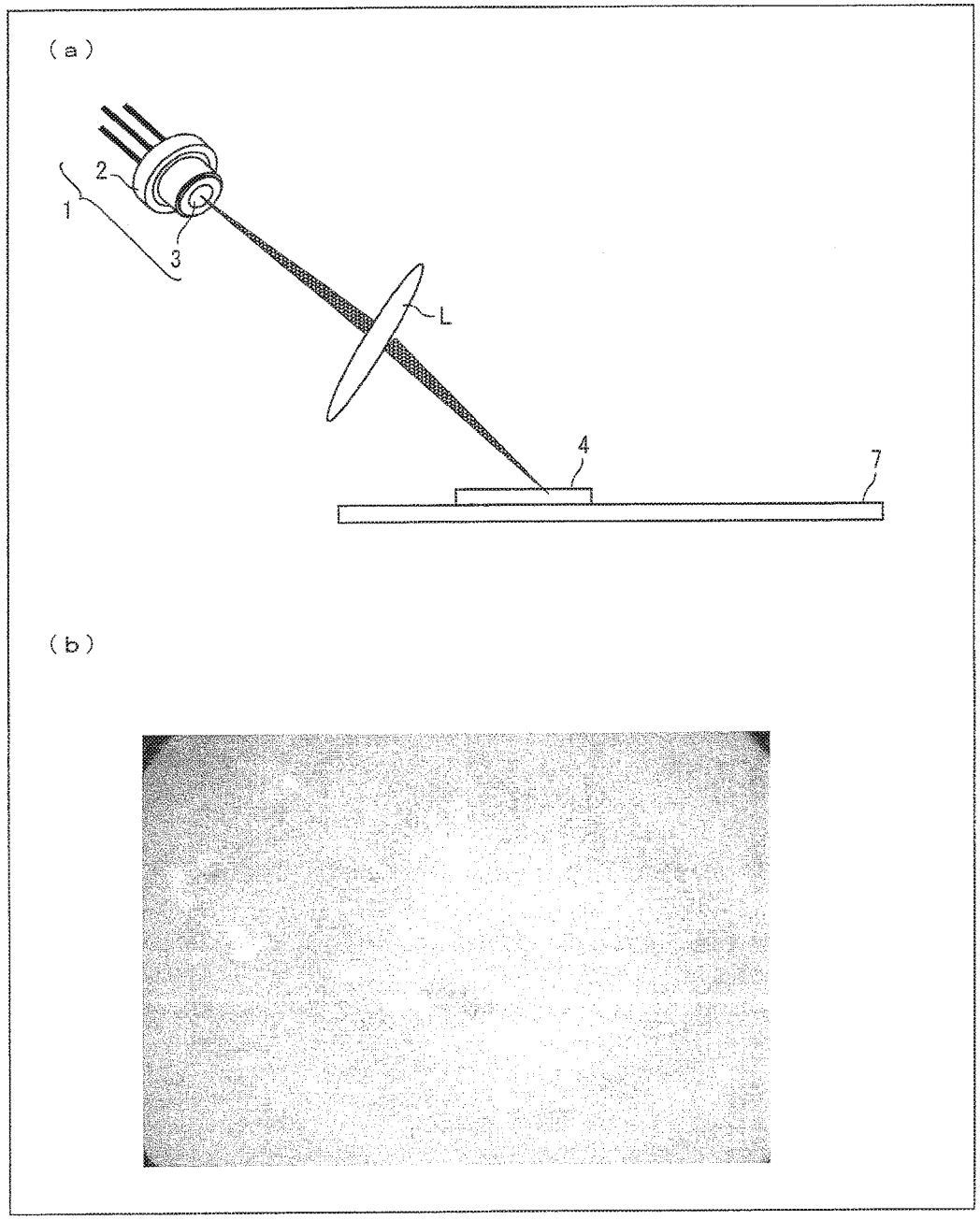
FIG. 10 is an explanatory view schematically illustrating a problem caused by irradiation of a laser beam which is converged on a light emitting section by use of a lens: (a) of FIG. 10 illustrates a state where the laser beam is converged on the light emitting section by use of a condenser lens provided between a laser element and the light emitting section, and (b) of FIG. 10 illustrates a state where the light emitting section is damaged due to irradiation of the laser beam.
Figure 11:
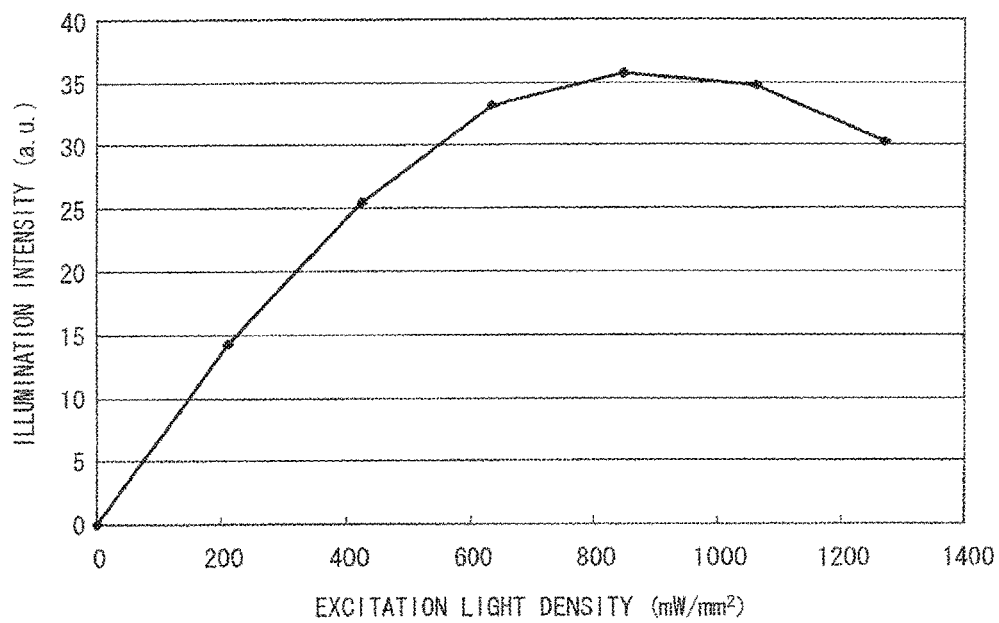
FIG. 11 is a graph showing a relationship between light density and light emission intensity (illumination intensity).

The following description deals with a problem with the use of a condenser lens L with reference to FIGS. 10 and 11, which problem is caused by irradiation of the laser beam which is converged on the light emitting section 4 by use of the condenser lens L. The inventors of the present invention have found the following problems (1) and (2) that had never been found before, and had never been pointed out in conventional techniques including Patent Literatures 1 and 2.

(1) First, the inventors of the present invention arranged the condenser lens L between the light irradiation unit 1 and the light emitting section 4, and caused the light irradiation unit 1 to irradiate actually the light irradiated surface of the light emitting section 4 with the laser beam via the condenser lens L. Under the circumstances, the inventors of the present invention examined a relationship between light density and a state of the light irradiated surface of the light emitting section 4.

As a result, it was found out that, with the arrangement, the light emitting section 4 is permanently-damaged when it is irradiated with a laser beam having light density of 2000 mW/mm2 or more (note that this characteristic changes depending on a material of the light emitting section 4) (see (b) of FIG. 10).

(2) Next, the following description deals with a result of the examination of the relationship between the light density on the irradiated surface of the light emitting section 4 and light emission intensity (illumination intensity), as an example (see FIG. 11).

As shown in FIG. 11, it was found out that the light emission intensity increases regularly as the light density on the irradiated surface of the light emitting section 4 increases. However, after the light density reaches 800 mW/mm2, the light emission intensity starts decreasing regularly as the light density on the light irradiated surface increases. It is considered that (i) the increase in light density on the light irradiated surface causes an increase in the temperature of the light emitting section 4 due to heat generated by particles of a fluorescent material included in the light emitting section 4, (ii) the increase in the temperature causes a reduction in light emitting efficiency (temperature quenching), and (iii) the reduction in light emitting efficiency causes the foregoing decrease in the light emission intensity. Note that this characteristic changes depending on the material of the light emitting section 4.

In view of the problems, the magnifying lens 3 of the present embodiment is a lens (diverging lens) which can reduce an increasing rate of the beam diameter in the direction in which the laser beam travels, as the lens transmits the laser beam. With such a magnifying lens 3, the increasing rate of the beam diameter of the laser beam emitted from the magnifying lens 3 can be reduced in accordance with (i) a distance between the laser chip LC and the light emitting section 4 and (ii) an area of the light irradiated surface of the light emitting section 4. This prevents an area of an irradiated region on the light irradiated surface from becoming larger than an area of the light irradiated surface.

The magnifying lens 3 of the present embodiment is a biconvex lens. Note, however, that the magnifying lens 3 of the present embodiment is not limited to this. Examples of the magnifying lens 3 encompass a biconcave lens, a plane-convex lens, a plane-concave lens, a convex meniscus lens, and a concave meniscus lens.

In addition to these lenses, a GRIN lens (Gradient Index lens: refractive index gradient changing lens) may be also used as the magnifying lens 3.

Note that the GRIN lens is a lens that exhibits a lens function by refractive index gradient inside the lens even if the lens does not have a convex or concave shape.

Accordingly, by use of the GRIN lens, it is possible to achieve the lens function while taking advantages of flat end surfaces of the GRIN lens.

Note that it is preferable that any position on the light irradiated surface of the light emitting section 4 has light density of less than 2000 mW/mm2.

As described above, in this example, in a case where the light density of the laser beam becomes 2000 mW/mm2 or more at any position on the light irradiated surface of the light emitting section 4, the position might be permanently-damaged (deteriorated). In view of this, according to the foregoing arrangement, the light density of the laser beam is less than 2000 mW/mm2 at any position on the light irradiated surface of the light emitting section 4. This successfully prevents the deterioration of the light emitting section 4.

Further, it is preferable that the light density of the laser beam is in a range of not less than 500 mW/mm$^2$ but not more than 1300 mW/mm$^2$ at any position on the light irradiated surface of the light emitting section 4.

In a case where the light density of the laser beam is less than 500 mW/mm2 or more than 1300 mW/mm2 at any position on the light irradiated surface of the light emitting section 4, the light emitting efficiency of the light emitting section might become 85% or less with respect to the maximum light emitting efficiency.

Thus, with the foregoing arrangement in which the light density of the laser beam is not less than 500 mW/mm2 but not more than 1300 mW/mm2 at any position on the light irradiated surface of the light emitting section 4, it is possible to prevent successfully a reduction in light emitting efficiency due to deterioration of the light-emitting section and/or an increase in the temperature of the light emitting section.

Note that, according to the present embodiment, the magnifying lens 3 is made from BK (borosilicate crown) 7, and a surface of the magnifying lens 3 is subjected to AR (Anti-Reflection) coating.

Figure 2:
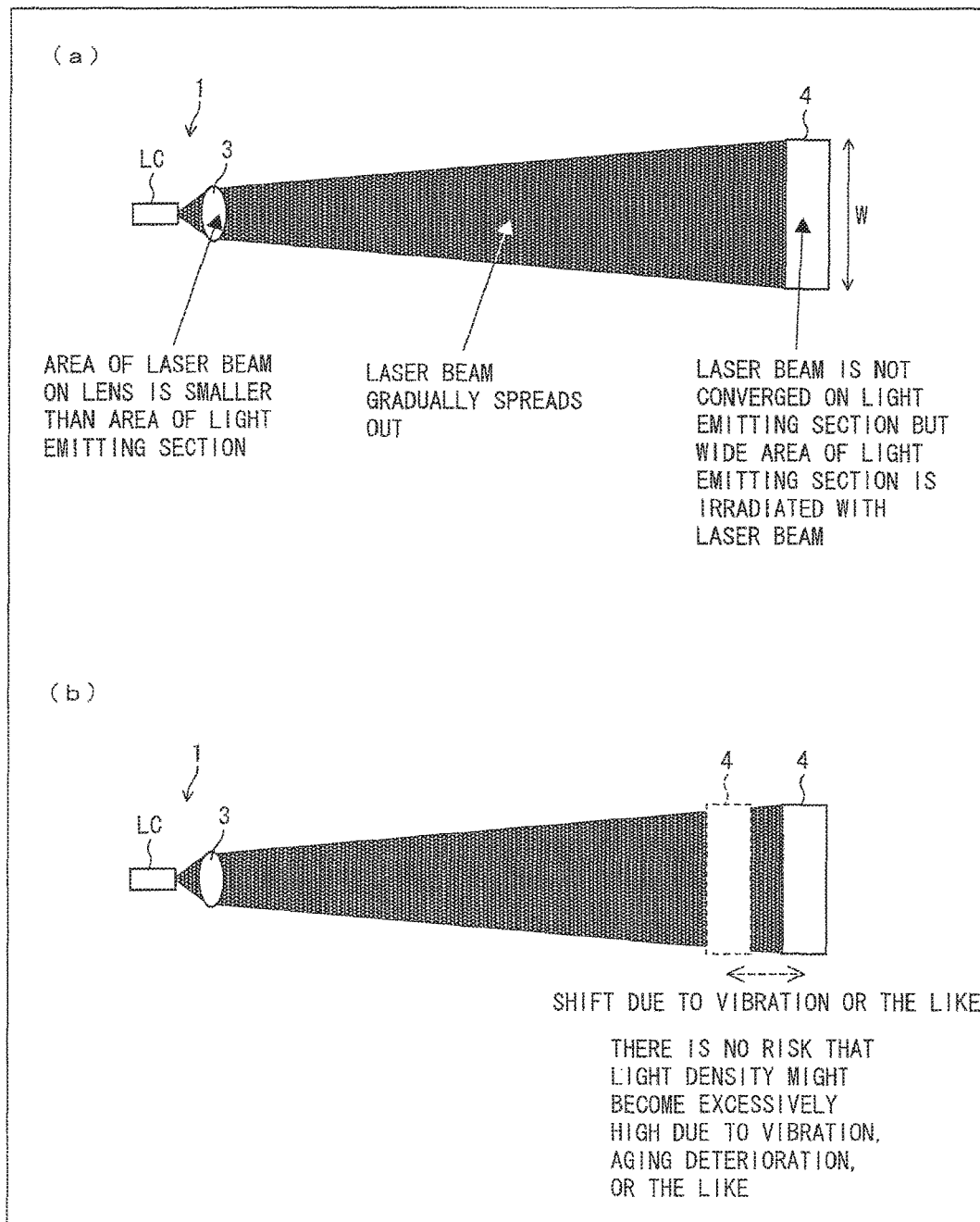

Next, the following description deals with a function of the headlamp 10 (the light irradiation unit 1, in particular) of the present embodiment with reference to FIG. 2.

FIG. 2 is an explanatory view schematically illustrating the function of the headlamp 10 (the light irradiation unit 1, in particular). (a) of FIG. 2 illustrates a normal operation state (normal state), and (b) of FIG. 2 illustrates a state (abnormal state) where a relative positional relationship between the light emitting section and the light irradiation section is changed due to vibration or the like.

The light irradiation unit 1 is such that an area (irradiated area) of a spot of the laser beam incident on the magnifying lens 3, which laser beam is emitted from the laser chip LC, is smaller than an area of the light irradiated surface of the light emitting section 4 (see (a) of FIG. 2).

With the arrangement, the magnifying lens 3 transmits the laser beam so that the laser beam is diffused. As a result, a large region on the light irradiated surface of the light emitting section 4 is irradiated with the laser beam. Accordingly, the laser beam is not converged on the light irradiated surface, and the light density of the laser beam would not become excessively high at any position on the light irradiated surface.

Further, even if the normal state illustrated in (a) of FIG. 2 is changed to the abnormal state illustrated in (b) of FIG. 2, the light density of the laser beam would not become excessively high at any position on the light irradiated surface of the light emitting section 4. This is because the magnifying lens 3 transmits the laser beam so that the laser beam is diffused.

As described above, according to the headlamp 10 (the light irradiation unit 1, in particular), it is possible to prevent a reduction in light emitting efficiency due to deterioration of the light emitting section 4 and/or an increase in the temperature of the light emitting section 4.

Instead of the magnifying lens 3, a collimator lens can be used to emit, toward the light emitting section 4, a laser beam (collimated light) collimated by the collimator lens. Note, however, that since it is significantly undesirable that the collimated light is leaked outside, the laser beam is preferably not collimated but diffused, as in the light irradiation unit 1 of the present embodiment.

(Light-Emitting Section 4)

The light emitting section 4 generates fluorescence by receiving the laser beam emitted from the light irradiation unit 1. The light emitting section 4 includes a fluorescent material for emitting fluorescence by receiving the laser beam. Specifically, the light emitting section 4 is formed in such a manner that the fluorescent material is dispersed in a sealing material. Alternatively, the light emitting section 4 can be formed in such a manner that the fluorescent material is pressed into a solid. The light emitting section 4 serves as a wavelength conversion element for converting the laser beam into the fluorescence.

According to the headlamp 10, the light emitting section 4 is arranged at a position of a focal point of the half parabolic mirror 5.

The light emitting section 4 of the present embodiment has a circular cylinder shape (a disk shape) whose bottom plane has a circular shape having a diameter of 2 mmφ. Note, however, that a size of and a shape of the light emitting section 4 are not limited to these, and any size and any shape can be selected, as appropriate. In addition to the disk shape, examples of the shape of the light emitting section 4 encompass a rectangular column shape and an elliptical column shape.

The light emitting section 4 is arranged substantially at the focal point of the parabolic mirror 5 on the metallic base 7. Accordingly, the fluorescence emitted from the light emitting section 4 is reflected from a reflecting curved surface (reflecting surface) of the parabolic mirror 5 so that the optical path of the fluorescence is controlled. It is possible to form, on an upper surface (the upper part of the sheet on which the drawing is illustrated) of the light emitting section 4, an anti-reflection structure for preventing the reflection of the laser beam.

Examples of the fluorescent material of the light emitting section 4 encompass an oxynitride fluorescent material (e.g., sialon fluorescent material) and a III-V compound semiconductor nanoparticle fluorescent material (e.g., indium phosphide: InP). These fluorescent materials are high in heat resistance against the high-power (and/or high-light density) laser beam emitted from the light irradiation unit 1, and therefore are suitably used in the headlamp 10. Note, however, that the fluorescent material of the light emitting section 4 is not limited to these described above, and other fluorescent materials, such as a nitride fluorescent material, can be employed.

Further, a color of illumination light of a headlamp is limited to white having chromaticity in a predetermined range under the Japanese law. For this reason, the light emitting section 4 includes such a fluorescent material(s) that white illumination light is obtained.

For example, white light can be generated in such a manner that (i) a blue fluorescent material, a green fluorescent material, and a red fluorescent material are contained in the light emitting section 4 and (ii) the light emitting section 4 is irradiated with a laser beam having a wavelength of 405 nm. Alternatively, white light can be generated in such a manner that (i) a yellow fluorescent material (or a green fluorescent material or a red fluorescent material) is contained in the light emitting section 4 and (ii) the light emitting section 4 is irradiated with a laser beam having a wavelength of 450 nm (blue) (or what is called a blue-like laser beam having a peak wavelength in a range of not less than 440 nm but not more than 490 nm).

Examples of the sealing material of the light emitting section 4 encompass a glass material (inorganic glass, organic-inorganic hybrid glass) and a resin material such as a silicone resin. The glass material may be glass having a low-melting point. It is preferable that the sealing material has high transparency. In a case of the high-power laser beam, it is preferable that the sealing material has high heat resistance.

(Parabolic Mirror 5)

The parabolic mirror 5 reflects the fluorescence generated by the light emitting section 4 so as to form a pencil of rays (illumination light) that travels in a predetermined solid angle. The parabolic mirror 5 may be (i) a member whose surface is coated with a metal thin film or (ii) a metallic member.

The parabolic mirror 5 has an opening section (the right side on the sheet on which the drawing is illustrated) which has a shape of a half circle whose radius is 30 mm. The parabolic mirror 5 has a depth (the right-left direction on the sheet on which the drawing is illustrated) of 30 mm. The light emitting section 4 is arranged at the position of the focal point of the parabolic mirror 5.

Further, the parabolic mirror 5 has, as a reflecting surface, at least a part of a partial curved surface. The partial curved surface is obtained by cutting a paraboloid of revolution (parabola) which is formed by rotating a parabola around a rotational axis which is a symmetric axis of the parabola, the cutting being carried out along a plane including the rotational axis. This makes it possible to project the fluorescence of the light emitting section 4 efficiently in a narrow solid angle. As a result, the use efficiency of the fluorescence can be increased. Further, it becomes possible to provide a structure other than the parabola in a space corresponding to the other half of the parabola.

Furthermore, according to the parabolic mirror 5, most of fluorescence that cannot be controlled by the reflecting surface is emitted toward the parabola. By taking advantage of this property, it is possible to illuminate a wide area of the headlamp 10 on a parabola side.

(Window Section 6)

The light irradiation unit 1 is arranged outside the parabolic mirror 5. The half parabolic mirror 5 has a window section 6 which (i) transmits the laser beam or (ii) allows the laser beam to pass through the window section. The window section 6 may be either an opening section or a section including a transparent member which transmits the laser beam. For example, the window section 6 may be a transparent plate to which a filter is attached, which filter transmits the laser beam but reflects white light (the fluorescence generated by the light emitting section 4). With the arrangement, it is possible to prevent the fluorescence generated by the light emitting section 4 from leaking from the window section 6.

According to the arrangement described above, it is possible to irradiate the light emitting section 4 with the laser beam from the outside of the parabolic mirror 5 via the window section 6 of the parabolic mirror 5. This makes it possible to increase flexibility in arranging the light irradiation unit 1. For example, it becomes easy to set a desired irradiation angle at which the laser beam is incident on the light irradiated surface of the light emitting section 4.

The number of the window sections 6 is not particularly limited. A single window section 6 can be shared by a plurality of light irradiation unit 1. Alternatively, a plurality of window sections 6 can be provided for a plurality of light irradiation units 1, respectively.

The half parabolic mirror 5 of the present embodiment has a shape of a half parabola formed in such a manner that a partial curved surface is obtained by cutting the parabola along the plane including the rotational axis of the parabola, as an example. Note, however, that the shape of the reflecting mirror is not limited to this.

For example, the reflecting mirror can have a shape of a parabola, a shape of a partial curved surface of an ellipsoid of revolution, or a shape of a hemisphere surface. In other words, the reflecting mirror has any shape provided that a reflecting surface of the reflecting mirror includes at least a part of a curved surface formed by rotating a figure (ellipse, circle, parabola) around a rotational axis.

(Metallic Base 7)

The metallic base 7 is a plate member for supporting the light emitting section 4, and made from a metal (e.g., copper or iron). The metallic base 7 therefore has high heat conductivity, and can efficiently dissipate heat generated by the light emitting section 4. Note that the member for supporting the light emitting section 4 is not limited to the member made from a metal, but may be a member containing a material (glass, sapphire, etc.) having high heat conductivity other than a metal. Note, however, that it is preferable that a surface of the metallic base 7, which surface is in contact with the light emitting section 4, functions as a reflecting surface. In the case where the surface functions as the reflecting surface, it becomes possible to reflect, from the reflecting surface toward the parabolic mirror 5, the fluorescence into which the laser beam entering the upper surface of the light emitting section 4 has been converted. Further, it is possible to reflect, from the reflecting surface toward the inside of the light emitting section 4 again, the laser beam entering the upper surface of the light emitting section 4, so as to convert the laser beam into the fluorescence.

According to the headlamp 10 of the present embodiment, the metallic base 7 is made from copper, and aluminum is vapor-deposited on a surface of the metallic base 7, on which surface the light emitting section 4 is to be provided. On the other surface (back surface) of the metallic base 7, the plurality of fins 8 each having a length of 30 mm and a width of 1 mm are arranged at intervals of 5 mm (later described). Note that the metallic base 7 and the plurality of fins 8 can be formed integral with each other.

The metallic base 7 is covered with the parabolic mirror 5. That is, the metallic base 7 has a surface facing the reflecting surface of the parabolic mirror 5. It is preferable that the surface of the metallic base 7, on which the light emitting section 4 is provided, (i) is substantially parallel to the rotational axis of the paraboloid of revolution of the parabolic mirror 5 and (ii) includes the rotational axis or extends in the vicinity of the rotational axis.

(Fin 8)

The plurality of fins 8 function as a cooling section (heat dissipation mechanism) for cooling the metallic base 7. The plurality of fins 8 have a plurality of heat sinks, so as to have an increase in contact area with the atmosphere. The increase in the contact area increases the heat dissipation efficiency. The cooling section for cooling the metallic base 7 only has to have a cooling (heat dissipation) function. The cooling section may be a heat pipe, a water cooling system, or an air-cooling system.

(Details of Light Irradiation Unit 1)

Figure 3:
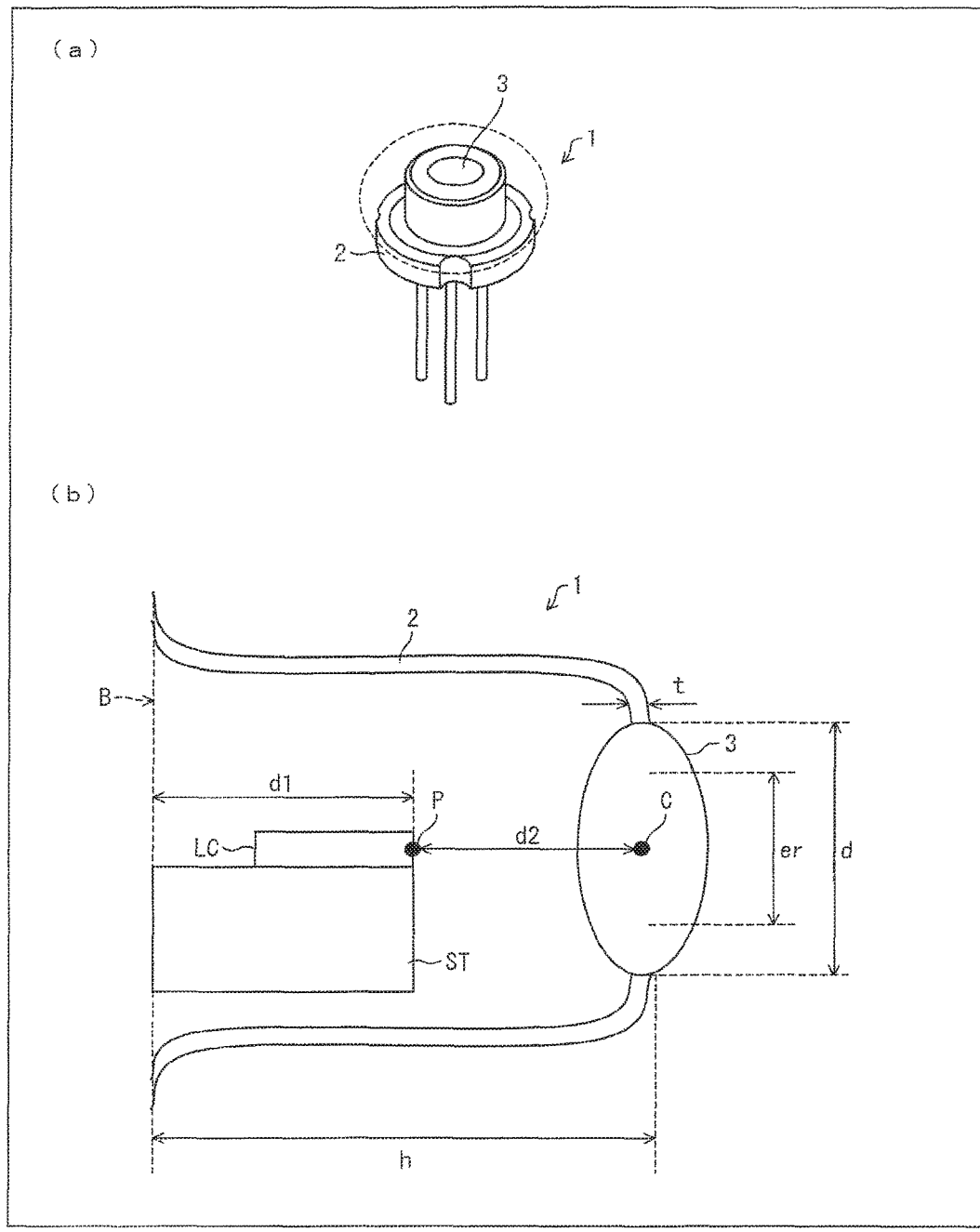
FIG. 3 is a view illustrating an arrangement of a laser element in accordance with another embodiment of the present invention: (a) of FIG. 3 illustrates an outer appearance of the laser element when it is viewed in an oblique direction, and (b) of FIG. 3 illustrates cross-sectionally an arrangement of a cap section of the laser element when it is viewed in a lateral direction.
Figure 4:
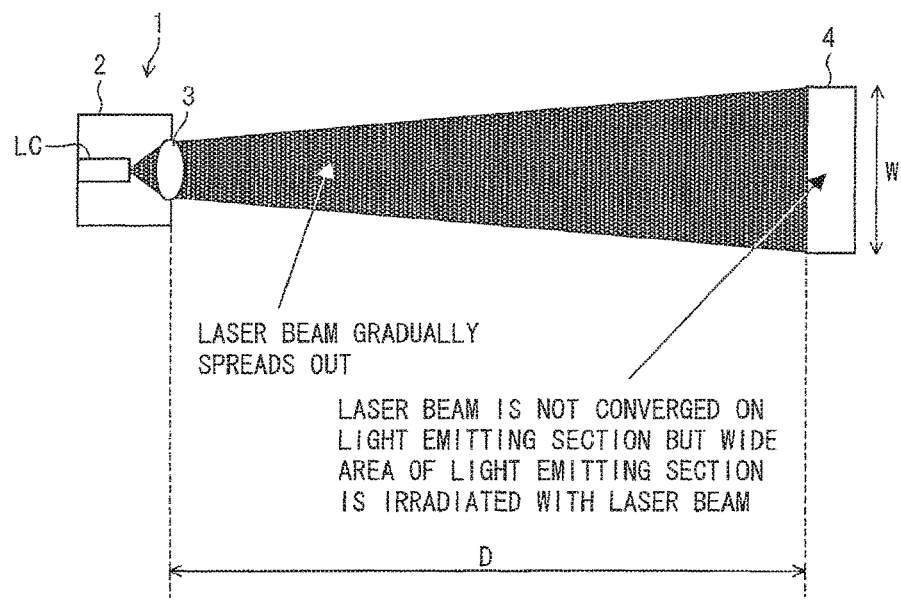
FIG. 4 is an explanatory view for schematically illustrating a function of the laser element.

Next, the following description deals with details of the light irradiation unit 1 with reference to FIGS. 3 and 4. FIG. 3 is a view illustrating an arrangement of the light irradiation unit 1. (a) of FIG. 3 is a perspective view illustrating an outer appearance of the light irradiation unit 1 when it is viewed in an oblique direction. (b) of FIG. 3 is a cross-sectional view illustrating an arrangement of a cap section of the light irradiation unit 1 when it is viewed laterally.

The light irradiation unit 1 is constituted such that the magnifying lens 3 is attached to an end of the cap section of the laser element 2 of 5.6 mmφ (see (b) of FIG. 3).

Further, a laser chip LC is fixed on a stem ST in the laser element 2. Note that the laser chip LC is a semiconductor laser element functioning as a laser beam source for emitting a laser beam. The laser chip LC may be a single chip having a single light emitting point P, or a single chip having a plurality of light emitting points P. The laser chip LC has an oscillation wavelength of 405 nm, and an output of 1 W.

The magnifying lens 3 is a lens that is suitably used to excite the light emitting section 4 whose bottom plane having a circular shape having a diameter of 2 mmφ. Note that a lens diameter d of the magnifying lens 3 is 1.5 mm and an effective diameter of the magnifying lens 3 is 1.0 mm.

Here, a distance d1 between a bottom B of the cap section and the light emitting point P of the laser chip LC is 1.5 mm, and a distance d2 between the light emitting point P and a center C of the magnifying lens 3 is 1.5 mm. As a matter of course, positions of the laser chip LC and the magnifying lens 3 are adjusted so as to adjust the optical axis. Note that a height h of the cap section is 3.0 mm, and a thickness t of the cap section is 0.12 mm.

Next, the following description deals with a function of the light irradiation unit 1 with reference to FIG. 4.

The laser beam emitted from the light irradiation unit 1 is gradually spread out (the beam diameter regularly increases) as it travels (see FIG. 4). It has been found that the light irradiation unit 1 can irradiate a small region (W=2 mmφ) with the laser beam even a distance D between the light irradiation unit 1 and the light emitting section 4 is 60 mm.

In this case, more than 90% of energy of the light emitted from the laser chip LC can be transmitted to the region of 2 mmφ, which region is 60 mm away from the light irradiation unit 1. That is, the light irradiation unit 1 can irradiate the light emitting section 4 with the laser beam highly efficiently.

Unlike a case where the condenser lens illustrated in FIG. 10 is used, the laser beam emitted from the light irradiation unit 1 described above would not be converged excessively on the light emitting section 4, irrespective of whether the positional relationship between the light irradiation unit 1 and the light emitting section 4 is in the normal state or the abnormal state.

Further, with the light irradiation unit 1, it is possible to (i) align the laser chip LC and the magnifying lens 3 with respect to each other with high accuracy in a manufacturing process and (ii) carry out an adjustment of the optical axis with high accuracy in the manufacturing process.

For example, it is possible to align the laser chip LC and the magnifying lens 3 attached to the cap with respect to each other with higher accuracy in such a manner that, during the manufacturing process (when the cap is aligned), (i) a weak laser beam is emitted from the laser chip LC and (ii) a position of the cap to which the magnifying lens 3 is attached is adjusted while a diameter of and/or a position of the spot of the light which has traveled through the magnifying lens 3 is monitored.

According to the light irradiation unit 1 of the present embodiment, it is preferable that the spot of the laser beam on the irradiated surface of the light emitting section 4 has a larger area (irradiated area) than an area of a light emitting region of the light emitting point P of the laser chip for emitting the laser beam.

The light emitting section 4 of the present embodiment has a circular cylinder shape whose bottom plane has a circular shape having a diameter of 2 mmφ. Accordingly it is particularly preferable that the area (irradiated area) of the spot of the laser beam on the light irradiated surface of the light emitting section 4 is in a range of not less than 0.1 mmφ but not more than 2 mmφ.

With the arrangement, the light irradiated surface of the light emitting section 4 is irradiated with the diffused laser beam emitted from the light irradiation unit 1, so that the light density of the laser beam would not become excessively high at any position on the light irradiated surface of the light emitting section 4.

Further, it is preferable that the magnifying lens 3 is arranged on the optical path of the laser beam emitted from the laser chip LC and causes the beam diameter of the laser beam to increase regularly after the laser beam travels through the magnifying lens 3. That is, the laser beam starts to be diffused after it passes through the magnifying lens 3. Accordingly, the laser beam is not converged on the light irradiated surface of the light emitting section 4, and therefore the light density of the laser beam would not become excessively high at any position on the light irradiated surface of the light emitting section 4.

Further, according to the light irradiation unit 1, it is preferable that the area (irradiated area of a surface of the lens) of the spot of the laser beam on the magnifying lens 3, which laser beam is emitted from the laser chip LC and is incident on the magnifying lens 3, is smaller than the area of the light irradiated surface of the light emitting section 4. With the arrangement, the laser beam starts to be diffused after it travels through the magnifying lens 3. Accordingly, the laser beam is not converged on the light irradiated surface of the light emitting section 4, and therefore the light density of the laser beam would not become excessively high at any position on the light irradiated surface of the light emitting section 4.

[2. Arrangement of Headlamp 20]

Figure 5:
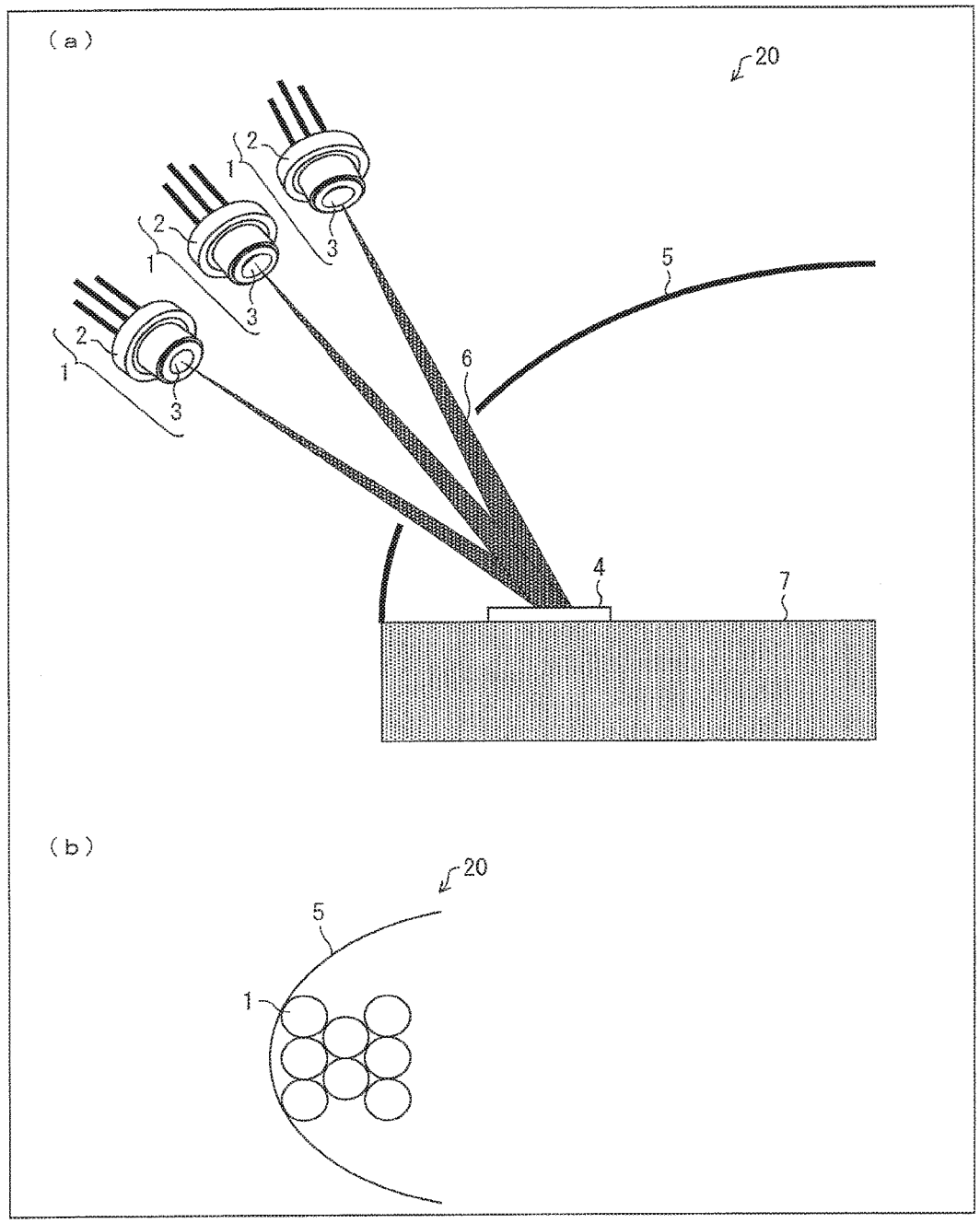
FIG. 5 is a cross-sectional view schematically illustrating a headlamp in accordance with further another embodiment of the present invention: (a) of FIG. 5 illustrates a half parabola reflecting mirror (parabolic mirror) when it is viewed in a lateral direction, and (b) of FIG. 5 illustrates an example of how the light irradiation section is arranged with respect to the parabolic mirror when the light irradiation section and the parabolic mirror are viewed from an upper side with respect to these (viewed from an upper side of (a) of FIG. 5, i.e., a reflecting mirror 5 side).

FIG. 5 is a view schematically illustrating an arrangement of a headlamp (vehicle headlamp, illumination device) 20 in accordance with another embodiment of the present invention. The headlamp 20 is an illumination device for emitting fluorescence generated by a light emitting section 4.

As illustrated in (b) of FIG. 5, main differences between the headlamp 20 and a headlamp 10 described above are the following two points: (1) the headlamp 20 includes a total of eight light irradiation units 1 each being identical with a light irradiation unit 1 described above and (2) the eight light irradiation units 1 are arranged three-dimensionally such that three light irradiation units 1, two light irradiation units 1, and three light irradiation units 1 (hereinafter, referred to as three-stage arrangement) are provided (closest packed structure) in this order from the left side on the sheet on which the drawing is illustrated. Unlike the headlamp 10, the headlamp 20 of the present embodiment includes no fins 8. Note, however, that the headlamp 20 can have the plurality of fins 8, as appropriate.

(Details of Light Irradiation Unit 1)

The light irradiation unit 1 emits laser beam having a wavelength of 405 nm and has an output of 1 W, as described above. According to the present embodiment, a total of eight light irradiation units 1 are provided. Accordingly, a total output of the laser beam is 8 W.

The light irradiation unit 1 irradiates the light emitting section 4 with the laser beam via (i) a magnifying lens 3 and (ii) a window section 6. More specifically, a spot of the laser beam emitted from the light irradiation unit 1 is enlarged so that a region of 2 mmΦ at substantially a center (a focal point of a parabola mirror 5) of the light emitting section 4 (later described) is irradiated with the laser beam. With the three-stage arrangement, the laser beam emitted from each of the light irradiation units 1 travels through the window section 6 and then is incident on the light emitting section 4 at an incident angle in a range of 30° to 70°.

(Details of Light Emitting Section 4)

The light emitting section 4 contains three sorts of fluorescent material, i.e., RGB fluorescent materials, so as to emit white light. The red fluorescent material is CaAlSiN3: Eu, the green fluorescent material is β-SiAlON: Eu, and the blue fluorescent material is (BaSr) MgAl10O17: Eu.

Powders of these fluorescent materials are uniformly mixed in a resin (e.g., a silicone resin), and the resin containing these fluorescent materials is applied to a surface of a metallic base 7.

The light emitting section 4 has (i) a circular cylinder shape whose bottom plane has a circular shape (disk shape) having a diameter of 10 mmΦ and (ii) a thickness of 0.1 mm.

(Details of Parabolic Mirror 5)

The parabolic mirror 5 has an opening section (on a right side of the sheet on which the drawing is illustrated) having a shape of a half circle whose radium is 30 mm. The half parabolic mirror 5 has a depth of 30 mm (a width in the right-left direction on the sheet on which the drawing is illustrated). The light emitting section 4 is provided at a focal point of the parabolic mirror 5.

(Details of Metallic Base 7)

The metallic base 7 is made from copper, and aluminum is vapor-deposited on a surface on of the metallic base 7, on which surface the light emitting section 4 is to be provided. The metallic base 7 can cool the light emitting section 4 so as to prevent a reduction in light emitting efficiency of the light emitting section 4 due to an increase in temperature, which increase is caused by irradiation of the laser beam.

(Effects of Headlamp 20)

The headlamp 20 is such that the half parabolic mirror 5 is provided so as to cover an upper part of the light emitting section 4. This increases a ratio of fluorescence whose optical path can be controlled, among the fluorescence emitted from the light emitting section 4. That is, it becomes possible to control, by use of the parabolic mirror 5, most of the fluorescence emitted from the light emitting section 4.

Note, however, that, with the arrangement, it is highly possible that (i) the fluorescence (laterally-emitted fluorescence) emitted from a side surface of the light emitting section 4 cannot be controlled and (ii) such fluorescence might be emitted in a direction other than the front direction.

According to the present embodiment, however, the light irradiated surface of the light emitting section 4 has a larger area than that of the spot of the laser beam, so that an amount of the laterally-emitted fluorescence is reduced. Therefore, with the arrangement, it is possible to (i) reduce the amount of the fluorescence that cannot be controlled by the parabolic mirror 5 and therefore (ii) increase use efficiency of the fluorescence.

Further, it is possible to irradiate, from the outside of the parabolic mirror 5, the light emitting section 4 with the laser beam via the window section 6 of the parabolic mirror 5. Therefore, it is possible to increase flexibility in arranging the light irradiation unit 1. For example, it becomes easy to set a desired irradiation angle at which the laser beam is incident on the light irradiated surface of the light emitting section 4.

[3. Arrangement of Headlamp 30]

Figure 6:
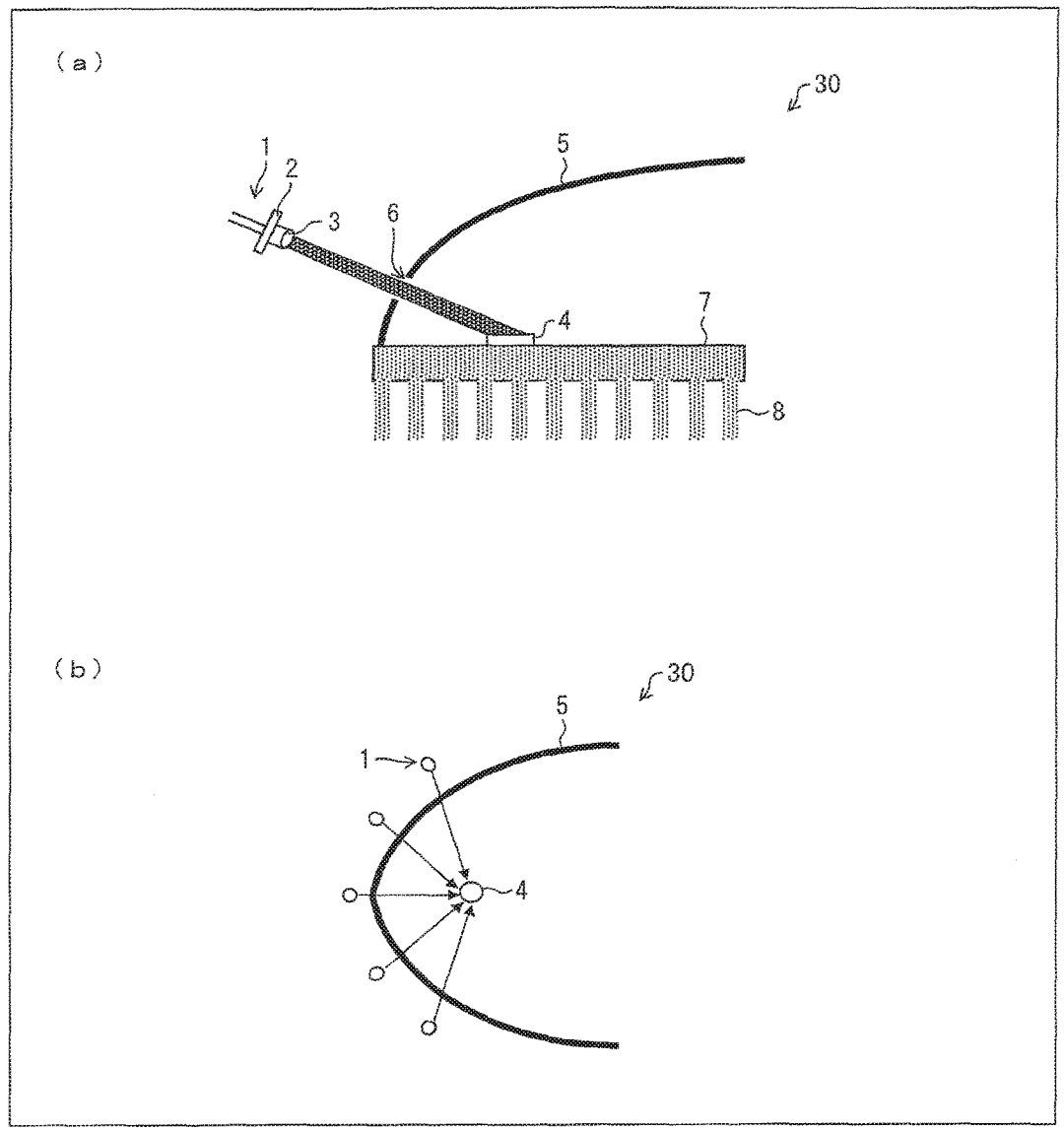
FIG. 6 is a cross-sectional view schematically illustrating an arrangement of a headlamp in accordance with still another embodiment of the present invention: (a) of FIG. 6 illustrates the parabolic mirror when it is viewed in a lateral direction, and (b) of FIG. 6 illustrates an example of how the light irradiation section is arranged with respect to the parabolic mirror when the light irradiation section and the parabolic mirror are viewed from an upper side with respect to these (viewed from an upper side of (a) of FIG. 6, i.e., a reflecting mirror 5 side).

FIG. 6 is a view illustrating an arrangement of a headlamp (vehicle headlamp, illumination device) 30 in accordance with further another embodiment. The headlamp is an illumination device for emitting fluorescence generated by a light emitting section 4.

As illustrated in (b) of FIG. 6, main differences between the headlamp 30 and a headlamp 10 described above are the following two points: (1) the headlamp 30 includes a total of five light irradiation units 1, and (2) the five light irradiation units 1 are provided along an outer surface of a parabolic mirror 5 (from an upper part to a lower part on the sheet on which the drawing is illustrated) and irradiates the light-emitting section 4 with their laser beams via a plurality of window sections 6, respectively.

(Details of Light Irradiation Unit 1)

The light irradiation unit 1 emits a laser beam having a wavelength of 405 nm, and has an output of 1 W. According to the present embodiment, a total of five light irradiation units 1 are provided. Accordingly, a total output of the laser beam is 5 W.

A total of five window sections 6 are provided for the five light irradiation units 1, respectively, and a total of five magnifying lenses 3 are provided for the five light irradiation units 1, respectively. Each of the light irradiation units 1 irradiates the light emitting section 4 with its laser beam via (i) a corresponding one of the five magnifying lenses 3 and (ii) a corresponding one of the five window sections 6. More specifically, a spot of the laser beam emitted from each of the five light irradiation units 1 is enlarged so that (i) the spot of the laser beam is incident on substantially a center (a focal point of the parabola mirror 5) of the light emitting section 4 (later described) and (ii) the entire light emitting section 4 having a circular cylinder shape whose bottom plane has a circle shape having a diameter of 2 mmΦ is irradiated with the laser beam.

(Details of Light Emitting Section 4)

A material of the light emitting section 4 is identical with that of a headlamp 20 described above. Note, however, that the light emitting section 4 of the present embodiment is different from the light emitting section 4 of the headlamp 20 in size.

The light emitting section 4 of the present embodiment has (i) a circular cylinder shape (disk shape) having a bottom plane having a circular shape whose diameter is 2 mmΦ and (ii) a thickness of 0.1 mm.

(Details of Parabolic Mirror 5)

The parabolic mirror 5 of the headlamp 30 in accordance with the present embodiment has an opening section (on a right side of the sheet on which the drawing is illustrated) having a shape of a half circle whose radius is 25 mm. The parabolic mirror 5 has a depth (a width in a right-left direction on the sheet on which the drawing is illustrated) of 45 mm. The light emitting section 4 is provided at a focal point of the parabolic mirror 5.

(Details of Metallic Base 7)

The metallic base 7 is made from copper, and aluminum is vapor-deposited on a surface of the metallic base 7, on which surface the light emitting section 4 is to be provided. Further, on the other surface (back surface) of the metallic base 7, a plurality of fins 8 each having a length of 25 mm and a width of 1 mm are provided at intervals of 5 mm. Via the plurality of fins 8, heat generated by the light emitting section 4 or heat generated by the laser beam is dissipated.

This allows the metallic base 7 to cool the light emitting section 4. Therefore, it is possible to prevent a reduction in light emitting efficiency of the light emitting section 4 due to an increase in temperature, which increase is caused by irradiation of the laser beam. Note that the metallic base 7 and the plurality of fins 8 can be formed integral with each other.

(Effects of Headlamp 30)

According to the headlamp 30, the parabolic mirror 5 is provided so as to cover an upper part of the light emitting section 4. This increases a ratio of fluorescence whose optical path can be controlled, among the fluorescence emitted from the light emitting section 4. It is therefore possible to control, by use of the parabolic mirror 5, a large part of the fluorescence emitted from the light emitting section 4.

Further, according to the headlamp 30, the entire light emitting section 4 is irradiated with the laser beams which travel in different directions. It is therefore possible to further increase the light emitting efficiency of the light emitting section 4.

Further, it is possible to irradiate the light emitting section 4 with the laser beams from the outside of the parabolic mirror 5 via the respective plurality of window sections 6 of the parabolic mirror 5. This increases flexibility in arranging the plurality of light irradiation units 1. For example, it becomes easy to set a desired irradiation angle for each of the laser beams with respect to the light irradiated surface of the light emitting section 4.

[4. Arrangement of Headlamp 40]

Figure 7:
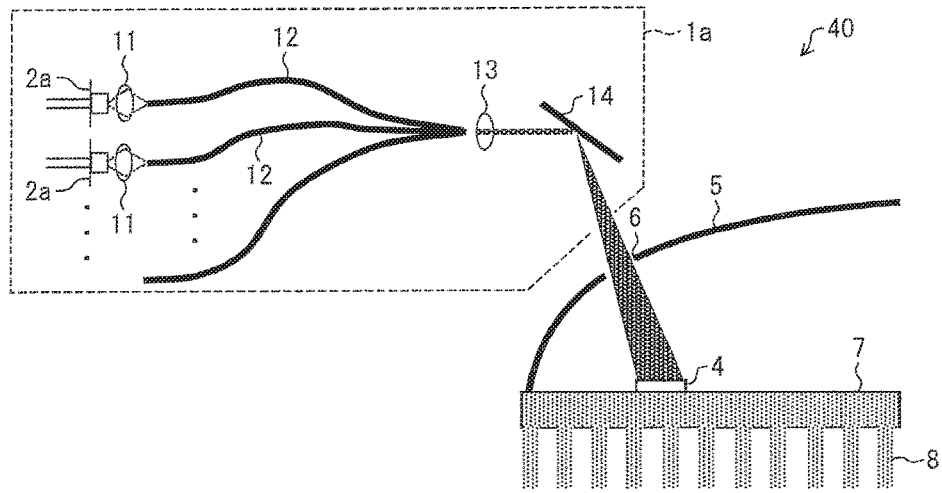
FIG. 7 is a cross-sectional view schematically illustrating an arrangement of a headlamp in accordance with yet another embodiment of the present invention.

FIG. 7 is a view schematically illustrating an arrangement of a headlamp (vehicle headlamp, illumination device) 40 in accordance with yet another embodiment of the present embodiment. The headlamp 40 is an illumination device for emitting fluorescence generated by a light emitting section 4.

The headlamp 40 includes a light irradiation unit (light irradiation section) 1a, a light emitting section 4, a half parabolic mirror 5, a metallic base 7, and a plurality of fins 8 (see FIG. 7).

Further, the light irradiation unit 1a includes (i) a plurality of sets each being constituted by an LD (laser element) 2a and a condenser lens 11, (ii) a plurality of optical fibers 12, (iii) a magnifying lens (an increasing rate changing element, lens) 13, and (iv) a reflecting mirror 14. The light irradiation unit 1a of the present embodiment is an example of a light irradiation section constituted by a plurality of optical members. As in the light irradiation unit 1a, the magnifying lens 3 is not limited to the one that directly receives the laser beams from the plurality of LDs 2a, provided that it can control the laser beams with which the light emitting section 4 is to be irradiated.

Each of the plurality of condenser lenses 11 is a lens for causing the laser beam emitted from a corresponding one of the plurality of LDs 2a to enter an incident end section of a corresponding one of the plurality of optical fibers 12, which incident end section is one of ends of the corresponding one of the plurality of optical fibers 12. The plurality of sets each being constituted by the LD 2a and the condenser lens 11 are provided for the plurality of optical fibers 12, respectively. That is, the plurality of LDs 2a are optically coupled with the plurality of optical fibers 12, respectively, via the respective plurality of condenser lenses 11.

Each of the plurality of optical fibers 12 is a light-guiding member for leading, to the light emitting section 4, the laser beam emitted from a corresponding one of the plurality of LDs 2a. Each of the plurality of optical fibers 12 has a two-layer structure in which a center core is coated with a clad which has a lower refractive index than that of the center core. The laser beam incident on the incident end section travels through inside the corresponding one of the plurality of optical fibers 12, and then exits from an output end section which is the other end of the corresponding one of the plurality of optical fibers 12. The output end sections of the plurality of optical fibers 12 are bound up with a ferrule or the like.

The laser beams emitted from the exit end sections of the respective plurality of optical fibers 12 are enlarged by the magnifying lens 13 so that the entire light emitting section 4 having a light irradiated surface whose diameter is 2 mmΦ is irradiated with the laser beams. The laser beams thus enlarged are reflected from the reflecting mirror 14 so as to be led to the light emitting section 4 through the window section 6 of the half parabolic mirror 5. Note that the laser beams are incident on the light-emitting section 4 at an angle of 45°.

(Details of LD 2a)

Each of the plurality of LDs 2a is an ordinary semiconductor laser package of 5 mmΦ. Unlike a light irradiation unit 1 in which a magnifying lens 3 is attached to a cap section, no magnifying lens 3 is attached to the plurality of LDs 2a. Each of the plurality of LDs 2a emits a laser beam having a wavelength of 405 nm and has an output of 1 W. According to the present embodiment, a total of eight LDs 2a are provided. Accordingly, a total output of the laser beams is 8 W.

(Details of Light Emitting Section 4)

A material of the light emitting section 4 is identical with that of a light emitting section 4 of a headlamp 20 described above. Note, however, that the light emitting section 4 of the present embodiment is different from that of the headlamp 20 in size. For example, the light emitting section 4 of the present embodiment has (i) a circular cylinder shape (disk shape) whose bottom plane having a circular shape having a diameter of 2 mmΦ and (ii) a thickness of 0.2 mm.

(Details of Parabolic Mirror 5)

The parabolic mirror 5 has an opening section having a shape of a half circle whose radius is 30 mm. The parabolic mirror has a depth of 30 mm. The light emitting section 4 is provided at a focal point of the parabolic mirror 5.

(Details of Metallic Base 7)

The metallic base 7 is made from copper, and aluminum is vapor-deposited on a surface of the metallic base 7, on which surface the light emitting section 4 is to be provided. This allows the metallic base 7 to cool the light emitting section 4. It is therefore possible to prevent a reduction in light emitting efficiency of the light emitting section 4 due to an increase in temperature, which increase is caused by irradiation of the laser beam. On the other surface (back surface) of the metallic base 7, a plurality of fins 8 each having a length of 30 mm and a width of 1 mm are provided at intervals of 5 mm. Note that the metallic base 7 and the plurality of fins 8 can be formed integral with each other.

(Effects of Headlamp 40)

According to the headlamp 40, the parabolic mirror 5 is provided so as to cover an upper part of the light emitting section 4. This can increase a ratio of fluorescence whose optical path can be controlled, among the fluorescence emitted from the light emitting section 4. That is, it is possible to control, by use of parabolic mirror 5, a large part of the fluorescence emitted from the light emitting section 4.

Further, it is possible to irradiate the light-emitting section 4 with the laser beams from the outside of the parabolic mirror 5 through the window section 6 of the parabolic mirror 5. This increases flexibility in arranging the light irradiation unit 1a. For example, it becomes easy to set a desired irradiation angle for each of the laser beams with respect to the light irradiated surface of the light emitting section 4.

[Arrangement of Headlamp 50]

Figure 8:
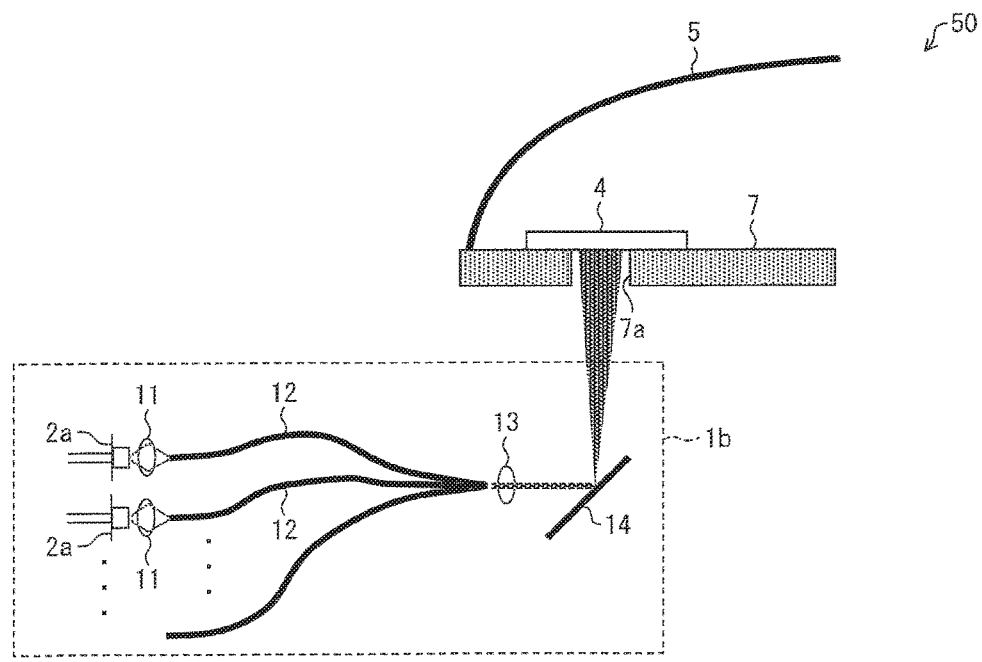
FIG. 8 is a cross-sectional view schematically illustrating an arrangement of a headlamp in accordance with still further another embodiment of the present invention.
Figure 9:
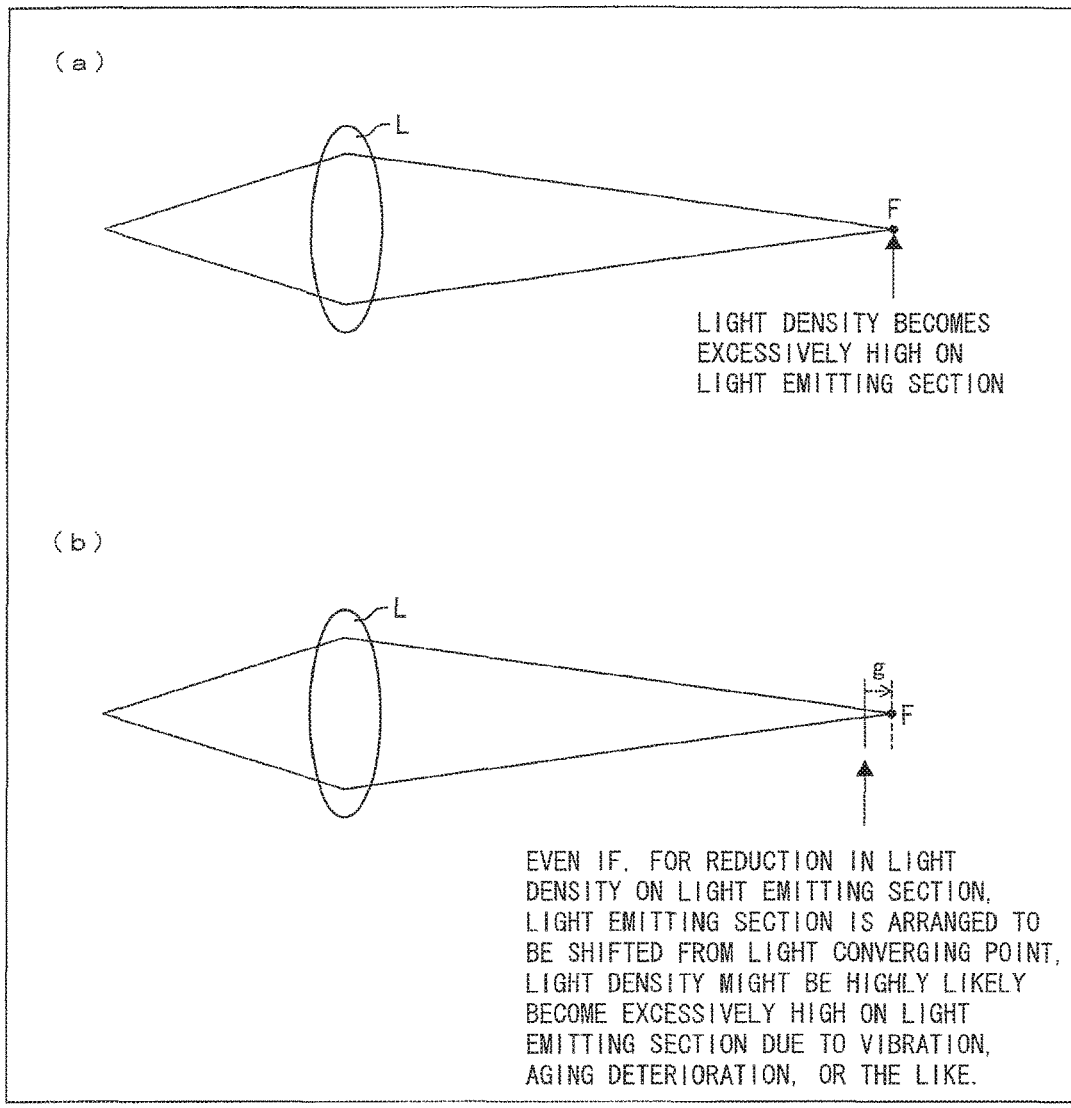

FIG. 8 is a view schematically illustrating a headlamp (vehicle headlamp, illumination device) 50 in accordance with still another embodiment of the present invention. The headlamp 50 is an illumination device for emitting fluorescence generated by a light emitting section 4.

The headlamp 50 includes a light irradiation unit (light irradiation section) 1b, a light emitting section 4, a parabolic mirror 5, and a metallic base 7 (see FIG. 8).

Further, the light irradiation unit 1b includes (i) ten sets each being constituted by an LD 2a and a condenser lens 11, (ii) ten optical fibers 12, (iii) a magnifying lens 13, and (iv) a reflecting mirror 14.

According to the headlamp 50, the metallic base 7 has an opening section 7a, via which the light emitting section 4 is irradiated with laser beams from a bottom side on the sheet on which the drawing is illustrated.

This makes it unnecessary to cause the half parabolic mirror 5 to have a window section 6. Accordingly, it becomes possible to (i) increase substantially an area of a reflecting surface of the parabolic mirror 5 and therefore (ii) increase an amount of fluorescence that can be controlled, among the fluorescence emitted from the light emitting section 4. The light irradiated surface of the light emitting section 4 is not limited to the one that faces the parabolic mirror 5. As in the light irradiation unit 1b of the present embodiment, the light irradiated surface may be the one that does not face the half parabolic mirror 5 (not exposed when viewed from a half parabolic mirror side).

Note that the light emitting section 4 can be larger in area than the opening section 7a of the metallic base 7 so as to cover the opening section 7a (see FIG. 8). Alternatively, the light emitting section 4 can be substantially the same in size as the opening section 7a so as to be fitted to the opening section 7a.

The plurality of light condenser lenses 11 and the plurality of optical fibers 12 are identical with those described above.

The laser beams emitted from the exit end sections of the respective plurality of optical fibers 12 are incident on the light emitting section 4 via (i) the magnifying lens 13 and (ii) the opening section 7a. More specifically, a spot of the laser beams is enlarged so that a region of 2 mmΦ substantially at a center (a focal point of the parabolic mirror 5) of the light emitting section 4 (later described) is irradiated with the laser beams.

The laser beams thus enlarged are reflected from the reflecting mirror 14 so as to be led to the light emitting section 4 through the opening section 7a of the metallic base 7. Note that each of the laser beams is incident on the light emitting section 4 at an angle of 90°.

According to the headlamp 50 of the present embodiment, the light irradiated surface of the light emitting section 4 has a larger area than that of the spot of the laser beams on the light irradiated surface of the light emitting section 4. This reduces an amount of laterally-emitted fluorescence among the fluorescence generated by the light emitting section 4. Accordingly, with the arrangement, it is possible to (i) reduce an amount of fluorescence that cannot be controlled by the parabolic mirror 5 and therefore (ii) increase use efficiency of the fluorescence generated by the light emitting section 4.

(Details of LD 2a)

Each of the plurality of LDs 2a is an ordinary semiconductor laser package of 5 mmΦ, in which no magnifying lens 13 is attached to a cap section. Each of the plurality of LDs 2a emits a laser beam having a wavelength of 405 nm and has an output of 1 W. According to the present embodiment, a total of ten LDs 2a are provided. Accordingly, a total output of the laser beams is 10 W.

(Details of Light Emitting Section 4)

A material of the light emitting section 4 is identical with that of a headlamp 20 described above. The light emitting section 4 of the present embodiment is different from that of a light emitting section 4 of the headlamp 20 in size. For example, the light emitting section 4 of the present embodiment has (i) a circular cylinder shape (disk shape) whose bottom plane has a circular shape having a diameter of 5 mmΦ and (ii) a thickness of 0.1 mm.

The light emitting section 4 is formed in such a manner that a fluorescent material is solidified through a baking process.

(Details of Parabolic Mirror 5)

The parabolic mirror 5 has an opening section having a shape of a half circle whose radius is 30 mm. The parabolic mirror 5 has a depth of 30 mm. The light emitting section 4 is provided at the focal point of the parabolic mirror 5.

(Details of Metallic Base 7)

The metallic base 7 is a metallic mirror having a surface is coated with silver. On the other surface (back surface) of the metallic mirror 7, a plurality of fins 8 each having a length of 30 mm and a width of 1 mm are provided at intervals of 5 mm. Note that the metallic base 7 and the plurality of fins 8 can be formed integral with each other.

(Effects of Headlamp 50)

According to the headlamp 50, the parabolic mirror 5 is provided so as to cover an upper part of the light emitting section 4. It is therefore possible to increase a ratio of fluorescence whose optical path can be controlled, among the fluorescence emitted from the light emitting section 4. That is, it is possible to control, by use of the parabolic mirror 5, a large part of the fluorescence emitted from the light emitting section 4.

Further, it becomes unnecessary to cause the parabolic mirror 5 to have the opening section through which the laser beams travels. This makes it possible to (i) increase substantially an area of a reflecting surface of the parabolic mirror 5 and therefore (ii) increase an amount of the fluorescence that can be controlled.

[Arrangements of Headlamp 60 etc.]

Figure 12:
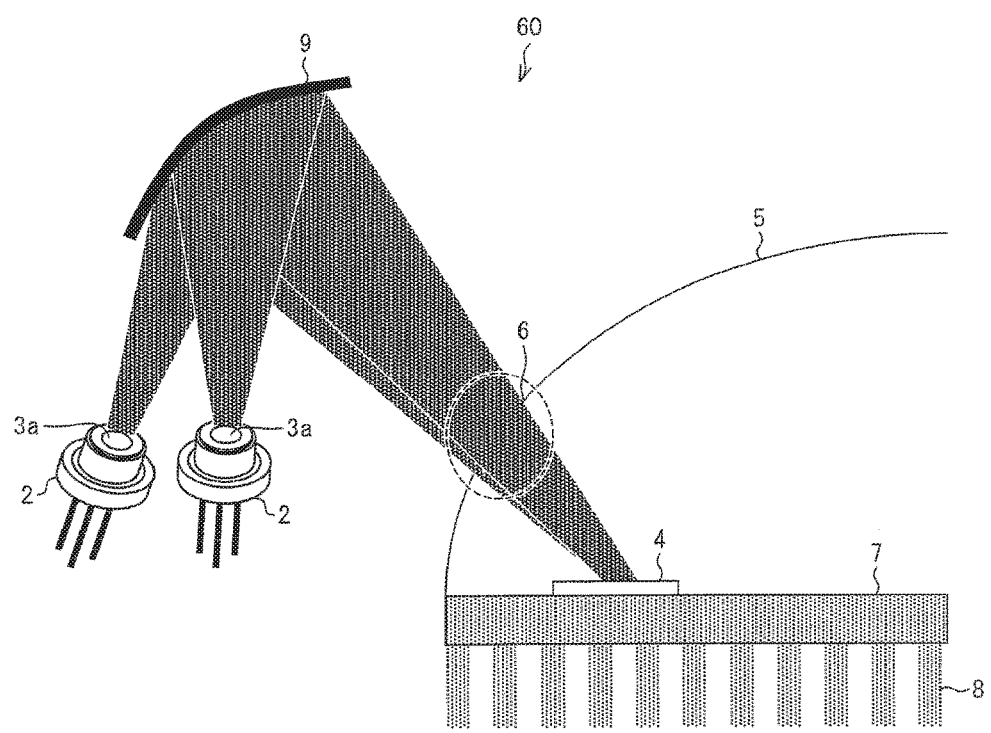
FIG. 12 is a cross-sectional view schematically illustrating an arrangement of a headlamp in accordance with yet further another embodiment of the present invention.

FIG. 12 is a cross-sectional view illustrating a headlamp 60 in accordance with yet still another embodiment of the present invention. The headlamp 60 includes a laser element (excitation light source, semiconductor laser) 2, a beam-forming lens 3a, a light emitting section 4, a parabolic mirror (reflecting mirror) 5, a metallic base (heat conductive member, supporting member) 7, and a plurality of fins (cooling section) 8 (see FIG. 12).

(Laser Element 2)

The laser element 2 is a light emitting element functioning as an excitation light source for emitting excitation light. Instead of providing a single laser element 2, a plurality of laser elements 2 can be provided. In this case, each of the plurality of laser elements 2 emits a laser beam serving as the excitation light. With the arrangement in which the plurality of laser elements 2 are provided, it becomes easy to obtain a high-output laser beam, as compared with the arrangement in which a single laser element 2 is provided.

The laser element 2 may be a single chip having one light-emitting point, or a single chip having a plurality of light emitting points. The laser element 2 emits a laser beam having a wavelength of 405 nm (blue violet) or a wavelength of 450 nm (blue). Note, however, that the wavelength of the laser beam is not limited to these, and can be determined appropriately in accordance with a sort of fluorescent material contained in the light emitting section 4.

Further, instead of the laser element, it is possible to use a light emitting diode (LED) as the excitation light source (light emitting element).

(Beam-Forming Lens 3a)

The beam-forming lens 3a is a lens for forming the laser beam so that the laser beam emitted from the laser element 2 is incident on a concave mirror 9 as a light spot having a circular shape. The beam-forming lens 3a is provided for each of the plurality of laser elements 2.

Generally, a laser beam emitted from a laser element is diffused in a range of a wide angle (an elliptical spot is formed). For this reason, in order to converge the laser beam efficiently by use of the concave mirror 9, it is preferable to control a radiation angle of the laser beam (beam formation). In particular, in a case where the concave mirror 9 is used to converge a plurality of laser beams emitted from the respective plurality of laser elements 2, it is difficult to converge the laser beams on a single point. In this case, it is necessary to limit an irradiation range of the laser beams to a certain degree. For this reason, it is preferable to provide the beam-forming lens 3a.

Note that in a case where a plurality of concave mirrors 9 are provided for the plurality of laser elements 2, respectively, or the concave mirror 9 is designed for a plurality of spots, the beam-forming lens 3a can be omitted.

(Concave Mirror 9)

The concave mirror 9 is a reflecting mirror for (i) converging the laser beam emitted from the laser element 2 and (ii) leading the laser beam thus converged to the light emitting section 4. A reflecting surface of the concave mirror 9 has a concave shape.

In a case where a circular light spot of the laser beam, formed by the beam-forming lens 3a, is incident on the reflecting surface of the concave mirror 9, the laser beam is converged and simultaneously reflected toward the light emitting section 4. That is, the concave mirror 9 has a function of changing an optical path of the laser beam, in addition to the function of converging the laser beam. The concave mirror 9 is thus different from a condenser lens which has only the function of converging the laser beam.

With the use of the beam-forming lens 3a, it becomes easy to converge a plurality of laser beams by use of the concave mirror 9. Note, however, that, in a case where the concave mirror 9 is designed for a plurality of spots (e.g., a shape having distortion), the beam-forming lens 3a can be omitted. For example, the concave mirror 9 can be formed as a mass of a plurality of micro mirrors which correspond to the plurality of pencils of rays, respectively. The plurality of micro mirrors converge, respectively, the plurality of laser beams emitted form the respective plurality of laser element 2.

The concave mirror 9 may be formed in such a manner that a surface of a base member is coated with a metal, which base member is formed by carrying out resin molding. Further, the concave mirror 9 may be made from a metal having a reflecting surface. In a case where the concave mirror 9 is formed by carrying out the resin molding, a concave mirror 9 having a complex shape can be formed easily and economically. Note, however, that the concave mirror 9 having a low reflectance might generate heat due to irradiation of the laser beam. In view of this, it is preferable to cause the concave mirror 9 to have a high reflectance.

Generally, a condenser lens is made of glass in consideration of heat resistance of the condenser lens against the heat generated by the laser beam, and the surface of the condenser lens is subjected to coating. This causes the condenser lens to be relatively expensive.

Further, a positional relationship between the laser element 2, the concave mirror 9, and the light emitting section 4 is not limited to the one illustrated in FIG. 12. It is possible to have such an arrangement that (i) the laser element 2 emits a laser beam from an upper side toward a lower side of FIG. 12 and (ii) the laser beam is reflected from the concave mirror 9 provided on the lower side toward the upper side of FIG. 12 so as to be incident on the light emitting section 4.

(Light-Emitting Section 4)

The light emitting section 4 emits fluorescence by receiving the laser beam which has been emitted from the laser element 2 and then reflected from the concave mirror 9. The light emitting section 4 contains a fluorescent material (fluorescent substance) which emits light when is receives a laser beam. Specifically, the light emitting section 4 can be formed in such a manner that the fluorescent material is dispersed in a sealing material. Alternatively, the light emitting section 4 can be formed in such a manner that the fluorescent material itself is solidified. The light emitting section 4 serves as a wavelength conversion element for converting the laser beam into the fluorescence.

The light emitting section 4 is provided (i) on the metallic base 7 and (ii) substantially at the focal point of the parabolic mirror 5. Accordingly, the fluorescence emitted from the light emitting section 4 is reflected from a reflecting curved surface of the parabola mirror 5 so that an optical path of the fluorescence is controlled. It is possible to form an anti-reflection mechanism on an upper surface of the light emitting section 4.

Note that a position of the light emitting section 4 can be shifted from the focal point of the parabola mirror 5 intentionally so that an illumination range of the illumination light is increased.

Examples of the fluorescent material of the light emitting section 4 encompass an oxynitride fluorescent material (e.g., a sialon fluorescent material) and a III-V compound semiconductor nanoparticle fluorescent material (e.g., indium phosphide: InP). These fluorescent materials have high heat resistance with respect to a high-power (and/or high light density) laser beam emitted from the laser element 2, and are suitably used as a laser illumination light source. Note, however, that the fluorescent material of the light emitting section 4 is not limited to these described above, and may be a nitride fluorescent material or another fluorescent material.

Further, the illumination light of the headlamp must be white light having chromaticity in a predetermined range under the Japanese law. For this reason, the light emitting section 4 contains such a fluorescent material(s) that white illumination light can be obtained.

For example, white light can be generated in such a manner that (i) a blue fluorescent material, a green fluorescent material, and a red fluorescent material are contained in the light emitting section 4 and (ii) the light emitting section 4 is irradiated with a laser beam having a wavelength of 405 nm. Alternatively, white light can be generated in such a manner that (i) a yellow fluorescent material (or a green or red fluorescent material) is contained in the light emitting section 4 and (ii) the light emitting section 4 is irradiated with a laser beam having a wavelength of 450 nm (blue) (or what is called a blue-like laser beam having a peak wavelength in a range of not less than 440 nm but not more than 490 nm).

Examples of the sealing material of the light emitting section 4 encompass a glass material (inorganic glass, organic-inorganic hybrid glass) and a resin material (such as a silicone resin). The glass material may be glass having a low melting point. It is preferable that the sealing material has high transparency. In the case where the high-power laser beam is used, it is preferable that the sealing material has high heat resistance.

(Parabolic Mirror 5)

The parabolic mirror 5 reflects the fluorescence generated by the light emitting section 4, so as to form a pencil of rays (illumination light) which travels within a predetermined solid angle. The parabolic mirror 5 may be (i) a member whose surface is coated with a metallic thin film or (ii) a metallic member.

Figure 13:
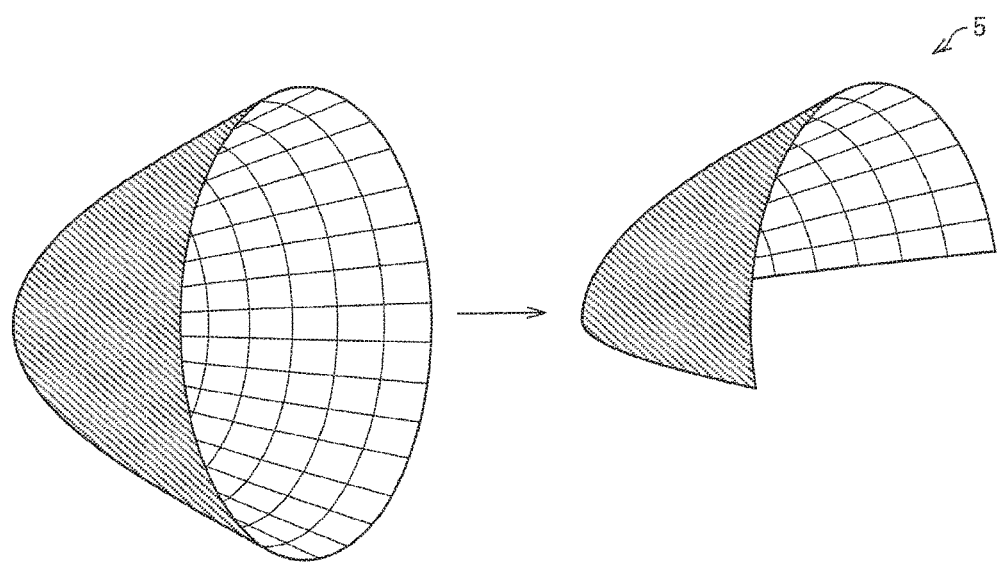
FIG. 13 is a view conceptually illustrating a paraboloid of revolution of a parabolic mirror.
Figure 14:
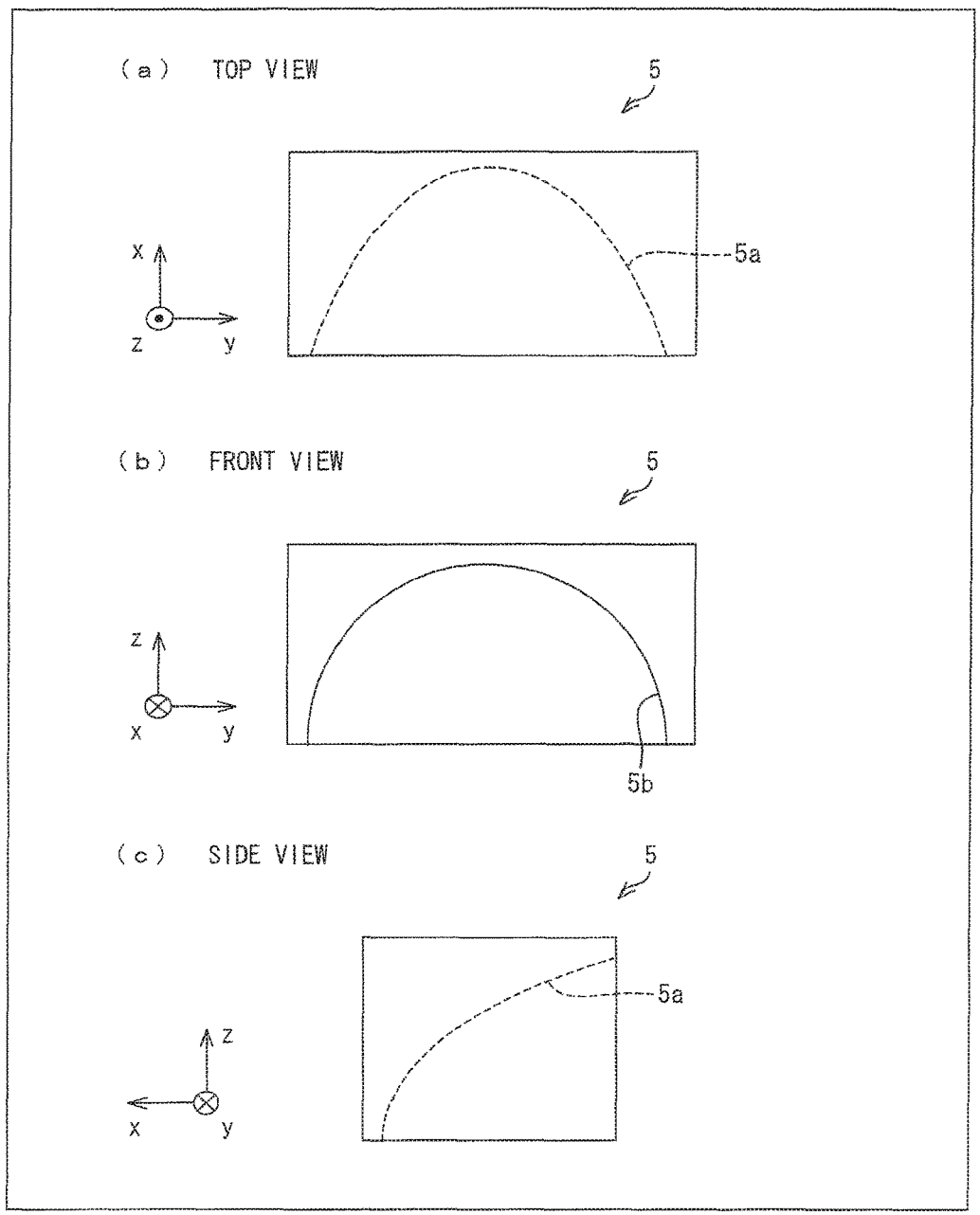
FIG. 14 is a view illustrating a shape of the parabolic mirror: (a) of FIG. 14 illustrates the shape of the parabolic mirror when it is viewed from above, (b) of FIG. 14 illustrates the shape of the parabolic mirror when it is viewed from a front side, and (c) of FIG. 14 illustrates the shape of the parabolic mirror when it is viewed from a lateral side.

FIG. 13 is a view conceptually illustrating a paraboloid of revolution of the parabolic mirror 5. FIG. 14 is a view illustrating a shape of the parabolic mirror 5. (a) of FIG. 14 illustrates the parabolic mirror 5 when it is viewed from above (top view). (b) of FIG. 14 illustrates the parabolic mirror 5 when it is viewed from a front side (front view). (c) of FIG. 14 illustrates the parabolic mirror 5 when it is viewed from a lateral side (side view). For simple explanation, each of (a) through (c) of FIG. 14 illustrates a parabolic mirror 5 that is formed in such a manner that an inside of a rectangular solid member is hollowed out.

The parabolic mirror 5 includes, as the reflecting surface, at least a part of a partial curved surface. The partial curved surface is obtained by cutting a curved surface (parabolic curved surface) which is formed by rotating a parabola around a rotational axis which is a symmetric axis of the parabola, which cutting is carried out along a plane including the rotational axis. The parabolic curved surface is shown as a curved line indicated by a sign 5a in each of (a) through (c) of FIG. 14. Further, an opening section 5b (an exit part through which the illumination light exits) of the parabolic mirror 5 has a shape of a half circle when the parabolic mirror 5 is viewed in a front direction (see (b) of FIG. 14).

The parabolic mirror 5 having such a shape is arranged such that a part of the parabolic mirror 5 is placed above the upper surface of the light emitting section 4, which upper surface has a larger area than that of a side surface of the light-emitting section 4. That is, the parabolic mirror 5 is arranged so as to cover the upper surface of the light emitting section 4. From another point of view, the side surface of the light emitting section 4 partially faces the opening section 5b of the parabolic mirror 5.

With the foregoing positional relationship between the light emitting section 4 and the parabolic mirror 5, it becomes possible to lead efficiently the fluorescence generated by the light emitting section 4 into a narrow solid angle. As a result, it is possible to increase use efficiency of the fluorescence.

Further, both the laser element 2 and the concave mirror 9 are arranged outside the parabolic mirror 5, and the parabolic mirror 5 has the window section 6 which (i) transmits the laser beam reflected from the concave mirror 9 passes or (ii) allows the laser beam to pass through the window section 6. The window section 6 can be an opening section or a section containing a transparent member which transmits the laser beam. For example, the window section 6 may be a transparent plate to which a filter is attached, which filter transmits the laser beam but reflects white light (the fluorescence generated by the light emitting section 4). With the arrangement, it is possible to prevent the fluorescence generated by the light emitting section 4 from leaking from the window section 6.

In a case where a plurality of concave mirrors 9 are provided, a plurality of window sections 6 can be provided for the plurality of concave mirrors 9, respectively.

Note that the parabolic mirror 5 can have a part which is not a part of the parabola. Further, the reflecting mirror of the light emitting device of the present invention can be a parabolic mirror having an opening section which has a closed ring shape or a part of the closed ring shape. Furthermore, the reflecting mirror is not limited to the parabolic mirror, but may be a mirror having an elliptic surface or a mirror having a hemispheric surface. That is, the reflecting mirror can be any mirror provided that it includes, as its reflecting surface, at least a part of a curved surface formed by rotating a figure (ellipse, circle, parabola) around a rotational axis.

(Metallic Base 7)

The metallic base 7 is a plate member for supporting the light emitting section 4, and is made from a metal (e.g., copper or iron). Accordingly, the metallic base 7 has high heat conductivity and can dissipate heat generated by the light emitting section 4 efficiently. Note that the member for supporting the light emitting section 4 is not limited to the member made from a metal, but may be a member containing a material (glass, sapphire, etc.) having high heat conductivity other than a metal. Note that it is preferable that a surface of the metallic base 7, which surface is in contact with the light emitting section 4, functions as a reflecting surface. By arranging the surface to have a reflecting property, it becomes possible to reflect, from such a surface toward the parabolic mirror 5, the fluorescence into which the laser beam entering the upper surface of the light emitting section 4 has been converted. Further, it is possible to reflect, from such a surface toward the inside of the light emitting section 4 again, the laser beam entering the upper surface of the light emitting section 4, so as to convert the laser beam into the fluorescence.

The metallic base 7 is covered with the parabolic mirror 5. That is, the metallic base 7 has a surface facing the reflecting surface (parabolic curved surface) of the parabolic mirror 5. It is preferable that the surface of the metallic base 7, on which surface the light emitting section 4 is to be provided, (i) is substantially parallel to the rotational axis of the paraboloid of revolution of the parabolic mirror 5 and (ii) includes the rotational axis or extends in the vicinity of the rotational axis.

(Fin 8)

The plurality of fins 8 function as a cooling section (heat dissipation mechanism) for cooling the metallic base 7. The plurality of fins 8 has a plurality of heat dissipating plates. Accordingly, a contact area of the plurality of fins 8 with the atmosphere is increased so that heat dissipating efficiency of the plurality of fins 8 is increased. The cooling section for cooling the metallic base 7 only has to have a cooling (heat dissipation) function, and may be a heat pipe, water-cooling system, an air-cooling system, or the like (later described).

<Shape of Light Emitting Section 4>

(Thickness of Light Emitting Section 4)

Figure 15:
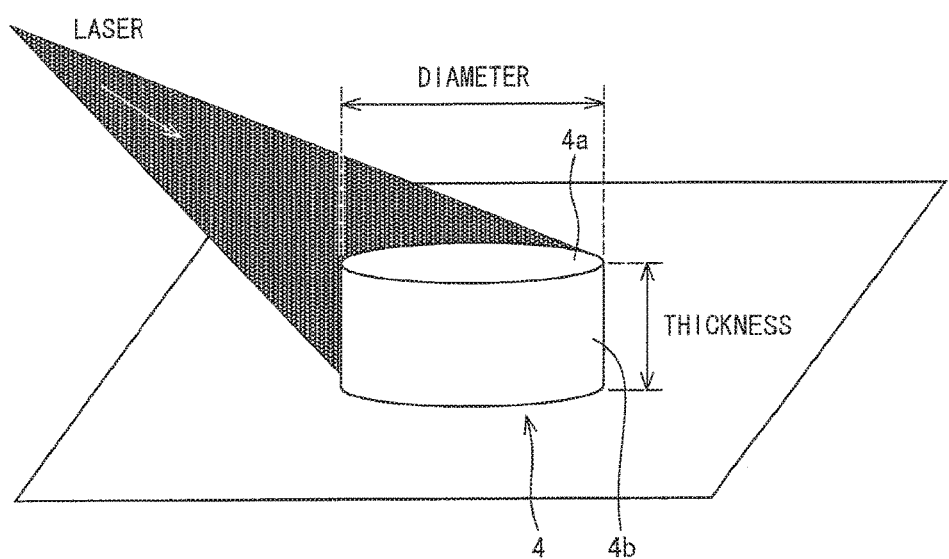
FIG. 15 is a view illustrating a state where a light emitting section is irradiated with a laser beam.

FIG. 15 is a view illustrating a state where the light-emitting section 4 is irradiated with the laser beam. FIG. 15 illustrates the light emitting section 4 having a circular cylinder shape. The light emitting section 4 has an upper surface 4a via which the laser beam is mainly received. A distance between the upper surface 4a and a bottom surface of the light-emitting section 4, which bottom surface faces the upper surface 4a, is a thickness of the light emitting section 4. It is preferable that the light emitting section 4 has a small thickness. In other words, it is preferable that an area of a side surface 4b of the light emitting section 4 is small. The description that "the light emitting section has a small thickness" means such a shape of the light emitting section 4 that the side surface 4b is sufficiently less than the upper surface in area and therefore a large part of the fluorescence is emitted toward above (i.e., emitted via the upper surface). The following description deals with the reason why it is preferable that the light emitting section 4 has a small thickness.

Figure 16:
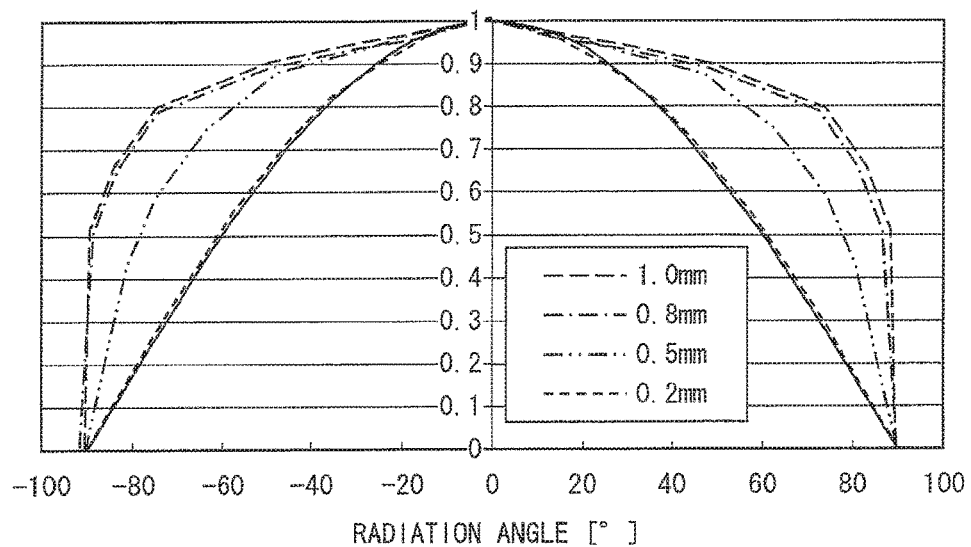
FIG. 16 is a graph showing a relationship between a thickness of a light emitting section and an optical radiation property.

FIG. 16 is a graph showing a relationship between the thickness of the light emitting section 4 having a diameter of 2 mm and an optical emission property of the light emitting section 4. As shown in FIG. 16, in the case where the light emitting section 4 has a small thickness (e.g., a thickness of 0.2 mm), the side surface 4b has a small area, and a large part of the fluorescence is emitted toward above. In this case, almost no fluorescence is emitted in a direction inclined at 90° ($\theta=\pm90°$) with respect to a line vertical to the upper surface 4a of the light emitting section 4. Distribution of the fluorescence thus becomes identical with Lambertian distribution (distribution of cosine $\theta$ indicated by a full line in the graph of FIG. 16).

On the other hand, in the case where the light emitting section 4 has a large thickness (e.g., a thickness of 1.0 mm), there is the fluorescence emitted in the direction inclined at 90° ($\theta=\pm90°$) with respect to the line vertical to the upper surface 4a of the light emitting section 4. In this case, the distribution of the fluorescence is not identical with the Lambertian distribution. That is, there is an increase in ratio of the fluorescence emitted from the side surface 4b of the light emitting section 4.

Figure 19:
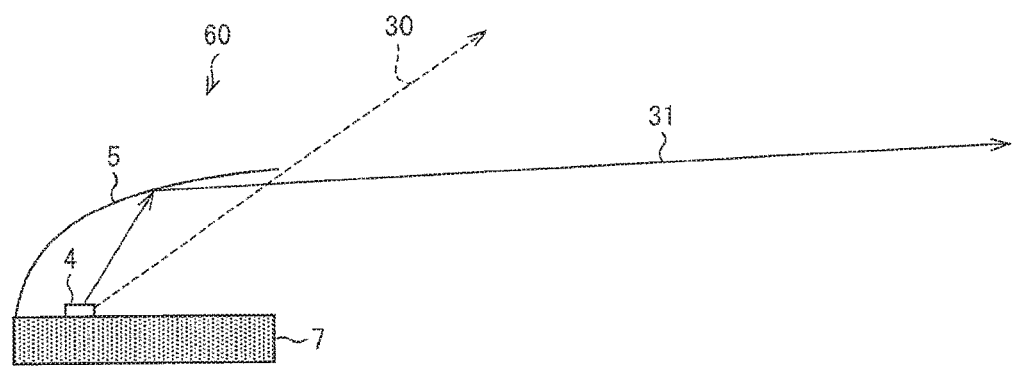
FIG. 19 is an explanatory view illustrating a principle of the light projection property of the parabolic mirror.

A part of the fluorescence emitted from the side surface 4b of the light emitting section 4 is not incident on the parabolic mirror 5 but is emitted via the opening section 5b of the parabolic mirror 5 so as to be dispersed in the atmosphere (see FIG. 19). Therefore, in a case where the ratio of the fluorescence emitted via the side surface 4b of the light emitting section 4 is increased, (i) an amount of the fluorescence that cannot be controlled by the parabolic mirror 5 is increased and therefore (ii) use efficiency of the fluorescence (and also use efficiency of the laser beam) is reduced.

Accordingly, by designing the light emitting section 4 to have a small thickness, it becomes possible to (i) reduce a ratio of fluorescence that cannot be controlled by the parabolic mirror 5, among the fluorescence generated by the light emitting section 4, and therefore (ii) increase use efficiency of the fluorescence generated by the light emitting section 4.

As shown in FIG. 16, the distribution of the fluorescence becomes identical with the Lambertian distribution when the thickness of the light emitting section becomes not more than 0.2 mm under such a condition that (i) the diameter of the light emitting section 4 is set to be 2 mm and (ii) the thickness of the light emitting section 4 is decreased from 1.0 mm to 0.2 mm in stages.

For this reason, it is preferable to set the thickness of the light emitting section 4 to be not more than one-tenth of a maximum width of the light emitting section 4, which maximum width is the longest width among widths obtained when the light emitting section 4 is viewed in a direction vertical to a thickness direction of the light emitting section 4 (viewed from a lateral side). In a case where the light emitting section 4 has a circular cylinder shape, the maximum width is equal to the diameter of the bottom plane of light emitting section 4. In a case where the light emitting section 4 has a rectangular solid shape, the maximum width is equal to a length of a diagonal line of the upper surface (rectangle) of the light emitting section 4.

Note that in a case where the light emitting section 4 has a significantly small thickness, an amount of the illumination light thus obtained might be insufficient. In order to avoid such a state, the lower limit of the thickness of the light emitting section 4 is set to be equal to the lowest value of the thickness with which a desired amount of illumination light can be obtained. As an extreme instance, the lower limit of the thickness of the light emitting section 4 is a thickness of at least one fluorescent layer, e.g., 10 µm. Further, the upper limit (absolute value) of the thickness of the light emitting section 4 is preferably set in consideration of the heat dissipation efficiency of the light emitting section 4. This is because, in a case where the light emitting section 4 has a greater thickness, the heat dissipation efficiency of the light emitting section 4 becomes less on a side opposite to a side that is in contact with the metallic base 7.

(Area of Laser Beam Irradiated Surface of Light Emitting Section 4)

In order to cause the distribution of the fluorescence generated by the light emitting section 4 to be identical with the Lambertian distribution, it is possible to cause the area of the light spot of the laser beam on the laser beam irradiated surface (the upper surface 4a or the bottom surface) of the light emitting section 4 to be less than that of the laser beam irradiated surface, instead of causing the light emitting section 4 to be less in thickness. That is, it is possible to cause the distribution of the fluorescence generated by the light emitting section 4 to be identical with the Lambertian distribution by exciting, with the laser beam, a part (a part in the vicinity of a center of the light emitting section 4) of the light emitting section 4.

Figure 17:
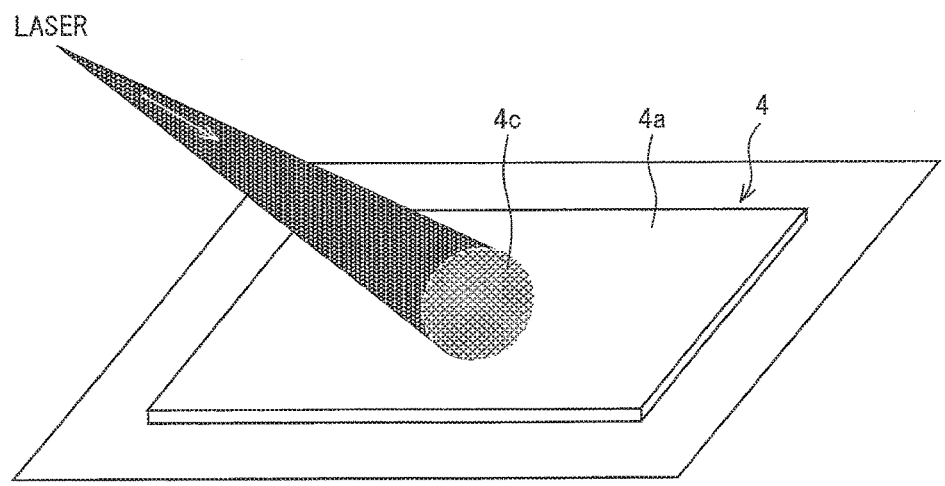
FIG. 17 is a view illustrating a state where an upper surface of a light emitting section is irradiated with a laser beam.

FIG. 17 is a view illustrating a spot 4c of the laser beam with which the upper surface 4a of the light emitting section 4 is irradiated. The upper surface 4a of the light emitting section 4 has a larger area than that of the spot 4c of the laser beam (see FIG. 17). With the arrangement, the distribution of the fluorescence generated by the light emitting section becomes identical with the Lambertian distribution, irrespective of the thickness of the light emitting section 4. It is considered that this is because the fluorescence traveling toward the side surface of the light emitting section 4 is diffused inside the light-emitting section 4 and consequently emitted via the side surface of the light emitting section 4.

A ratio of the area of the spot of the laser beam to the area of the laser beam irradiated surface should be reduced to such a degree that the laser beam would not leak from the side surface of the light emitting section 4. Note that there is no upper limit for the area of the laser beam irradiated surface.

<Light Projection Property of Parabolic Mirror 5>

Figure 18:
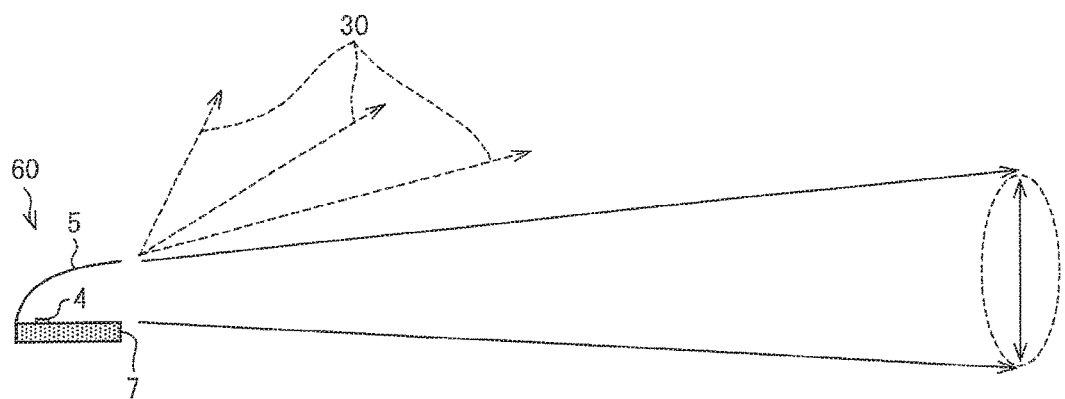
FIG. 18 is a view conceptually illustrating a light projection property of the parabolic mirror.

FIG. 18 is a view conceptually illustrating a light projection property of the parabolic mirror 5. The inventors of the present invention have found that, in a case where the headlamp 60 is provided so that the metallic base 7 faces downward, most of the fluorescence (indicated by a sign 30) that cannot be controlled by the parabolic mirror 5 is not emitted in a downward direction with respect to the parabolic mirror 5 but in an upward direction with respect to the parabolic mirror 5 (see FIG. 18).

FIG. 19 is an explanatory view for illustrating a principle of the light projection property of the parabolic mirror 5. As illustrated in FIG. 19, the fluorescence (indicated by a sign 31) emitted via the upper surface of the light emitting section 4 is reflected from the parabolic mirror 5, and then is emitted forward within a narrow solid angle.

On the other hand, a part of the fluorescence (indicated by the sign 30) emitted via the side surface of the light emitting section 4 is not incident on the parabolic mirror 5, and travels obliquely in an upward direction out of the predetermined solid angle. Further, the fluorescence emitted from the side surface of the light emitting section 4 in parallel with the surface of the metallic base 7 travels forward as parallel light. Accordingly, most of the fluorescence that cannot be controlled by the parabolic mirror 5 is not emitted in the downward direction with respect to the headlamp 60. By taking advantage of this light projection property, it is possible to lead the fluorescence that cannot be controlled by the parabolic mirror 5 to the parabolic mirror 5 side of the headlamp 60.

<How to Arrange Headlamp 60>

Figure 20:
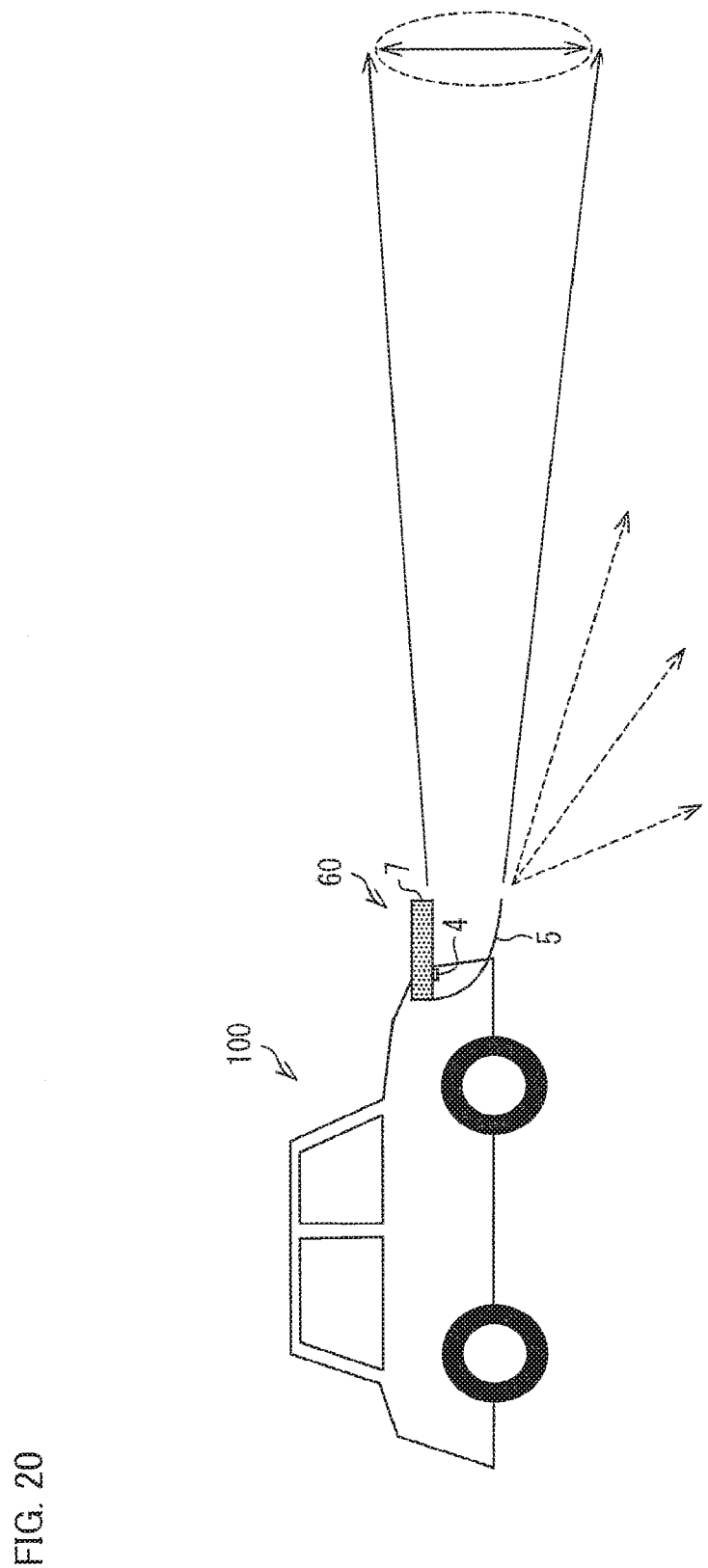
FIG. 20 is a view conceptually illustrating how a headlamp is attached to an automobile.

FIG. 20 is a view conceptually illustrating how to arrange (orientation) the headlamp 60 as a headlamp of an automobile (vehicle) 10. The headlamp 60 can be attached to a head of the automobile 100 so that the parabolic mirror 5 is positioned on a lower side in a vertical direction (see FIG. 20). According to the arrangement, the automobile 100 can emit light having sufficient brightness in a front direction and also in a forward-downward direction by taking advantage of the light projection property of the parabolic mirror 5.

As described above, a vehicle of the present invention includes a vehicle headlamp. The vehicle headlamp includes an excitation light source for emitting excitation light, a concave mirror for converging the excitation light emitted from the excitation light source, a light emitting section for generating fluorescence by receiving the excitation light converged by the concave mirror, a reflecting mirror having a reflecting curved surface for reflecting the fluorescence generated by the light emitting section, and a supporting member having a surface facing the reflecting curved surface and supporting the light emitting section. The vehicle headlamp is attached to the vehicle so that the reflecting curved surface is positioned on a lower side in the vertical direction.

Note that the headlamp 60 can be employed as a high-beam headlamp (driving-beam headlamp) of a vehicle or a low-beam headlamp (passing-beam headlamp) of a vehicle.

<Examples of Application of Present Invention>

A light emitting device of the present invention is applicable to not only a vehicle headlamp but also other illumination devices. As an example, an illumination device of the present invention can be applied to a downlight. The downlight is an illumination device attached to a ceiling of a structure such as a house or a vehicle. Other than such a downlight, the illumination device of the present invention can be achieved as a headlamp of a moving object (e.g., a human, a ship, an airplane, a submersible, or a rocket) other than a vehicle. Further, the illumination device of the present invention can be achieved as a searchlight, a projector, or an indoor illumination device (such as a stand light lamp) other than the downlight.

EXAMPLES

The following description deals with concrete examples of the present invention with reference to FIGS. 21 through 25. Note that members which are identical with members described in the foregoing embodiments have the same signs as those of the members described in the foregoing embodiments, and explanations of these are omitted here for the sake of simple explanation. Further, materials, shapes, and various values described below are merely examples, and the present invention is not limited to these.

Example 1

Figure 21:
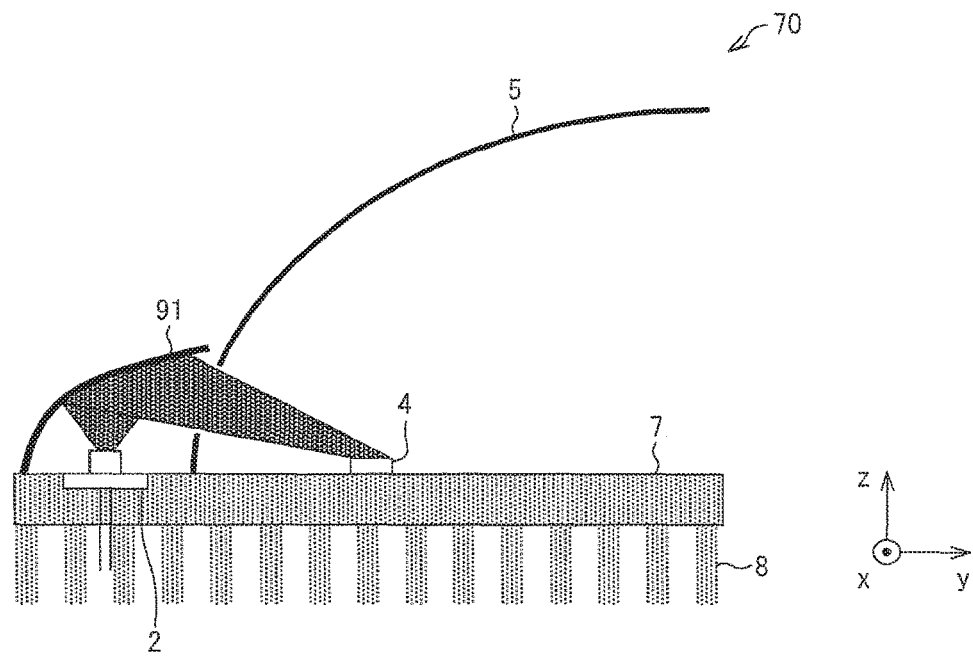
FIG. 21 is a view conceptually illustrating an arrangement of a headlamp in accordance with one example of the present invention.

FIG. 21 is a view schematically illustrating a headlamp 70 in accordance with one example of the present invention. The headlamp 70 includes a plurality of laser elements 2, a concave mirror 91, a light emitting section 4, a parabolic mirror 5, a metallic base 7 and a plurality of fins 8 (see FIG. 21).

(Concave Mirror 91)

Figure 22:
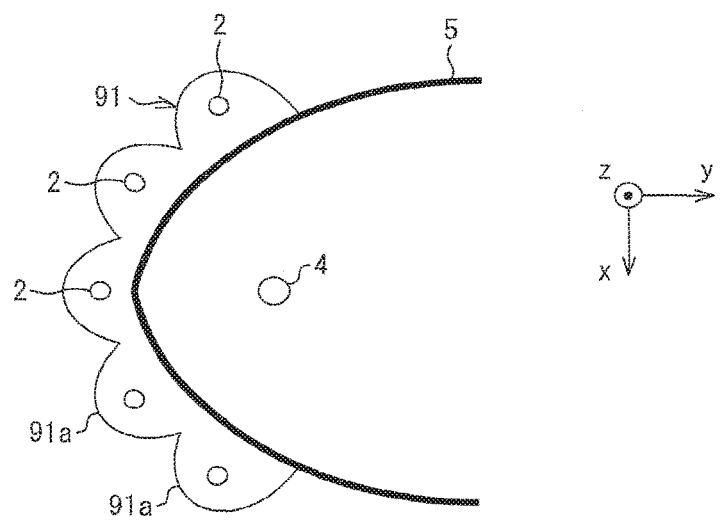
FIG. 22 is a top view illustrating the arrangement of the headlamp.

The concave mirror 91 is a mass of a plurality of concave mirrors 91a. Each of the plurality of concave mirrors 91a is formed in such a manner that a concave surface made from a resin is coated with aluminum. FIG. 22 is a top view illustrating a structure of the concave mirror 91.

The plurality of concave mirrors 91a are arranged along an outer edge of the parabolic mirror 5 in the vicinity of an apex of the parabolic mirror 5 (see FIG. 22). The plurality of laser elements 2 are provided in the plurality of concave mirrors 91a, respectively, and laser beams emitted from the respective plurality of laser elements 2 are converged by and reflected from the plurality of concave mirrors 91a which cover the respective plurality of laser elements 2. The laser beams emitted from the respective plurality of laser elements are thus led toward the light emitting section 4 and are incident on the light emitting section 4.

The plurality of concave mirrors 91a are connected to each other integrally, so as to constitute the concave mirror 91. With the arrangement in which the plurality of concave mirrors 91a are formed integral with each other, it becomes possible to form the concave mirror 91 by carrying out resin molding only once. This makes it easy to (i) manufacture the concave mirror 91 and (ii) align the plurality of concave mirrors 91a, as compared with a case where each of the plurality of concave mirrors is arranged independently in accordance with a positional relationship between them.

It is also possible to provide each of the plurality of concave mirrors separately and independently. In this case, however, in order to cause the headlamp to have a compact body, it is preferable to eliminate unnecessary gaps between the plurality of concave mirrors.

The concave mirror 91 illustrated in FIG. 22 has five concave mirrors 91a. Note, however, that the number of the concave mirrors 91a is not limited to five. The number of the concave mirrors 91a of the concave mirror 91 should be set appropriately to have a desired laser output.

Further, each of the plurality of laser elements 2 emits its laser beam within a range of a predetermined angle (in an upward direction in FIG. 21). Therefore, it is unnecessary to cover lateral sides (in a direction vertical to the optical axis of the laser beam) of each of the plurality of laser elements 2 with a corresponding one of the concave mirrors 91a. Each of the plurality of concave mirrors 91a only has to be provided so that the reflecting surface of concave mirror 91a is positioned on the optical path of a corresponding one of the plurality of laser beams.

(Details of Laser Element 2)

Each of the plurality of laser elements 2 emits a laser beam having a wavelength of 405 nm, and has an output of 1 W. According to the present example, a total of five laser elements 2 are provided inside the plurality of concave mirrors 91a, respectively. Accordingly, a total output of the laser beams is 5 W. The laser beams emitted from the respective five laser elements 2 are not incident on a condenser lens but directly on the concave mirror 91.

The five laser elements 2 are provided on the metallic base 7. The metallic base 7 has heat conductivity, so as to dissipate effectively heat generated by the five laser elements 2. On the metallic base 7, the light emitting section 4 is also provided. It is therefore possible to cause the heat dissipation mechanism to be shared by the laser element 2 and the light emitting section 4.

(Details of Light Emitting Section 4)

The light emitting section 4 contains three sorts of fluorescent material (RGB) so as to emit white light. Specifically, the red fluorescent material is CaAlSiN3: Eu, the green fluorescent material is β-SiAlON: Eu, and the blue fluorescent material is (BaSr) MgAl10O17: Eu. Particles of these fluorescent materials are solidified through a baking process.

The light emitting section 4 has a disk shape having a diameter of 2 mm and a thickness of 0.1 mm.

(Details of Parabolic Mirror 5)

The parabolic mirror 5 has an opening section 5b having a shape of a half circle whose radius is 25 mm. The parabolic mirror 5 has a depth of 45 mm. The light emitting section 4 is provided at a focal point of the parabolic mirror 5.

The parabolic mirror 5 has a plurality of window sections 6 corresponding to the plurality of pencils of rays, respectively, which are emitted from the respective laser elements 2 and then are converged by and reflected from the concave mirror 91.

The positions of the plurality of window sections 6 (the irradiation angles of the laser beams are substantially defined by these positions) are not particularly limited. Note, however, that it is preferable to determine the positions of the plurality of window sections 6 so that (i) reflecting efficiency of the parabola mirror 5 would not be reduced and (ii), among the laser beams thus emitted, an amount of a laser beam reflected from a surface of the light emitting section 4 would not be increased.

(Details of Metallic Base 7)

The metallic base 7 is made from copper. Aluminum is vapor-deposited on a surface of the metallic base 7, on which surface the light emitting section 4 is to be provided. On the other surface (the back surface), a plurality of fins 8 each having a length of 30 mm and a width of 1 mm are provided at intervals of 5 mm. Note that the metallic base 7 and the plurality of fins 8 can be formed integral with each other.

(Effects of Headlamp 70)

According to the headlamp 70, the concave mirror 91 converges the plurality of laser beams emitted from the respective plurality of laser elements 2, and reflects the plurality of laser beams toward the light emitting section 4. Therefore, it is possible to increase flexibility in designing the optical paths of the plurality of laser beams. As a result, it becomes possible to have a reduction in size of the headlamp 70.

Further, according to the headlamp 70, the light emitting section 4 has a small thickness, and the upper surface of the light emitting section 4 faces the reflecting curved surface of the parabolic mirror 5. It is therefore possible to control, by use of the parabolic mirror 5, a large part of the fluorescence emitted from the light emitting section 4. As a result, it is possible to (i) reduce in an amount of fluorescence that cannot be controlled by the parabolic mirror 5, among the fluorescence emitted from the light emitting section 4, and therefore (ii) increase use efficiency of the fluorescence emitted from the light emitting section 4.

Example 2

Figure 23:
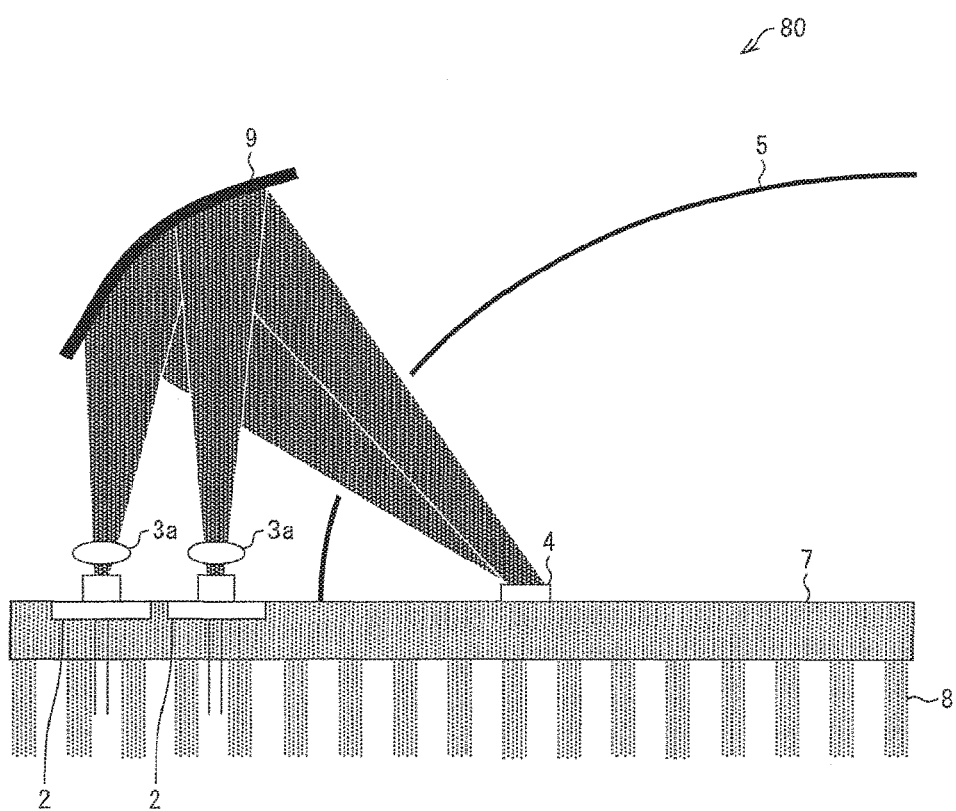
FIG. 23 is a view schematically illustrating an arrangement of a headlamp in accordance with another example of the present invention.

FIG. 23 is a view schematically illustrating a headlamp 80 in accordance with another example of the present invention. The headlamp 80 includes (i) a plurality of sets each being constituted by a laser element 2 and a beam forming lens 3a, (ii) a concave mirror 9, (iii) a light emitting section 4, (iv) a parabolic mirror 5, (v) a metallic base 7, and (vi) a plurality of fins 8 (see FIG. 23).

The main differences between the headlamp 80 of the present example and a headlamp 70 of Example 1 are the following two points: (i), according to the headlamp 80, a plurality of laser beams are converged by use of a single concave mirror, and (ii), according to the headlamp 80, a plurality of beam forming lens 3a are provided for a plurality of laser elements 2, respectively. In the same manner as in Example 1, the concave mirror 9 is formed in such a manner that a concave surface made from a resin is coated with aluminum.

(Details of Laser Element 2)

Each of the plurality of laser elements 2 emits a laser beam having a wavelength of 450 nm and has an output of 1 W. According to the present example, a total of eight laser elements 2 are provided. Accordingly, a total output of the laser beams is 8 W. The eight laser elements 2 are arranged in two lines (each including four laser elements 2) in the vicinity of an apex of the parabolic mirror 5. Note that only two laser elements 2 are shown in FIG. 23 because FIG. 23 is a view illustrating the headlamp 80 when it is viewed laterally.

How to arrange the plurality of laser elements 2 is not limited to the arrangement described above. For example, it is possible to arrange the plurality of laser elements 2 in three lines (one line constituted by three laser elements and two lines each constituted by two laser elements. In this case, a total of seven laser elements 2 are arranged. Note that it is preferable to arrange the plurality of laser elements 2 at certain intervals so that the plurality of laser elements 2 would not interfere with each other thermally.

The laser beam emitted from each of the plurality of laser elements 2 is incident on a corresponding one of the plurality of beam forming lenses 3a so that a spot of the laser beam has a circle shape on the concave mirror 9. The formed laser beam is incident on the reflecting surface of the concave mirror 9. As a result, an irradiation range of the laser beam is limited by the concave mirror 9 so that the entire light emitting section 4 is irradiated with the laser beam.

Then, the laser beam is incident on the upper surface of the light emitting section 4 at an angle of 45° with respect to the upper surface. Accordingly, it is possible to have a reduction in amount of a laser beam reflected from the surface of the light emitting section 4, among the laser beams incident on the light emitting section 4.

(Details of Light Emitting Section 4)

The light emitting section 4 contains one sort of fluorescent material, i.e., a yellow fluorescent material. The yellow fluorescent material may be, for example, $(Y_{1-x-y}Gd_xCe_y)_3Al_5O_{12}$ ($0.1 \leq x \leq 0.55$, $0.01 \leq y \leq 0.4$).

Particles of such a yellow fluorescent material are solidified through a baking process.

The light emitting section 4 has a disk shape having a diameter of 2 mm and a thickness of 0.2 mm, for example.

(Details of Parabolic Mirror 5)

The parabolic mirror 5 has an opening section 5b having a shape of a half circle whose radius is 30 mm. The parabolic mirror 5 has a depth of 30 mm. The light emitting section 4 is arranged at a focal point of the parabolic mirror 5 (a position 7.5 mm away from the apex of the parabolic mirror 5).

The number of the window sections 6 is not particularly limited. It is possible to provide a plurality of window sections 6 for a plurality of pencils of rays reflected from the concave mirror 9, respectively. Alternatively, it is possible to provide a single wide window section 6 in a case where the plurality of pencils of rays are close to each other.

Example 3

Figure 24:
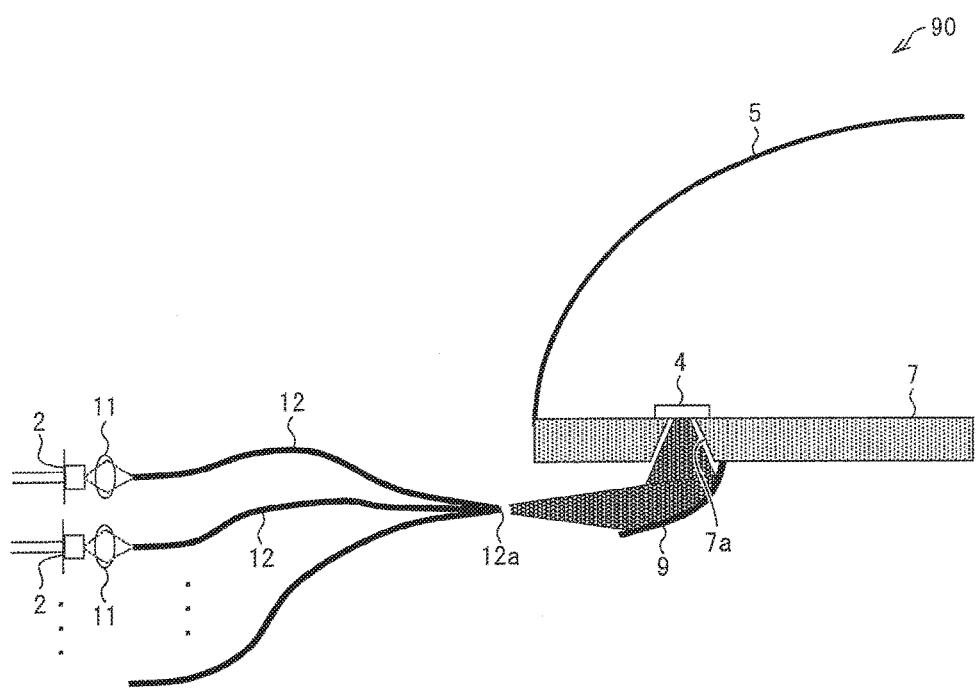
FIG. 24 is a view schematically illustrating an arrangement of a headlamp in accordance with further another example of the present invention.

FIG. 24 is a view schematically illustrating a headlamp 90 in accordance with still another example of the present invention. The headlamp 90 includes (i) a plurality of sets each being constituted by a laser element 2 and a condenser lens 11, (ii) a plurality of optical fibers 12, (iii) a concave mirror 9, (iv) a light emitting section 4, (v) a parabolic mirror 5, and (iv) a metallic base 7 (see FIG. 24).

Each of the plurality of condenser lenses 11 is a lens for leading a laser beam emitted from a corresponding one of the plurality of laser elements 2 to be incident on an incident end part of a corresponding one of the plurality of optical fibers 12, which incident end part is one of ends of the corresponding one of the plurality of optical fibers 12. The plurality of sets each being constituted by the laser element 2 and the condenser lens 11 correspond to the plurality of optical fibers 12, respectively. That is, the plurality of laser elements 2 are optically coupled with the plurality of optical fibers 12, respectively, via the respective plurality of condenser lenses 11.

Each of the plurality of optical fibers 12 is a member for leading, toward the concave mirror 9, the laser beam emitted from a corresponding one of the plurality of laser elements 2. Each of the plurality of optical fibers 12 has a two-layer structure in which a center core is covered with a clad that has a lower refractive index than that of the center core. The laser beam incident on the incident end part of the corresponding one of the plurality of optical fibers 12 travels through the optical fiber 12, and exits from an exit end part (the other end) 12a of the optical fiber 12. The exit end parts 12a of the plurality of optical fibers 12 are bound up with a ferrule or the like.

The laser beams emitted from the exit end parts 12a of the respective plurality of optical fibers 12 are converged by and reflected from the concave mirror 9 so that the optical paths of the laser beams are changed. Then, the laser beams travel through an opening section 7a of the metallic base 7 so as to be incident on the light emitting section 4.

As described above, according to the headlamp 90, the metallic base 7 has the opening section 7a, and a bottom surface of the light emitting section 4 is irradiated with the laser beams via the opening section 7a.

Therefore, it becomes unnecessary to the parabolic mirror 5 to have the window section 6. This makes it possible to (i) have an increase in area of the reflecting surface of the parabolic mirror 5 substantially, and therefore (ii) have an increase in amount of the fluorescence that can be controlled.

Note that a material of the metallic base 7 is identical with the material described in Example 1. Further, the light emitting section 4 can be larger in area than a cross-section of the opening section 7a of the metallic base 7 so as to cover the opening section 4. Alternatively, the light emitting section 4 can be substantially the same in area as the cross-section of the opening section 7a so as to be fitted to the opening section 7a.

(Details of Laser Element 2)

Each of the plurality of laser elements 2 emits a laser beam having a wavelength of 405 nm, and has an output of 1 W. According to the present example, a total of ten laser elements 2 are provided. Accordingly, a total output of the laser beams is 10 W.

Note that the number of laser elements 2 is not limited to ten. It is possible to provide a single laser element 2. Alternatively, it is possible to provide a plurality of laser elements 2 so that the laser beams emitted from the respective plurality of laser elements 2 are not incident on the plurality of optical fibers 12 but on the concave mirror 9 via a respective plurality of beam forming lenses 3a. Further, it is also possible to provide a lens in the vicinity of the exit end part 12a of each of the plurality of optical fibers 12 so as to control a shape of and a size of a spot of the laser beam exiting from the exit end part.

(Details of Light Emitting Section 4)

In the same manner as Example 1, the light emitting section 4 has an arrangement in which three sorts of fluorescent material are uniformly mixed with each other in a resin and a resultant is applied. The light emitting section 4 has a disk shape having a diameter of 5 mm and a thickness of 0.1 mm. The laser beams are incident on the light emitting section 4 as a circular spot having a diameter of 2 mm. The circular spot of the laser beams is incident on (i) substantially a focal point of the parabolic mirror 5 and simultaneously (ii) substantially a center of the upper surface 4a of the light emitting section 4.

As described above, the upper surface 4a of the light emitting section 4 is larger in area than the spot of the laser beam so that most of the fluorescence would not exit from a side surface of the light emitting section 4. It is therefore possible to (i) reduce an amount of fluorescence that cannot be controlled by the parabolic mirror 5, among the fluorescence emitted from the light emitting section 4 and therefore (ii) increase use efficiency of the fluorescence.

(Details of Concave Mirror 9)

The concave mirror 9 is a metallic mirror whose surface is coated with silver.

(Details of Parabolic Mirror 5)

The parabolic mirror 5 has an opening section 5b having a shape of a half circle whose radius is 30 mm. The parabolic mirror 5 has a depth of 30 mm. The light emitting section 4 is provided substantially at the focal point of the parabolic mirror 5.

Example 4

Figure 25:
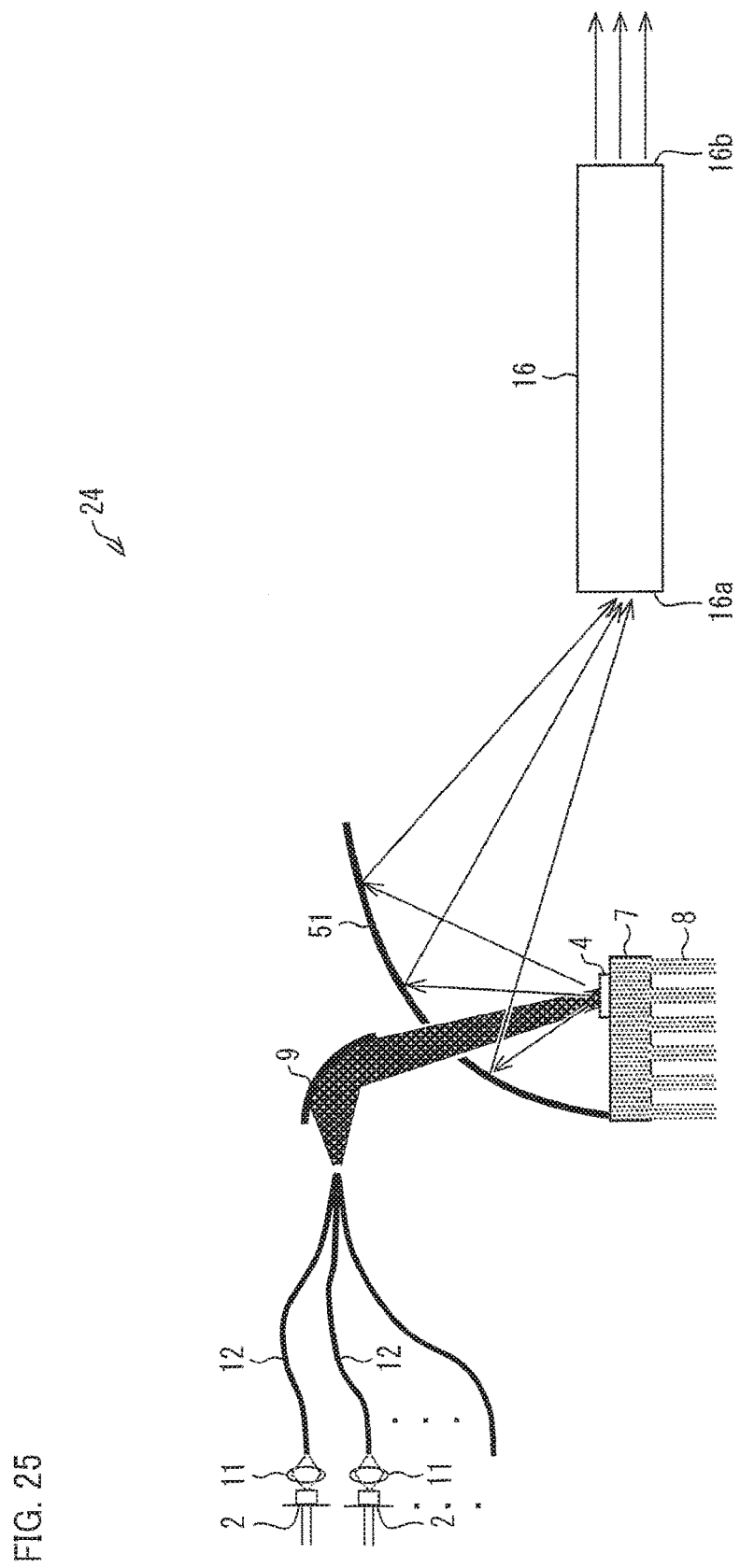
FIG. 25 is a view schematically illustrating an arrangement of an illumination device in accordance with one example of the present invention.

FIG. 25 is a view schematically illustrating a light source 24 in accordance with one example of the present invention. The light source 24 includes (i) a plurality of sets each being constituted by a laser element 2 and a condenser lens 11, (ii) a plurality of optical fibers 12, (iii) a concave mirror 9, (iv) a light emitting section 4, (v) an elliptic mirror 51, (vi) a metallic base 7, (vii) a plurality of fins 8, and (viii) a rod lens 16.

The main difference between the present example and Example 1 is the following point: instead of a parabolic mirror, the light source 24 of the present example includes an elliptic mirror (ellipsoidal mirror) as its reflecting mirror. The light emitting section 4 is provided at a first focal point of the elliptic mirror 51. Fluorescence reflected from the elliptic mirror 51 is incident on an incident surface 16a which is formed at one of ends of the rod lens 16. The fluorescence travels through the rod lens 16, and then exits from an exit surface 16b (the other one of ends) of the rod lens 16. The incident surface 16a is provided at a second focal point of the elliptic mirror 51.

The rod lens 16 functions as an optical indirector. The rod lens 16 causes angular components of the pencils of rays to be mixed with each other, so as to reduce non-uniformity in illumination intensity, color heterogeneity, and generation of flickering. The rod lens 16 may have a circular cylinder shape or a rectangular column shape. The shape of the rod lens 16 can be determined in accordance with a desired shape of a spot of the illumination light.

The arrangement employing the rod lens 16 is suitable for a light source in an illumination system for a projector.

With the arrangement employing the elliptic mirror 51, it is also possible to increase flexibility in designing the light source in such a manner that (i) the laser beams are converged by and reflected from the concave mirror 9 and therefore (ii) the optical paths of the laser beams are changed.

Example 5

Figure 26:
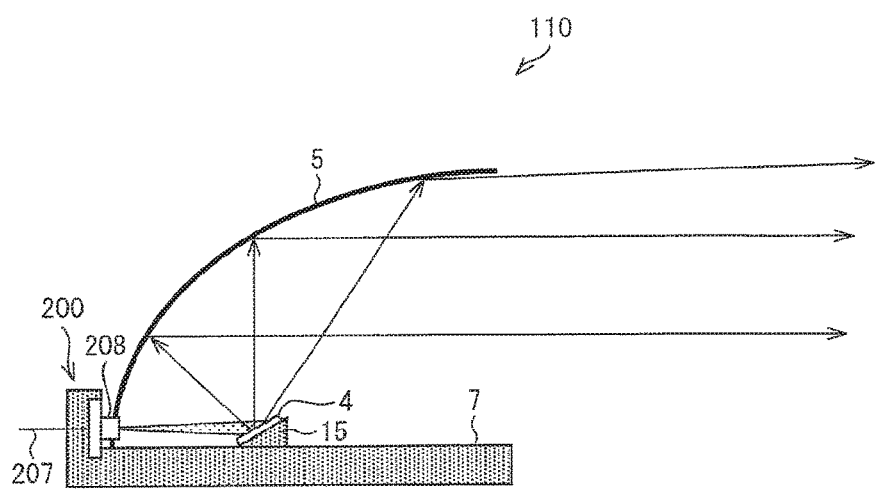
FIG. 26 is a view schematically illustrating an arrangement of a headlamp in accordance with still another example of the present invention.

FIG. 26 is a view schematically illustrating an arrangement of a headlamp (light emitting device) 110 in accordance with yet another example of the present invention. The headlamp 110 includes a laser element 200 as an excitation light source. A concave mirror provided inside the laser element 200 corresponds to a concave mirror 9 described in the foregoing Examples.

(Arrangement of Headlamp 110)

The headlamp 110 includes the laser element (excitation light source) 200, a light emitting section 4, a parabolic mirror 5, a metallic base 7, and an inclined section 15 (see FIG. 26). A laser beam emitted from the laser element 200 is incident on the light emitting section 4 so as to generate fluorescence. The fluorescence thus generated is reflected from the parabolic mirror 5 so that an optical path of the fluorescence is changed. As a result, the fluorescence is emitted toward the outside as illumination light.

The laser element 200 has a laser beam exit window 209 (see FIG. 27) via which the laser beam exits toward the outside of the laser element 200. The laser beam exit window 209 is inserted into an opening section of the parabolic mirror 5. The laser beam emitted from the laser element 200 via the laser beam exit window 209 is not incident on any optical members but is directly incident on the light emitting section 4.

Specifically, the parabolic mirror 5 has the opening section in the vicinity of a bottom surface (a connection section between the parabolic mirror 5 and the metallic base 7 in FIG. 26) of the parabola mirror 5. An optical axis of the laser beam emitted from the laser element 200 is substantially parallel to a surface (a surface facing a reflecting curved surface of the parabolic mirror 5) of the metallic base 7.

Accordingly, in a case where a thin light emitting section 4 is provided on the surface of the metallic base 7, the laser beam cannot be efficiently incident on the light emitting section 4. In view of the problem, the light emitting section 4 of the headlamp 110 is held by the inclined section 15 at a predetermined angle (more than 0°, e.g., 45°) with respect to the optical axis of the laser beam emitted from the laser element 200. With the arrangement, it is possible to irradiate the light emitting section 4 with the laser beam efficiently.

That is, the inclined section 15 functions as an angle maintaining section for maintaining the surface of the light emitting section 4 to be inclined at a predetermined angle with respect to the optical axis of the laser beam of the laser element 200.

In other words, a vertical line with respect to an upper surface of the light emitting section 4 is inclined, toward a side opposite to the opening section of the parabolic mirror 5, against a vertical line with respect to the surface of the metallic base 7.

As described above, with the arrangement in which the light emitting section 4 is inclined, it is possible to increase a ratio of fluorescence that can be controlled by the parabolic mirror, among fluorescence exiting from a side surface of the light emitting section 4. Conversely, with the arrangement, there is a reduction in amount of the fluorescence that is not incident on the parabolic mirror 5 and dispersed to the outside. It is thus possible to increase use efficiency of the fluorescence.

Note that it is possible to have such an arrangement that (i) no inclined section 15 is provided, (ii) the light emitting section 4 is placed on the surface of the metallic base 7, and (iii) the laser beam is emitted obliquely from above toward the surface of the metallic base 7.

(Arrangement of Laser Element 200)

Figure 27:
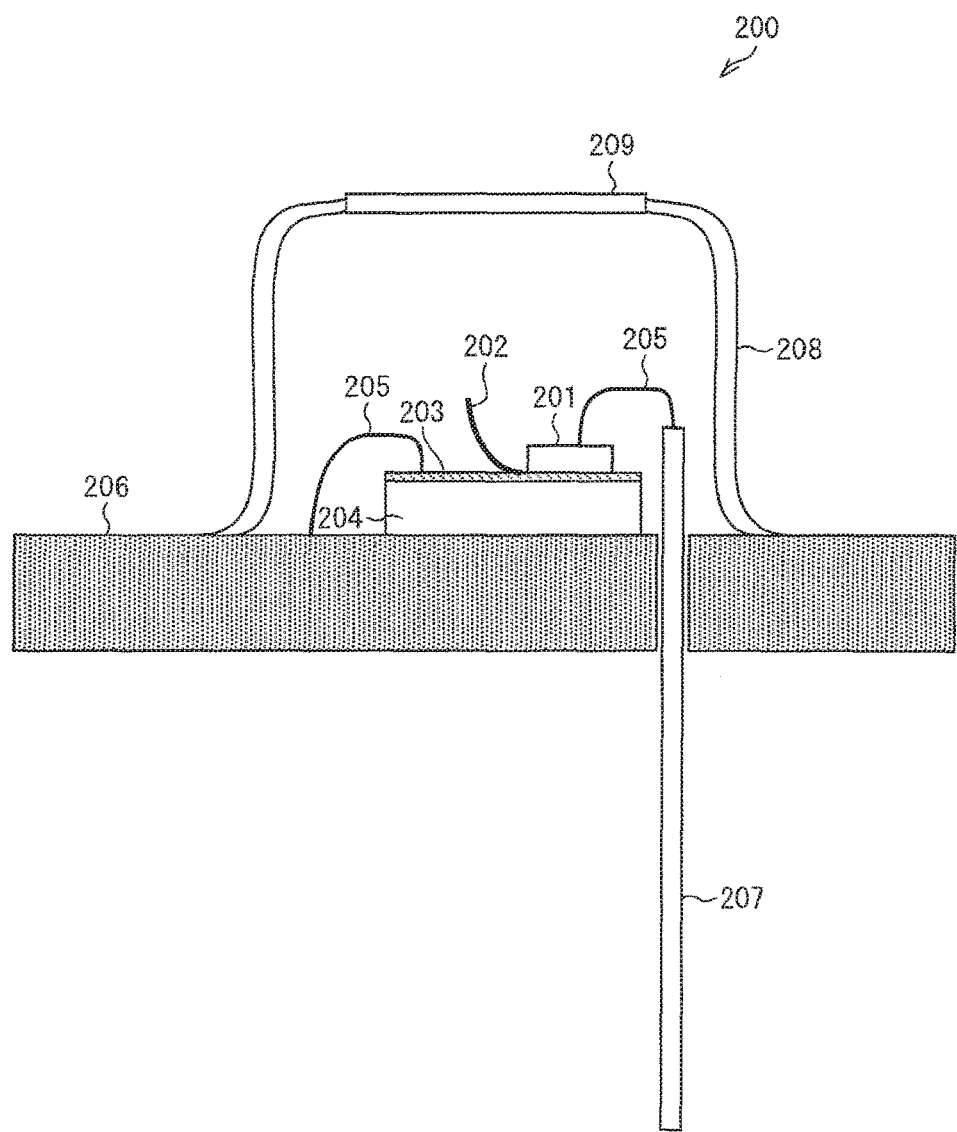
FIG. 27 is a view illustrating an internal arrangement of a laser element of the headlamp.
Figure 28:
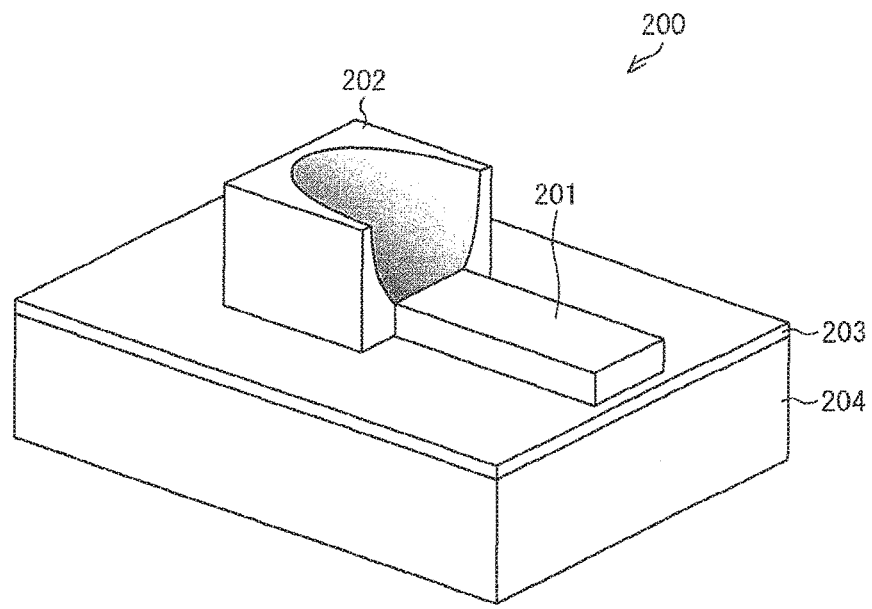
FIG. 28 is a perspective view illustrating an arrangement of the laser element.

FIG. 27 is a view illustrating an internal arrangement of the laser element 200. FIG. 28 is a perspective view illustrating an arrangement of the laser element 200. The laser element 200 includes a laser chip 201, a concave mirror 202, a metallic thin film 203, an insulating heat sink 204, a gold wire 205, a base section 206, a lead pin 207, a cap section 208, and the laser beam exit window 209 (see FIGS. 27 and 28).

(Laser Chip 201)

Figure 29:
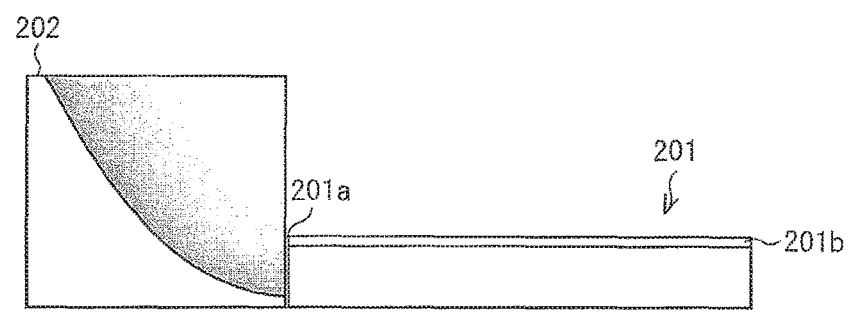
FIG. 29 is a view illustrating a positional relationship between a light emitting point of a laser chip included in the laser element, and a focal point of a concave mirror.

The laser chip 201 is a semiconductor element (laser diode) for emitting a laser beam. FIG. 29 is a view illustrating a positional relationship between a light emitting point of the laser chip 201 and a focal point of the concave mirror 202. The laser chip 201 includes an active layer 201$b$ (see FIG. 29). The active layer 201$b$ is a region where light is generated by a current supplied via the gold wire (bonding wire) 205. The light thus generated is emitted from the light emitting point 201$a$ as the laser beam.

The laser chip 201 has a length in a range of 0.5 mm to 1.0 mm in a longitudinal direction, a length in a range of 0.3 mm to 0.5 mm in a width direction, and a height in a range of 0.1 mm to 0.2 mm, for example.

(Concave Mirror 202)

The concave mirror 202 has a reflecting concave surface. The concave mirror 202 controls an optical path of and a radiation angle (directivity) of the laser beam by reflecting, from its reflecting surface, the laser beam emitted from the laser chip 201.

The concave mirror 202 includes, as a reflecting curved surface, at least a part of a curved surface formed by rotating a parabola or an ellipse around a rotational axis which is a symmetrical axis. More specifically, the concave mirror 202 includes, as the reflecting curved surface, a partial curved surface. The partial curved surface is obtained by cutting a curved surface formed by rotating a parabola or an ellipse around a rotational axis which is a symmetric axis, which cutting is carried out along a plane including the rotational axis. That is, the concave mirror 202 can be a parabolic mirror, an elliptic mirror, a part of the parabolic mirror or a part of the elliptic mirror. Further, the concave mirror 202 is an adjustable surface mirror, and a shape of the concave mirror 202 is not particularly limited. Note that the adjustable surface mirror can control radiation distribution arbitrarily.

In the example illustrated in FIG. 28, the reflecting curved surface of the concave mirror 202 has a shape of a half circle when the reflecting curved surface is viewed from above. The half circle has a radius in a range of 0.2 mm to 0.4 mm, for example.

A material of the concave mirror 202 may be identical with that of the concave mirror 9, e.g., aluminum. Note, however, that, since the concave mirror 202 is built (packaged) in the laser element 200, the concave mirror 202 is smaller in size than the concave mirror 9. In view of this, it is preferable to select a material of and a structure of the concave mirror 202 so that a compact concave mirror 202 can be manufactured easily.

The light emitting point 201a of the laser chip 201 is provided at or in the vicinity of the focal point of the concave mirror 202 (see FIG. 29). Accordingly, the laser beam emitted from the light emitting point 201a is efficiently converged by the concave mirror 202, and a radiation angle of the laser beam is controlled (beam formation).

Further, the laser chip 201 and the concave mirror 202 are soldered on the metallic thin film 203 which is vapor-deposited on an upper surface of the insulating heat sink 204. That is, the laser chip 201 and the concave mirror 202 are fixed to a common surface of a substrate. This strongly ensures a relative positional relationship between the laser chip 201 and the concave mirror 202 so that the relative positional relationship is hardly changed even with an external shock.

In the manufacture of the laser element 200, it is preferable to adjust, with high accuracy, (i) a relative positional relationship between the laser chip 201 and the concave mirror 202 and (ii) angles of the laser chip 201 and the concave mirror 202 relative to each other. In order to carry out such adjustments, it is possible to carry out passive alignment by using a high-accuracy mounting device having high machine accuracy. Further, it is also possible to carry out active alignment in such a manner that (i) the laser chip 201 is caused to emit light at a significantly small output and (ii) the position of the concave mirror 202 is determined while a position of and a shape of a spot of the laser beam reflected from the concave mirror 202 are being monitored. The active alignment is higher than the passive alignment in accuracy.

(Other Members)

The insulating heat sink 204 is a heat dissipation member for absorbing and dissipating heat generated by the laser chip 201. The insulating heat sink 204 is provided on the base section 206. The insulating heat sink 204 contains an aluminum nitride (AlN) or a silicon carbide (SiC), for example.

The lead pin 207 penetrates the base section 206 so as to be connected to an external power source electrically. A drive current is supplied to the laser chip 201 via (i) the lead pin 207 and (ii) the gold wire 205 connected to the lead pin 207.

A lower electrode section (anode electrode) of the laser chip 201 is connected to the metallic thin film 203 electrically, and the metallic thin film 203 and the base section 206 are connected to each other electrically via the gold wire 205.

The members placed on the base section 206, such as the laser chip 201, the concave mirror 202, and the insulating heat sink 204, are packaged with the base section 206 and the cap section 208.

The cap section 208 has the laser beam exit window 209, through which the laser beam travels and exits toward the outside of the laser element 200.

(Effects of Laser Element 200)

Figure 30:
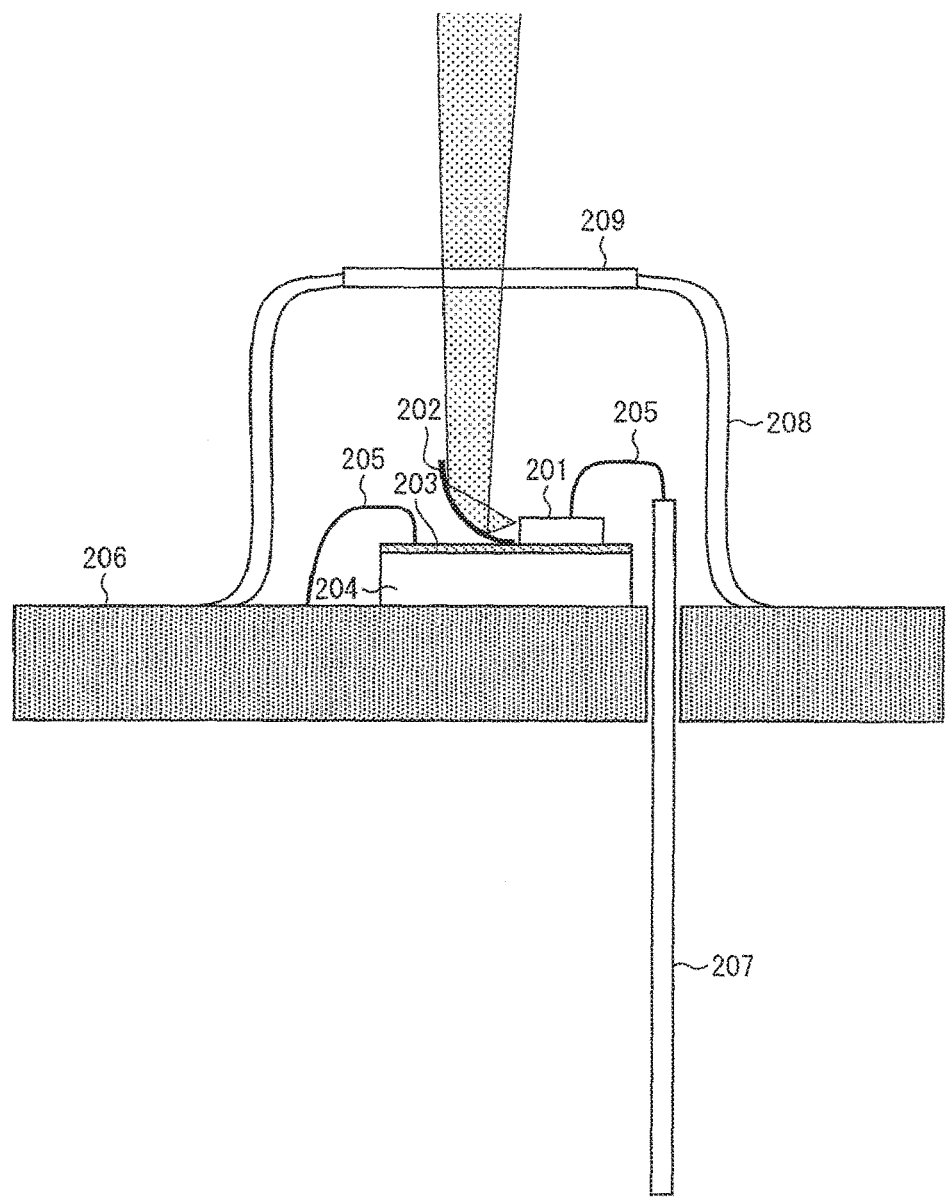
FIG. 30 is a view illustrating an optical path of a laser beam of the laser element.

FIG. 30 is a view illustrating an optical path of the laser beam in the laser element 200. The laser beam emitted from the laser chip 201 is reflected from the concave mirror 202 so that the optical path of and the radiation angle of the laser beam are controlled (see FIG. 30). The laser beam reflected from the concave mirror 202 travels through the laser beam exit window 209 and exits toward the outside of the laser element 200.

Generally, a laser beam emitted from a laser chip is diffused in a range of a wide angle, and forms an elliptic spot. The elliptic spot has a half-value breadth in a range of 8° to 20°, for example.

However, with the arrangement illustrated in FIG. 29, the light emitting point 201a of the laser chip 201 is provided in the vicinity of the focal point of the concave mirror 202. This makes it possible to converge the laser beam emitted from the light emitting point 201a before the laser beam starts being diffused. It is therefore possible to control efficiently (i) the direction of the optical path of the laser beam and (ii) the radiation angle of the laser beam.

For this reason, the laser beam emitted from the laser element 200 travels in a narrow solid angle. In other words, the radiation angle of the laser beam emitted from the laser element 200 becomes small. For example, it is possible to provide such a laser beam that 95% of its energy is concentrated within a radiation angle of ±2.5°, for example.

Accordingly, it becomes unnecessary to provide an additional optical member for controlling the radiation angle of the laser beam. That is, it becomes possible to simplify the arrangement of the headlamp. As a result, it is possible to have a reduction in size of the headlamp.

Further, both the laser chip 201 and the concave mirror 202 are fixed to the insulating heat sink 204 which is the substrate shared by the laser chip 201 and the concave mirror 202. With the arrangement, the relative positional relationship between the laser chip 201 and the concave mirror 202 is hardly changed even if the headlamp 110 is vibrated due to an external shock. It is thus possible to provide a headlamp that has high tolerance against a shock.

Example 6

Figure 31:
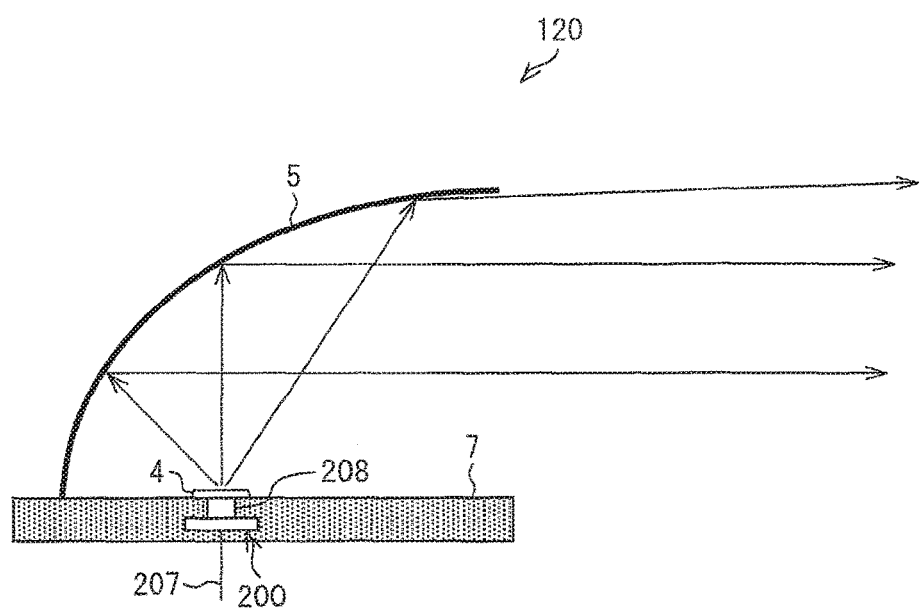
FIG. 31 is a view schematically illustrating an arrangement of a headlamp in accordance with yet another example of the present invention.

FIG. 31 is a view schematically illustrating a headlamp (light emitting device) 120 in accordance with still yet another example of the present invention. The headlamp 120 includes a laser element 200 as an excitation light source, in the same manner as a headlamp 110 described above. However, the headlamp 120 is different from the headlamp 110 in positions of the laser element 200 and a light emitting section 4.

According to the headlamp 120, the laser element 200 is fitted to an opening section of a metallic base 7, and a light emitting point 201a of the laser element 200 is exposed in the opening section (see FIG. 31). An optical axis of a laser beam emitted from the laser element 200 is directed to a reflecting surface of a parabolic mirror 5, and is substantially vertical with respect to a surface of the metallic base 7.

The light emitting section 4 is provided in the vicinity of a laser beam exit window 209 (i.e., a laser beam exit section) of the laser element 200. Specifically, the light emitting section 4 is provided on a surface of the metallic base 7 so as to cover the opening section, which surface faces the parabolic mirror 5. The laser beam emitted via the laser beam exit window 209 positioned in the opening section is directly incident on the light emitting section 4 so that white light is generated by the light emitting section 4 and travels toward the reflecting surface of the parabolic mirror 5. The white light is reflected from the parabolic mirror 5. Thus, an optical path of the white light is controlled, and the white light is emitted forward from the headlamp 120.

Note that the light emitting section 4 can be larger in size than a cross section of the opening section of the metallic base 7 so as to cover the opening section. Alternatively, the light emitting section 4 can be substantially the same in size as the cross section of the opening section of the metallic base 7 so as to be fitted to the opening section.

Example 7

According to the foregoing Example 5 and 6, a pair of a laser chip 201 and a concave mirror 202 is provided in a single laser element 200. Note, however, that a plurality of pairs each being constituted by the laser chip 201 and the concave mirror 202 can be provided in a single laser element, instead of a single pair of the laser chip 201 and the concave mirror 202.

Figure 32:
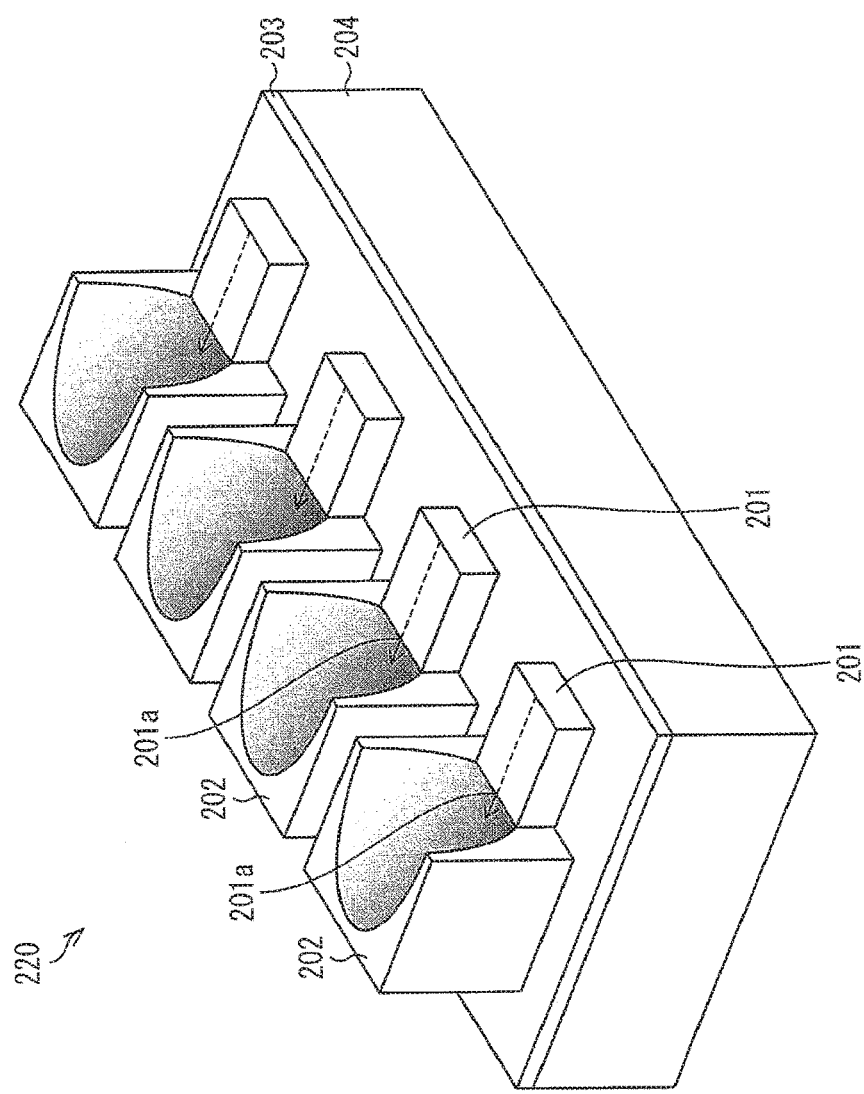
FIG. 32 is a perspective view illustrating a modified example of the laser element.

FIG. 32 is a perspective view illustrating a modified example of a laser element. In FIG. 32, four pairs each being constituted by the laser chip 201 and the concave mirror 202 are provided in a single laser element 220. The four laser chips 201 emit laser beams via their light emitting points 201a, respectively. The laser beams thus emitted are reflected from the four concave mirrors 202, respectively, so that directions of optical paths of the respective laser beams and radiation angles of the respective laser beams are controlled.

With the arrangement in which the plurality of laser chips 201 and the plurality of concave mirrors 202 are provided, positions of the plurality of concave mirrors 202 (particularly, angles of the four concave mirrors 202 relative to each other) are adjusted so that the laser beams reflected from the respective plurality of concave mirrors 202 are converged at a predetermined position (e.g., a surface of the light emitting section 4).

For example, it is possible to (i) cause a surface of a metallic thin film 203, on which the four laser chips 201 and the four concave mirrors 202 are provided, to have a concave surface, and (ii) adjust the positions of the four concave mirrors 202 so that the optical paths of the laser beams reflected from the four concave mirrors, respectively, intersect each other on the surface of the light emitting section 4.

With the arrangement in which the plurality of pairs each being constituted by the laser chip 201 and the concave mirror 202 are provided, it is possible to obtain easily a high-power laser beam, even if a laser output of each of the plurality of laser chips 201 is low.

Figure 33:
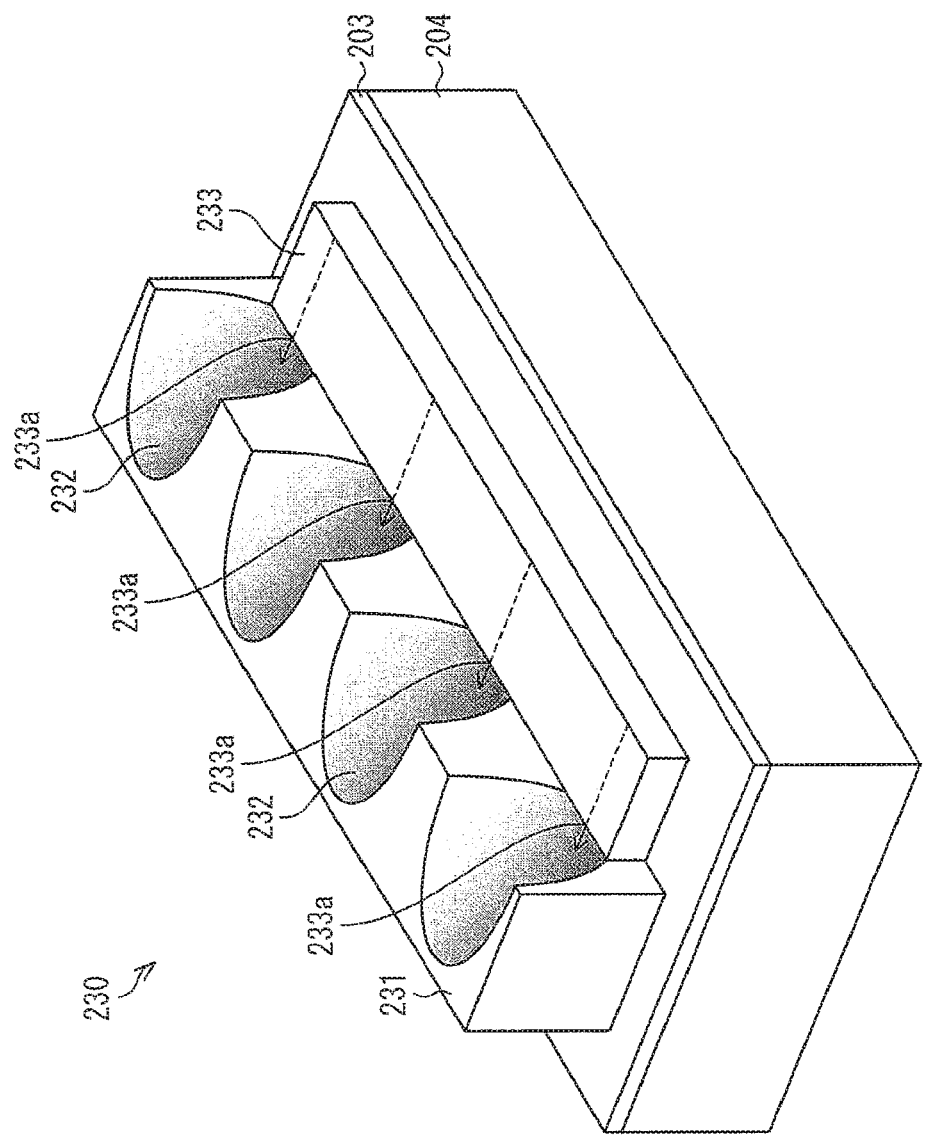
FIG. 33 is a perspective view illustrating another modified example of the laser element.

FIG. 33 is a perspective view illustrating another modified example of the laser element. As illustrated in FIG. 33, it is possible to provide a laser chip 233 having a plurality of light emitting points 233a. Further, it is also possible to provide a concave mirror 231 which is formed such that a plurality of concave mirrors 202 are formed integral with each other. The concave mirror 231 has a plurality of concave surfaces 232. The plurality of light emitting points 233a are arranged at or in the vicinity of focal points of the respective plurality of concave surfaces 232, respectively.

As described above, with (i) the arrangement in which the laser chip having a plurality of light emitting points and/or (ii) the arrangement in which a plurality of concave mirrors are formed integral with each other, it becomes possible to (i) carry out the alignment easily and therefore (ii) manufacture the laser element easily, as compared with the case where a plurality of laser chips and a plurality of concave mirrors are aligned relative to each other.

Further, the present invention can be expressed as described below.

That is, the light emitting device of the present invention is preferably arranged such that a spot of the laser beam on the light irradiated surface of the light emitting section has a larger area than an area of a light emitting point of a laser beam source which emits the laser beam.

According to the arrangement, the spot of the laser beam with which the light irradiated surface of the light emitting section is irradiated has a larger area (irradiation area) than an area of the light emitting point of the laser beam source which emits the laser beam. That is, the laser beam which is diffused is incident on the light irradiated surface of the light emitting section. For this reason, light density of the laser beam does not become excessively high at any positions on the light irradiated surface of the light emitting section.

Further, the light emitting device of the present invention can be arranged such that the light irradiation section includes an increasing rate changing element through which the laser beam emitted from the laser beam source travels, and the increasing rate changing element reduces an increasing rate of a beam diameter of the laser beam in the direction in which the laser beam travels, as the laser beam travels through the increasing rate changing element.

According to the arrangement, it is possible to reduce the increasing rate of the beam diameter of the laser beam emitted from the laser beam source in accordance with (i) a distance between the laser beam source and the light emitting section and (ii) an area of the light irradiated surface of the light emitting section. It is therefore possible to prevent an area of a laser beam irradiated region with respect to the light irradiated surface from being larger than the area of the light irradiated surface.

Furthermore, the light emitting device of the present invention is preferably arranged such that the increasing rate changing element is a lens provided on an optical path of the laser beam emitted from the laser beam source, and the laser beam increases regularly in beam diameter after the laser beam travels through the lens.

According to the arrangement, the laser beam is diffused after it travels through the lens. Accordingly, the laser beam would not be converged on the light irradiated surface of the light emitting section, and the light density of the laser beam would not become excessively high at any positions on the light irradiated surface.

Moreover, the light emitting device of the present invention is preferably arranged such that a spot of the laser beam on the lens has a smaller area than that of the light irradiated surface of the light emitting section, which laser beam is emitted from the laser beam source and is incident on the lens.

According to the arrangement, the laser beam is diffused after it travels through the lens. Accordingly, the laser beam would not be converged on the light irradiated surface of the light emitting section, and the light density of the laser beam would not become excessively high at any positions on the light irradiated surface.

Further, the light emitting device of the present invention can be arranged such that the light irradiation section includes a housing in which the laser beam source is provided, and the housing and the increasing rate changing element are formed integral with each other.

According to the arrangement, a relative positional relationship between the laser beam source and the increasing rate changing element would not be changed due to vibration/aging deterioration of the light irradiation section or the like. Moreover, it is possible to have (i) a reduction in the number of components of the light irradiation section and (ii) a reduction in size of the entire light irradiation section.

Furthermore, the light emitting device of the present invention can further include a reflecting mirror for reflecting the fluorescence generated by the light emitting section, the reflecting mirror being arranged such that at least a part of the reflecting mirror is positioned above the light irradiated surface of the light emitting section, the spot of the laser beam on the light irradiated surface of the light emitting section having a smaller area than an area of the light irradiated surface.

According to the arrangement, the light irradiated surface of the light emitting section and the reflecting mirror face each other. It is therefore possible to increase a ratio of fluorescence whose optical path can be controlled, among the fluorescence emitted from the light emitting section.

In this case, fluorescence (laterally-emitted fluorescence) emitted from a side surface of the light emitting section still cannot be controlled, and it is highly possible that such fluorescence might be emitted in a direction other than a front direction.

According to the arrangement, however, the light irradiated surface has a larger area than that of the spot of the laser beam on the light irradiated surface so that an amount of the laterally-emitted fluorescence is reduced. With the arrangement, it becomes possible to (i) reduce an amount of fluorescence that cannot be controlled by the reflecting mirror, among the fluorescence generated by the light emitting section, and (ii) increase use efficiency of the fluorescence generated by the light emitting section.

Further, the light emitting device of the present invention can further include light projecting means for projecting the fluorescence generated by the light emitting section, the light projecting means being arranged such that at least a part of the light projecting means is positioned above the light irradiated surface of the light emitting section, the spot of the laser beam on the light irradiated surface of the light emitting section having a smaller area than an area of the light irradiated surface.

Note that the light projecting means can include a reflecting mirror as a part of the light projecting means. In a case where the light projecting means includes no reflecting mirror, the light projecting means may include an optical system or the like, with which the light is projected by use of only a lens, for example.

Furthermore, the light emitting device of the present invention can be arranged such that the reflecting mirror has, as a reflecting surface, at least a part of a partial curved surface which is obtained by cutting a paraboloid of revolution formed by rotating a parabola around a rotational axis which is a symmetric axis of the parabola, the cutting being carried out along a plane including the rotational axis.

According to the arrangement, the reflecting mirror has, as the reflecting surface, a part of the curved surface obtained by cutting the paraboloid of revolution (parabola) along the plane including the rotational axis. It is therefore possible to project the fluorescence generated by the light emitting section within a narrow solid angle efficiently. As a result, it is possible to increase use efficiency of the fluorescence generated by the light emitting section. Further, it is also possible to provide a structure other than the parabola in a space corresponding to the other half of the parabola.

Moreover, with the arrangement, most of fluorescence that cannot be controlled by the reflecting mirror is emitted toward the parabola. By taking advantage of this property, it is possible to illuminate, with the fluorescence, a wide range on a parabola side of the light emitting device.

Further, the light emitting device of the present invention can be arranged such that the laser beam source is provided outside the reflecting mirror, and the reflecting mirror has a window section which (i) transmits the laser beam or (ii) allows the laser beam to pass through the window section.

According to the arrangement, it is possible to irradiate, from outside the reflecting mirror, the light emitting section with the laser beam via the window section of the reflecting mirror. Accordingly, it is possible to increase flexibility in arranging the laser beam source. For example, it becomes easy to set a desired angle at which the laser beam is incident on the light irradiated surface of the light emitting section.

Note that the window section may be either an opening section or a section including a transparent member which transmits the laser beam.

Furthermore, the light emitting device of the present invention can be arranged such that the light emitting section is supported by a heat conductive member.

According to the arrangement, it is possible to cool the light emitting section by use of the heat conductive member. This can prevent the light emitting section from having an increase in temperature, which increase is caused by irradiation of the laser beam. It is therefore possible to prevent a reduction in light emitting efficiency of the light emitting section due to an increase in the temperature of the light emitting section.

Further, the light emitting device of the present invention can be arranged such that the heat conductive member has an opening section, and the light emitting section is irradiated with the laser beam via the opening section of the heat conductive member.

According to the arrangement, it becomes unnecessary to cause the reflecting mirror to have an opening section which transmits the laser beam. It is thus possible to (i) increase substantially an area of the reflecting surface of the reflecting mirror and therefore (ii) increase an amount of fluorescence that can be controlled by the reflecting mirror.

Furthermore, a laser element of the present invention may include a laser beam source for emitting a laser beam; and a lens provided on an optical path of the laser beam emitted from the laser beam source, the laser beam increasing regularly in beam diameter in a direction in which the laser beam travels, after the laser beam travels thorough the lens.

With the arrangement, it is possible to provide a laser element which can emit the laser beam that increases (diffused) regularly in beam diameter in the direction in which the laser beam travels. This laser element is suitably used in the light emitting device described above.

Moreover, the laser element of the present invention preferably further includes a housing in which the laser beam source is provided, the housing and the lens being formed integral with each other.

According to the arrangement, a relative positional relationship between the laser beam source and the lens would not be changed due to vibration/aging deterioration of the laser element, or the like. Further, it is possible to (i) reduce the number of components of the laser element and (ii) reduce the size of the entire laser element.

Further, the light emitting device of the present invention is preferably arranged such that the at least one excitation light source includes a plurality of excitation light sources, and the at least one concave mirror converges excitation light emitted from the plurality of excitation light sources.

According to the arrangement, the concave mirror can converge the excitation light emitted from the plurality of excitation light sources, so as to increase power of the excitation light.

Furthermore, the light emitting device of the present invention is preferably arranged such that the at least one concave mirror includes a plurality of concave mirrors, the at least one excitation light source includes a plurality of excitation light sources, and at least one excitation light source among the plurality of excitation light sources is provided for each of the plurality of concave mirrors.

According to the arrangement, pieces of the excitation light, emitted from the respective plurality of excitation light sources, are converged by the plurality of concave mirrors. With the arrangement in which a plurality of sets each being constituted by the excitation light source(s) and the concave mirror are provided, it is possible to increase the power of the excitation light.

Further, the light emitting device of the present invention is preferably arranged such that the plurality of concave mirrors are formed integral with each other.

With the arrangement in which the plurality of concave mirrors are formed integral with each other, it becomes easy to (i) align the plurality of concave mirrors and (ii) manufacture the plurality of concave mirrors.

Furthermore, the light emitting device of the present invention preferably further includes a reflecting mirror for reflecting the fluorescence generated by the light emitting section, the reflecting mirror being arranged such that at least a part of the reflecting mirror is positioned above an upper surface of the light emitting section, the upper surface having a larger area than that of a side surface of the light emitting section, the light emitting section (i) having a small thickness or (ii) having an excitation light irradiated surface which has a larger area than that of a spot of the excitation light on the excitation light irradiated surface of the light emitting section.

According to the arrangement, the upper surface of the light emitting section and the reflecting mirror face each other. It is therefore possible to increase a ratio of fluorescence whose optical path can be controlled, among the fluorescence emitted from the light emitting section.

In this case, however, it is still highly possible that fluorescence (laterally-emitted fluorescence) that is emitted from the side surface of the fluorescent material cannot be controlled.

According to the arrangement, however, the light emitting section (i) has a small thickness or (ii) has the excitation light irradiated surface having a larger area than that of the spot of the excitation light on the excitation light irradiated surface, so that the amount of the laterally-emitted fluorescence is reduced. It is thus possible to (i) reduce an amount of the fluorescence that cannot be controlled by the reflecting mirror and therefore (ii) increase use efficiency of the fluorescence emitted from the light emitting section.

Note that, in the present specification, the description that "the light emitting section has a small thickness" means such a shape of the light emitting section that (i) the side surface of the light-emitting section is sufficiently smaller in area than the upper surface of the light emitting section and therefore (ii) most of the fluorescence is emitted upward via the upper surface.

Further, the light emitting device of the present invention preferably further includes light projecting means for projecting the fluorescence generated by the light emitting section, the light projecting means being arranged such that at least a part of the light projecting means is positioned above an upper surface of the light emitting section, the upper surface having a larger area than that of a side surface of the light emitting section, the light emitting section (i) having a small thickness or (ii) having an excitation light irradiated surface which has a larger area than that of a spot of the excitation light on the excitation light irradiated surface of the light emitting section.

Note that the light projecting means is the same as described above.

Moreover, the light emitting device of the present invention preferably further includes a reflecting mirror for reflecting the fluorescence generated by the light emitting section, the excitation light source being provided outside the reflecting mirror, the reflecting mirror having a window section which (i) transmits the excitation light or (ii) allows the excitation light to pass through the window section.

According to the arrangement, it is possible to irradiate, from the outside of the reflecting mirror, the light emitting section with the excitation light via the window section of the reflecting mirror. This can increase flexibility in arranging the excitation light source. For example, it becomes easy to set a desired irradiation angle at which the excitation light is incident on the excitation light irradiated surface of the light emitting section.

Note that the window section may be either an opening section or a section including a transparent member which transmits the excitation light.

Further, the light emitting device of the present invention preferably further includes a reflecting mirror having a reflecting curved surface for reflecting the fluorescence generated by the light emitting section, and a supporting member having a surface facing the reflecting curved surface and supporting the light emitting section, the supporting member having an opening section through which the excitation light travels and is incident on the light emitting section.

According to the arrangement, the supporting member is arranged to face the reflecting curved surface of the reflecting mirror. The light emitting section is supported by the supporting member. The supporting member has the opening section through which the excitation light travels and is incident on the light emitting section.

Accordingly, it becomes unnecessary to cause the reflecting mirror to have an opening section through which the excitation light travels. This makes it possible to (i) increase substantially an area of the reflecting surface of the reflecting mirror and therefore (ii) increase an amount of the fluorescence that can be controlled.

Furthermore, the light emitting device of the present invention is preferably arranged such that the reflecting mirror includes, as a reflecting curved surface, at least a part of a partial curved surface obtained by cutting a curved surface which is formed by rotating a parabola or an ellipse around a rotational axis which is a symmetric axis, the cutting being carried out along a plane including the rotational axis.

According to the arrangement, the reflecting mirror includes the reflecting curved surface that is obtained by cutting, along the plane including the rotational axis, a paraboloid of revolution or an ellipsoid of revolution. Accordingly, it is possible to project efficiently the fluorescence generated by the light emitting section within a narrow solid angle. This increases use efficiency of the fluorescence. Further, it is also possible to provide a structure other than the parabola in a space corresponding to the other half of the reflecting mirror. In a case where (i) a plate having high heat conductivity is provide as such a structure and (ii) the light emitting section and the plate are made in contact with each other, the heat generated by the light emitting section can be efficiently dissipated.

Further, the light emitting device of the present invention is preferably arranged such that the supporting member has heat conductivity.

According to the arrangement, it is possible to dissipate efficiently the heat generated by the light emitting section via the supporting member having the heat conductivity.

Furthermore, the light emitting device of the present invention is preferably arranged such that the excitation light source is supported by the supporting member.

According to the arrangement, it is possible to dissipate, via the supporting member having the heat conductivity, both the heat generated by the light emitting section and the heat generated by the excitation light source. This makes it possible to simplify the dissipation mechanism.

Moreover, the technical scope of the present invention encompasses a vehicle headlamp including the light emitting device described above, and an illumination device including the light emitting device described above.

In addition to the arrangement, the laser element of the present invention is preferably arranged such that the concave mirror includes, as a reflecting curved surface, at least a part of a curved surface that is formed by rotating a parabola or an ellipse around a rotational axis which is a symmetric axis.

According to the arrangement, it becomes possible to converge and control the laser beam emitted from the laser chip efficiently. Accordingly, it becomes easy to control the radiation angle of the laser beam.

Further, in addition to the arrangement, the laser element of the present invention is preferably arranged such that the laser chip is arranged such that a light emitting point of the laser chip is positioned at or in the vicinity of a focal point of the concave mirror.

According to the arrangement, the laser chip and the concave mirror are positioned close to each other, so that the laser beam emitted from the laser chip is converged by the concave mirror before the laser beam starts to be diffused. Further, with the arrangement in which the light emitting point is positioned at the focal point of the concave mirror, it is possible to control, with high accuracy, the radiation angle of the laser beam emitted from the light emitting point.

Furthermore, in addition to the arrangement, a light emitting device of the present invention includes (i) a laser element including a laser chip for emitting a laser beam and a concave mirror for controlling a radiation angle of the laser beam emitted from the laser chip, and (ii) a light emitting section for emitting fluorescence by receiving the laser beam emitted from the laser element.

According to the arrangement, it is possible to control a radiation angle of the laser beam emitted from the laser element to be a desired radiation angle. It is therefore possible to irradiate the light emitting section with the laser beam efficiently without an additional optical member for controlling the radiation angle of the laser beam.

Accordingly, it is possible to simplify the arrangement of the light emitting device.

Moreover, in addition to the arrangement, the light emitting device of the present invention is preferably arranged such that the laser beam emitted from the laser element is directly incident on the light emitting section without being incident on any optical members.

According to the arrangement, the radiation angle of the laser beam is controlled by use of only the concave mirror provided in the laser element. It is therefore possible to (i) simplify the arrangement of the light emitting device and (ii) provide a compact light-emitting device.

Further, with the arrangement, relative relationships between components of the light-emitting device are hardly changed due to a shock, as compared with an arrangement in which the optical member for controlling the radiation angle of the laser beam is provided outside the laser element. That is, it is possible to increase tolerance of the light-emitting device against a shock.

[Additional Matters]

The present invention is not limited to the description of the embodiments above, but may be altered by a skilled person within the scope of the claims. An embodiment based on a proper combination of technical means disclosed in different embodiments is encompassed in the technical scope of the present invention.

A laser element of the present invention and a light emitting device of the present invention are applicable not only to a vehicle headlamp but also to other illumination devices, such as a downlight. The downlight is an illumination device attached to a ceiling of a structure such as a house and a vehicle. Other than such a downlight, the illumination device of the present invention can be achieved as a headlamp for a moving object (e.g., a human, a ship, an airplane, a submersible, and a rocket) other than a vehicle. Further, the illumination device of the present invention can be achieved as a searchlight, a projector, or an indoor illumination device other than the downlight (such as a stand light lamp). The laser element of the present invention and the light emitting device of the present invention can increase use efficiency of fluorescence of each of the foregoing devices.

REFERENCE SIGNS LIST

1: Light irradiation unit (light irradiation section, laser element)
1a: Light irradiation unit (light irradiation section)
1b: Light irradiation unit (light irradiation section)
2: Laser element (housing, excitation light source)
2a: LD (laser element)
3: Magnifying lens (increasing rate changing element, lens)
4: Light-emitting section
4a: Upper surface
4c: Spot (spot of excitation light)
5: Parabolic mirror (reflecting mirror)
6: Window section
7: Metallic base (heat conductive member, supporting member)
7a: Opening section
9: Concave mirror
10: Headlamp (light emitting device, vehicle headlamp)
13: Magnifying lens (increasing rate changing element, lens)
20: Headlamp (light emitting device, vehicle headlamp)
24: Light source (light emitting device, illumination device)
30: Headlamp (light emitting device, vehicle headlamp)
40: Headlamp (light emitting device, vehicle headlamp)
50: Headlamp (light emitting device, vehicle headlamp)
51: Elliptic mirror
60: Headlamp (light emitting device, vehicle headlamp)
70: Headlamp (light emitting device, vehicle headlamp)
80: Headlamp (light emitting device, vehicle headlamp)
90: Headlamp (light emitting device, vehicle headlamp)
91: Concave mirror
91a: Concave mirror
100: Automobile (vehicle)

110: Headlamp (light emitting device, vehicle headlamp)
120: Headlamp (light emitting device, vehicle headlamp)
200: Laser element
201: Laser chip
201*a*: Light-emitting point
202: Concave mirror
220: Laser element
231: Concave mirror
232: Concave surface
233: Laser chip
233*a*: Light-emitting point
LC: Laser chip (laser beam source)
P: Light-emitting point

The invention claimed is:

1. A light emitting device comprising:
a plurality of excitation light sources for emitting excitation light;
at least one concave mirror for converging the excitation light emitted from the plurality of excitation light sources;
a light emitting section for emitting fluorescence by receiving the excitation light converged by the at least one concave mirror; and
a light reflector for reflecting the fluorescence generated by the light emitting section,
wherein the excitation light source is a semiconductor laser,
at least a part of the light reflector is positioned apart from the light emitting section, and
the at least one concave mirror and the light reflector are placed on a same side with respect to the light emitting section.

2. A light emitting device comprising:
a plurality of excitation light sources for emitting excitation light;
at least one concave mirror for converging the excitation light emitted from the plurality of excitation light sources;
a light emitting section for emitting fluorescence by receiving the excitation light converged by the at least one concave mirror;
a light reflector for reflecting the fluorescence generated by the light emitting section; and
a base on which the light emitting section is disposed,
wherein the excitation light source is a semiconductor laser,
the concave mirror is disposed on a first side of the base, and the light reflector is disposed on a second side of the base that is opposite to the first side of the base,
the excitation light, which is reflected by the concave mirror, is incident on the light emitting section from the first side of the base,
the excitation light, which is incident on the light emitting section from the first side of the base, passes through the base and the light emitting section, and is converted into the fluorescence,
the fluorescence is incident on the light reflector, which is positioned at the second side of the base, and
at least a part of the light reflector is positioned apart from the light emitting section.

3. The light emitting device as set forth in claim 2, wherein:
light emitted from the plurality of excitation sources is collected and a single one of the at least one concave mirror converges the light.

4. The light emitting device as set forth in claim 2, wherein:
the at least one concave mirror includes a plurality of concave mirrors;
and
at least one excitation light source among the plurality of excitation light sources is provided for each of the plurality of concave mirrors.

5. The light-emitting device as set forth in claim 4, wherein:
the plurality of concave mirrors are formed integral with each other.

6. The light emitting device as set forth in claim 2, further comprising:
an upper surface of the light emitting section having a larger area than that of a side surface of the light emitting section,
the light emitting section (i) having a small thickness or (ii) having an excitation light irradiated surface which has a larger area than that of a spot of the excitation light on the excitation light irradiated surface of the light emitting section.

7. A vehicle headlamp comprising:
a light emitting device recited in claim 2.

8. An illumination device comprising:
a light emitting device recited in claim 2.

9. The light emitting device as set forth in claim 2, wherein:
the base consists of a transparent material.

10. The light emitting device as set forth in claim 2, wherein:
the reflector is a part of a paraboloid or a ellipsoid surface which is rotated around a symmetry axis of a parabola or a ellipse as a rotation axis.

* * * * *